(12) United States Patent
Im et al.

(10) Patent No.: US 11,631,370 B2
(45) Date of Patent: Apr. 18, 2023

(54) DISPLAY DEVICE AND ELECTRONIC DEVICE INCLUDING THE SAME

(71) Applicant: Samsung Display Co., Ltd., Yongin-si (KR)

(72) Inventors: Wan-Soon Im, Cheonan-si (KR); Chulho Kim, Suwon-si (KR); Kidan Lee, Suwon-si (KR); Jeong-Soo Lee, Hwaseong-si (KR); Jina Lee, Seongnam-si (KR); Sugwoo Jung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/721,071

(22) Filed: Apr. 14, 2022

(65) Prior Publication Data
US 2023/0051015 A1 Feb. 16, 2023

(30) Foreign Application Priority Data

Aug. 11, 2021 (KR) .......................... 10-2021-0105740

(51) Int. Cl.
*G09G 3/3208* (2016.01)
*H01L 27/32* (2006.01)

(52) U.S. Cl.
CPC ....... *G09G 3/3208* (2013.01); *H01L 27/3276* (2013.01); *G09G 2320/0214* (2013.01);
(Continued)

(58) Field of Classification Search
CPC .............. G09G 3/3208; H01L 27/3272; H01L 27/3276
See application file for complete search history.

(56) References Cited

U.S. PATENT DOCUMENTS

| 6,758,538 B2 | 7/2004 | Fujita et al. |
| 6,943,372 B2 * | 9/2005 | Lin ..................... H01L 27/3272 257/E27.111 |

(Continued)

FOREIGN PATENT DOCUMENTS

| KR | 10-0434891 B1 | 6/2004 |
| KR | 10-0560780 B1 | 3/2006 |

(Continued)

*Primary Examiner* — Sardis F Azongha
(74) *Attorney, Agent, or Firm* — Lewis Roca Rothgerber Christie LLP

(57) ABSTRACT

A display device includes a light emitting element including an anode, a cathode, and a light emitting layer between the anode and the cathode, a first transistor connected between the anode and a first power line, the first transistor may be switched by a voltage of a node, a second transistor connected between the first transistor and a data line, the second transistor may be switched by a write scan signal, a third transistor connected between the node and the anode, the third transistor may be switched by a compensation scan signal, a fourth transistor connected between the node and an initialization line, the fourth transistor may be switched by an initialization scan signal, an insulating layer on the first to the fourth transistors, and a light blocking pattern protruding from the insulating layer, the light blocking pattern being adjacent to the third transistor and the fourth transistor.

25 Claims, 44 Drawing Sheets

(52) U.S. Cl.
CPC ............ *G09G 2320/0233* (2013.01); *G09G 2340/0435* (2013.01); *H01L 27/3246* (2013.01)

(56) References Cited

U.S. PATENT DOCUMENTS

| | | | |
|---|---|---|---|
| 7,282,855 B2* | 10/2007 | Park | .................... H01L 27/3244 313/506 |
| 7,414,599 B2 | 8/2008 | Chung et al. | |
| 8,248,329 B2* | 8/2012 | Yamamoto | ............ G09G 3/3233 345/82 |
| 10,615,240 B2 | 4/2020 | Song et al. | |
| 10,755,647 B2* | 8/2020 | Kim | .................... H01L 27/3276 |
| 10,909,917 B2 | 2/2021 | Jeon | |
| 11,043,189 B2* | 6/2021 | Choi | ........................ G09G 5/10 |
| 11,127,805 B2* | 9/2021 | Kim | .................. H01L 29/78675 |
| 2020/0328263 A1 | 10/2020 | Choi et al. | |
| 2020/0335524 A1 | 10/2020 | Lee et al. | |
| 2021/0111239 A1 | 4/2021 | Cho et al. | |
| 2021/0134906 A1 | 5/2021 | Lee et al. | |
| 2021/0202612 A1 | 7/2021 | Jung et al. | |
| 2021/0264857 A1 | 8/2021 | Wang et al. | |
| 2021/0280130 A1 | 9/2021 | Wang et al. | |
| 2021/0287605 A1 | 9/2021 | Wang et al. | |

FOREIGN PATENT DOCUMENTS

| | | |
|---|---|---|
| KR | 10-2012-0051337 A | 5/2012 |
| KR | 10-2016-0128547 A | 11/2016 |
| KR | 10-2017-0006335 A | 1/2017 |
| KR | 10-2020-0119946 A | 10/2020 |
| KR | 10-2020-0121953 | 10/2020 |
| KR | 10-2021-0044335 | 4/2021 |
| KR | 10-2021-0052730 A | 5/2021 |
| KR | 10-2021-0107934 A | 9/2021 |
| KR | 10-2021-0111945 A | 9/2021 |
| KR | 10-2021-0114578 A | 9/2021 |

* cited by examiner

DISPLAY DEVICE AND ELECTRONIC DEVICE INCLUDING THE SAME

CROSS-REFERENCE TO RELATED APPLICATION

This application claims priority to and the benefit of Korean Patent Application No. 10-2021-0105740, filed on Aug. 11, 2021, in the Korean Intellectual Property Office (KIPO), the entire content of which is incorporated by reference herein.

BACKGROUND

1. Field

The present disclosure herein relates to a display device and an electronic device including the same.

2. Description of the Related Art

In general, electronic devices such as smart phones, digital cameras, notebook computers, navigation systems, and smart televisions, which provide images to users, include display devices for displaying images. The display device generates an image and provides the generated image to a user through a display screen.

The display device includes a plurality of pixels for generating an image and a driver for driving the pixels. Each of the pixels includes a light emitting element, a plurality of transistors connected to the light emitting element, and at least one capacitor connected to the transistors.

The operating frequency of the display device may be set in various ways. For example, in an image such as a game, the screen transition proceeds quickly, so that pixels may be operated at a high frequency. When a document is created or a still image is displayed, because the screen change is slow or the screen change is temporarily stopped, the pixels may be operated at a low frequency. When the pixels operate at a low frequency, power consumption may be reduced.

Because the operating time of the pixels becomes longer at low frequencies, various problems may occur, such as a change in luminance due to a shift of a hysteresis curve of the transistors and a change in luminance due to a leakage current of the transistors.

SUMMARY

Aspects of one or more embodiments of the present disclosure are directed toward a display device capable of reducing luminance change due to movement of a hysteresis curve of transistors and reducing luminance change due to leakage current of transistors, and an electronic device including the same.

In an embodiment of the present disclosure, a display device includes: a light emitting element including an anode, a cathode, and a light emitting layer between the anode and the cathode; a first transistor connected between the anode and a first power line, the first transistor to be switched by a voltage of a node; a second transistor connected between the first transistor and a data line, the second transistor to be switched by a write scan signal; a third transistor connected between the node and the anode, the third transistor to be switched by a compensation scan signal; a fourth transistor connected between the node and an initialization line, the fourth transistor to be switched by an initialization scan signal; an insulating layer on the first to the fourth transistors; and a light blocking pattern protruding from the insulating layer, the light blocking pattern being adjacent to the third transistor and the fourth transistor.

The display device may further include a bias transistor connected to a first electrode of the first transistor connected to the first power line, the bias transistor to receive a bias voltage and to be switched by a bias scan signal.

The bias voltage may be applied to the first electrode of the first transistor through the bias transistor before the light emitting element emits light after a threshold voltage of the first transistor is compensated.

The first transistor may include a control electrode connected to the node, a first electrode connected to the first power line, and a second electrode connected to the anode. The second transistor may be connected between the first electrode of the first transistor and the data line.

The first transistor may include a control electrode connected to the node, a first electrode connected to the first power line, and a second electrode connected to the anode. The second transistor may be connected to the control electrode of the first transistor.

A driving frequency for driving the light emitting element and the first to the fourth transistors may be set to 20 Hz to 48 Hz.

The light blocking pattern may include a plurality of light blocking patterns arranged to surround the third transistor and the fourth transistor in a plan view.

The plurality of light blocking patterns may block light provided toward the third transistor and the fourth transistor.

The display device may further include a plurality of gate insulating layers including: a first gate insulating layer on a source-drain of each of the first to the fourth transistors; and a second gate insulating layer on a gate of each of the first to the fourth transistors. The insulating layer may include a first planarization insulating layer on the first to the fourth transistors; a second planarization insulating layer on the first planarization insulating layer; and a pixel defining film on the second planarization insulating layer, the pixel defining film having a pixel opening in which the light emitting layer is disposed.

The pixel defining film may have a black color. The light blocking pattern may protrude from the pixel defining film, the light blocking pattern being in openings defined in the first planarization insulating layer and the second planarization insulating layer.

The light blocking pattern may further protrude from the pixel defining film, the light blocking pattern being further disposed in openings defined in the gate insulating layers.

The display device may further include: an interlayer insulating layer on the gate insulating layers; a first conductive pattern on the interlayer insulating layer; and a second conductive pattern on the first planarization insulating layer. The first planarization insulating layer may be on the interlayer insulating layer to cover the first conductive pattern. The light blocking pattern may not overlap the first conductive pattern, the second conductive pattern, and a source electrode, a drain electrode, and a gate electrode of each of the third transistor and the fourth transistor.

The pixel defining film may have a black color. The light blocking pattern may protrude from the pixel defining film and may be in an opening defined in the second planarization insulating layer.

The display device may further include: an interlayer insulating layer on the gate insulating layers; a first conductive pattern on the interlayer insulating layer; and a second conductive pattern on the first planarization insulating layer. The first planarization insulating layer may be on the interlayer insulating layer to cover the first conductive pattern. The light blocking pattern may not overlap the second conductive pattern, the light blocking pattern extending in a first direction that is an extension direction of the second conductive pattern.

The first planarization insulating layer may have a black color. The light blocking pattern may protrude from the first planarization insulating layer and is in openings defined in the gate insulating layers.

The second planarization insulating layer may have a black color. The light blocking pattern may protrude from the second planarization insulating layer, the light blocking pattern being in an opening defined in the first planarization insulating layer.

The second planarization insulating layer may have a black color. The light blocking pattern may protrude from the second planarization insulating layer, the light blocking pattern being in openings defined in the first planarization insulating layer and the gate insulating layers.

The display device may include a spacer on the pixel defining film. The spacer, the pixel defining film, the first planarization insulating layer, and the second planarization insulating layer may have a black color. The light blocking pattern may protrude from the first planarization insulating layer, the light blocking pattern being in openings defined in the gate insulating layers.

A first portion of the pixel defining film on the third transistor and the fourth transistor may have a black color. A second portion of the pixel defining film on the first transistor may not have the black color.

The display device may further include: a first substrate; a second substrate facing the first substrate; a sealant between the first substrate and the second substrate; and a driving unit on the first substrate and configured to generate driving signals to drive the first to the fourth transistors. The driving unit may include a plurality of elements at a same layer as the first to the fourth transistors. The light emitting element, the first to the fourth transistors, and the plurality of elements may be between the first substrate and the second substrate and may be sealed by the sealant. The light blocking pattern may include a plurality of light blocking patterns adjacent to the plurality of elements in a plan view.

In an embodiment of the present disclosure, a display device includes: a light emitting element including an anode, a cathode, and a light emitting layer between the anode and the cathode; a first transistor connected between the anode and a first power line, the first transistor to be switched by a voltage of a node; a second transistor connected between the first transistor and a data line, the second transistor to be switched by a write scan signal; a third transistor connected between the node and the anode, the third transistor to be switched by a compensation scan signal; a fourth transistor connected to the node, the fourth transistor to receive an initial voltage and a voltage and to be switched by an initialization scan signal; and a plurality of light blocking patterns surrounding the third and fourth transistors when viewed in a plan view.

The display device may include a pixel defining film on the first to the fourth transistors, the pixel defining film having a pixel opening in which the light emitting layer is disposed. The pixel defining film may have a black color. The light blocking patterns may protrude downward from the pixel defining film.

The display device may include a first planarization insulating layer on the first to the fourth transistors; and a second planarization insulating layer on the first planarization insulating layer. The pixel defining film may be on the second planarization insulating layer. The light blocking patterns may be in openings defined in the first planarization insulating layer and the second planarization insulating layer.

In an embodiment of the present disclosure, a display device includes: a light emitting element including an anode, a cathode, and a light emitting layer between the anode and the cathode; a first transistor connected between the anode and a first power line, the first transistor to be switched by a voltage of the node; a second transistor connected between the first transistor and a data line, the second transistor to be switched by a write scan signal; a third transistor connected between the node and the anode, the third transistor to be switched by a compensation scan signal; a fourth transistor connected to the node, the fourth transistor to receive an initial voltage and a voltage and to be switched by an initialization scan signal; an insulating layer on the first to the fourth transistors; and a light blocking pattern protruding downward from the insulating layer, the light blocking pattern being adjacent to the third transistor and the fourth transistor to block light provided toward the third transistor and the fourth transistor.

In an embodiment of the present disclosure, an electronic device includes: a display device having a first hole region through which an optical signal is to pass; an electro-optical module under the display device, overlapping the first hole region, and to receive the optical signal; and a case accommodating the display device and the electro-optical module. The display device includes: a light emitting element including an anode, a cathode, and a light emitting layer between the anode and the cathode; a first transistor connected between the anode and a first power line and to be switched by a voltage of a node; a second transistor connected between the first transistor and a data line and to be switched by a write scan signal; a third transistor connected between the node and the anode and to be switched by a compensation scan signal; a fourth transistor connected between the node and an initialization line and to be switched by an initialization scan signal; an insulating layer on the first to the fourth transistors; and a light blocking pattern protruding from the insulating layer and adjacent to the third transistor and the fourth transistor.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
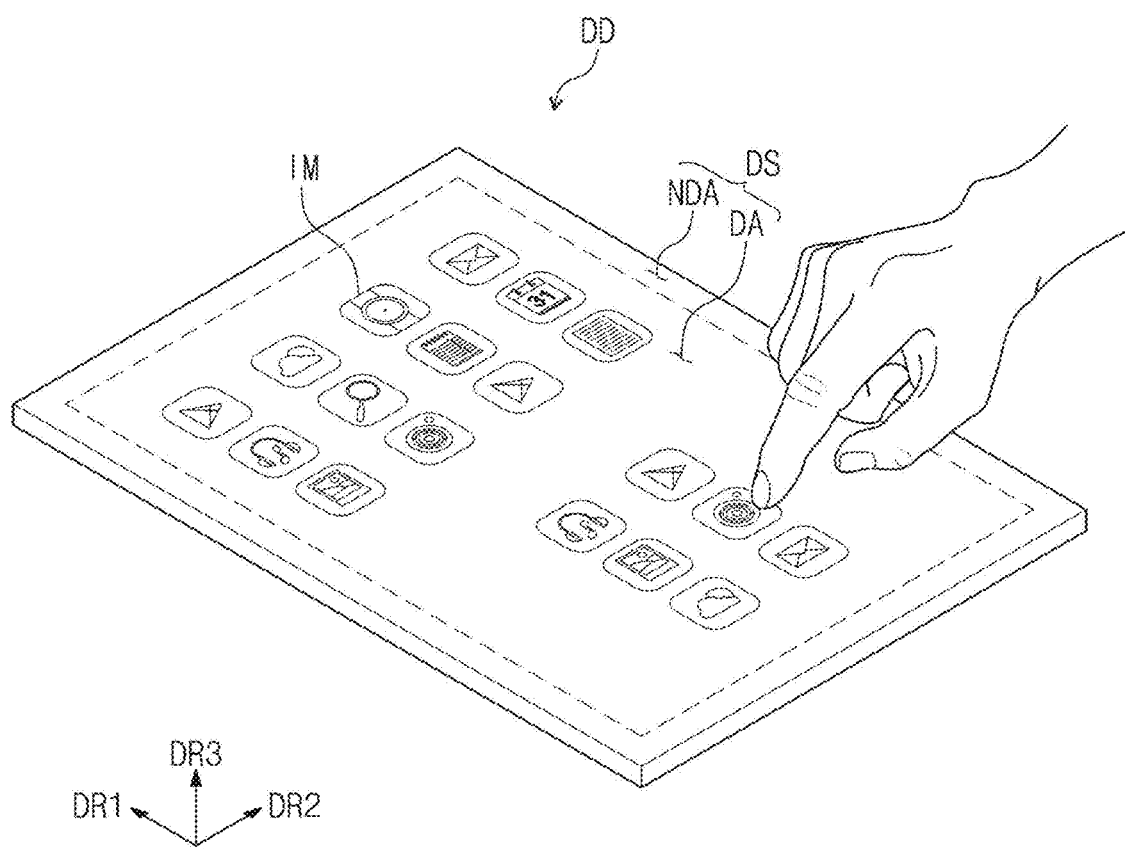
FIG. 1 is a perspective view of a display device according to one or more embodiments.

The present disclosure will now be described more fully with reference to the accompanying drawings in which embodiments of the disclosure are shown.

The terminology used herein is for the purpose of describing particular embodiments only and is not intended to limit the embodiments described herein.

As used herein, the singular forms "a," "an," and "the" are intended to include the plural forms as well, unless the context clearly indicates otherwise.

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

Like reference numerals refer to like elements. Additionally, in the drawings, the thicknesses, proportions, and dimensions of components are exaggerated for effective description.

As used herein, the term "and/or" includes any and all combinations of one or more of the associated listed items.

Further, the use of "may" when describing embodiments of the present disclosure refers to "one or more embodiments of the present disclosure."

It will be understood that the terms "first" and "second" are used herein to describe various components but these components should not be limited by these terms. The above terms are used only to distinguish one component from another. For example, a first component may be referred to as a second component and vice versa without departing from the scope of the present disclosure. The terms of a singular form may include plural forms unless otherwise specified.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

Unless otherwise defined, all terms (including technical and scientific terms) used herein have the same meaning as commonly understood by one of ordinary skill in the art to which this present disclosure belongs. In addition, terms defined in a commonly used dictionary should be interpreted as having a meaning consistent with the meaning in the context of the related technology, and unless interpreted in an ideal or overly formal sense, the terms are explicitly defined herein.

In various embodiments of the present disclosure, the term "include," "comprise," "including," or "comprising," specifies the presence of a property, a region, a fixed number, a step, a process, an element and/or a component but does not exclude the presence or addition of one or more other properties, regions, fixed numbers, steps, processes, elements and/or components.

Hereinafter, embodiments of the present disclosure will be described with reference to the drawings.

FIG. 1 is a perspective view of a display device according to one or more embodiments of the present disclosure.

Referring to FIG. 1, a display device DD according to one or more embodiments of the present disclosure may have a rectangular shape with long sides extending in a first direction DR1 and short sides extending in a second direction DR2 intersecting the first direction DR1. However, the present disclosure is not limited thereto, and the display device DD may have various suitable shapes such as a circle or a polygon.

Hereinafter, a direction substantially perpendicular to the plane defined by the first direction DR1 and the second direction DR2 is defined as the third direction DR3. In addition, in this specification, a plan view refers to a view in the third direction DR3.

The upper surface of the display device DD may be defined as the display surface DS and may have a plane defined by the first direction DR1 and the second direction DR2. The images IM generated by the display device DD may be provided to the user through the display surface DS.

The display surface DS may include a display area DA and a non-display area NDA around the display area DA. The display area DA may display an image, and the non-display area NDA may not display an image. The non-display area NDA may surround the display area DA and may define an outline portion of the display device DD printed in a color (e.g., a predetermined color).

Figure 2:
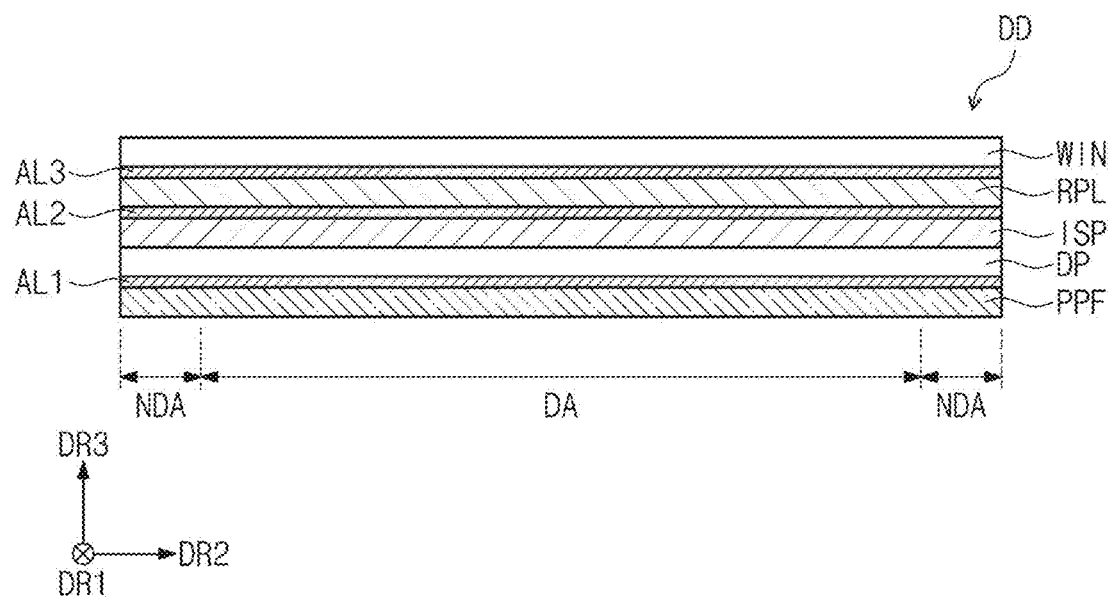
FIG. 2 is a diagram illustrating a cross-section of the display device shown in FIG. 1.

FIG. 2 is a diagram illustrating a cross-section of the display device shown in FIG. 1.

For example, in FIG. 2, a cross-section of the display device DD viewed from the first direction DR1 is illustrated.

Referring to FIG. 2, the display device DD may include a display panel DP, an input sensing unit ISP, an antireflection layer RPL, a window WIN, a panel protection film PPF, and first to third adhesive layers AL1 to AL3.

The display panel DP may be a flexible display panel. The display panel DP according to one or more embodiments of the present disclosure may be a light emitting display panel but is not limited thereto. For example, the display panel DP may be an organic light emitting display panel or an inorganic light emitting display panel. In the organic light emitting display panel, the light emitting layer may include an organic light emitting material. The light emitting layer of the inorganic light emitting display panel may include quantum dot, quantum rod, and/or the like. Hereinafter, the display panel DP is described as the organic light emitting display panel.

The input sensing unit ISP may be disposed on the display panel DP. The input sensing unit ISP may include a plurality of sensing units for sensing an external input in a capacitive manner. The input sensing unit ISP may be manufactured (e.g., directly manufactured) on the display panel DP when the display device DD is manufactured. However, the present disclosure is not limited thereto. For example, the input sensing unit ISP may be manufactured as a separate panel from the display panel DP, and may be attached to the display panel DP by an adhesive layer.

The antireflection layer RPL may be disposed on the input sensing unit ISP. The antireflection layer RPL may be defined as an external light antireflection film. The antireflection layer RPL may reduce reflectance of external light incident on the display panel DP from above the display device DD (e.g., from outside the display device DD).

When external light propagating toward the display panel DP is reflected from the display panel DP and provided to an external user again, like a mirror, the user may see external light. In order to prevent or substantially prevent this phenomenon, for example, the antireflection layer RPL may include a plurality of color filters displaying or transmitting light having the same color as the pixels of the display panel DP.

The color filters may filter external light to display or transmit light having the same color as the pixels. In this case, external light having a different color from the pixels may not be recognized by the user. However, the present disclosure is not limited thereto, and the antireflection layer RPL may include a phase retarder and/or a polarizer to reduce the reflectance of external light.

The window WIN may be disposed on the antireflection layer RPL. The window WIN may protect the display panel DP, the input sensing unit ISP, and the antireflection layer RPL from external scratches and impacts.

The panel protection film PPF may be disposed under the display panel DP. The panel protection film PPF may protect the lower part of the display panel DP. The panel protection film PPF may include a flexible plastic material such as polyethylene terephthalate (PET).

The first adhesive layer AL1 may be disposed between the display panel DP and the panel protection film PPF, and the display panel DP and the panel protection film PPF may be bonded to each other by the first adhesive layer AU. The second adhesive layer AL2 is disposed between the antireflection layer RPL and the input sensing unit ISP, and the antireflection layer RPL and the input sensing unit ISP may be bonded to each other by the second adhesive layer AL2. The third adhesive layer AL3 may be disposed between the window WIN and the antireflection layer RPL, and the window WIN and the antireflection layer RPL may be bonded to each other by the third adhesive layer AL3.

Figure 3:
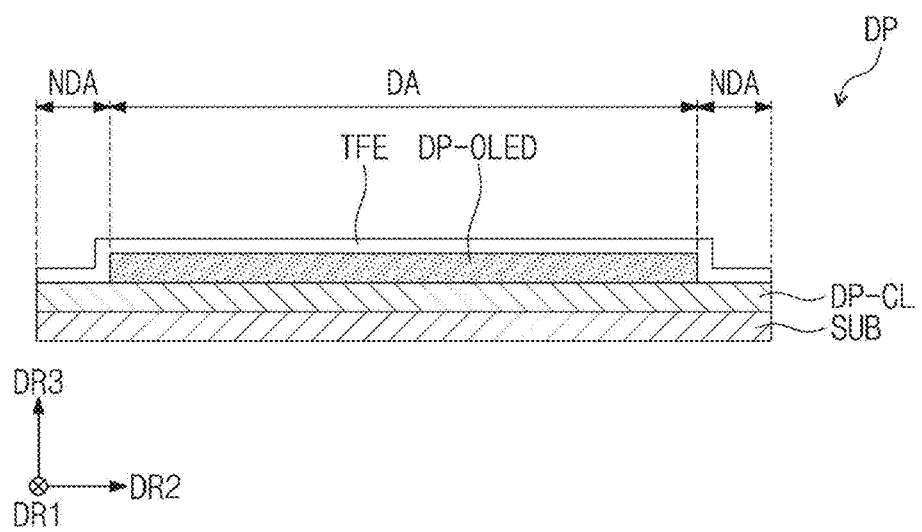
FIG. 3 is a diagram illustrating a cross-section of the display panel shown in FIG. 2.

FIG. 3 is a diagram illustrating a cross-section of the display panel shown in FIG. 2.

For example, in FIG. 3, a cross-section of the display panel DP viewed from the first direction DR1 is illustrated.

Referring to FIG. 3, the display panel DP may include a substrate SUB, a circuit element layer DP-CL disposed on the substrate SUB, a display element layer DP-OLED disposed on the circuit element layer DP-CL, and a thin film sealing layer TFE disposed on the display element layer DP-OLED.

The substrate SUB may include a display area DA and a non-display area NDA around the display area DA. The substrate SUB may include glass or a flexible plastic material such as polyimide (PI). The display element layer DP-OLED may be disposed on the display area DA.

A plurality of pixels may be disposed on the circuit element layer DP-CL and the display element layer DP-OLED. Each of the pixels may include a transistor disposed on the circuit element layer DP-CL and a light emitting element disposed on the display element layer DP-OLED and connected to the transistor. The configuration of the pixel will be described in more detail below.

The thin film sealing layer TFE may be disposed on the circuit element layer DP-CL to cover the display element layer DP-OLED. The thin-film sealing layer TFE may protect the pixels from moisture, oxygen, and foreign substances.

Figure 4:
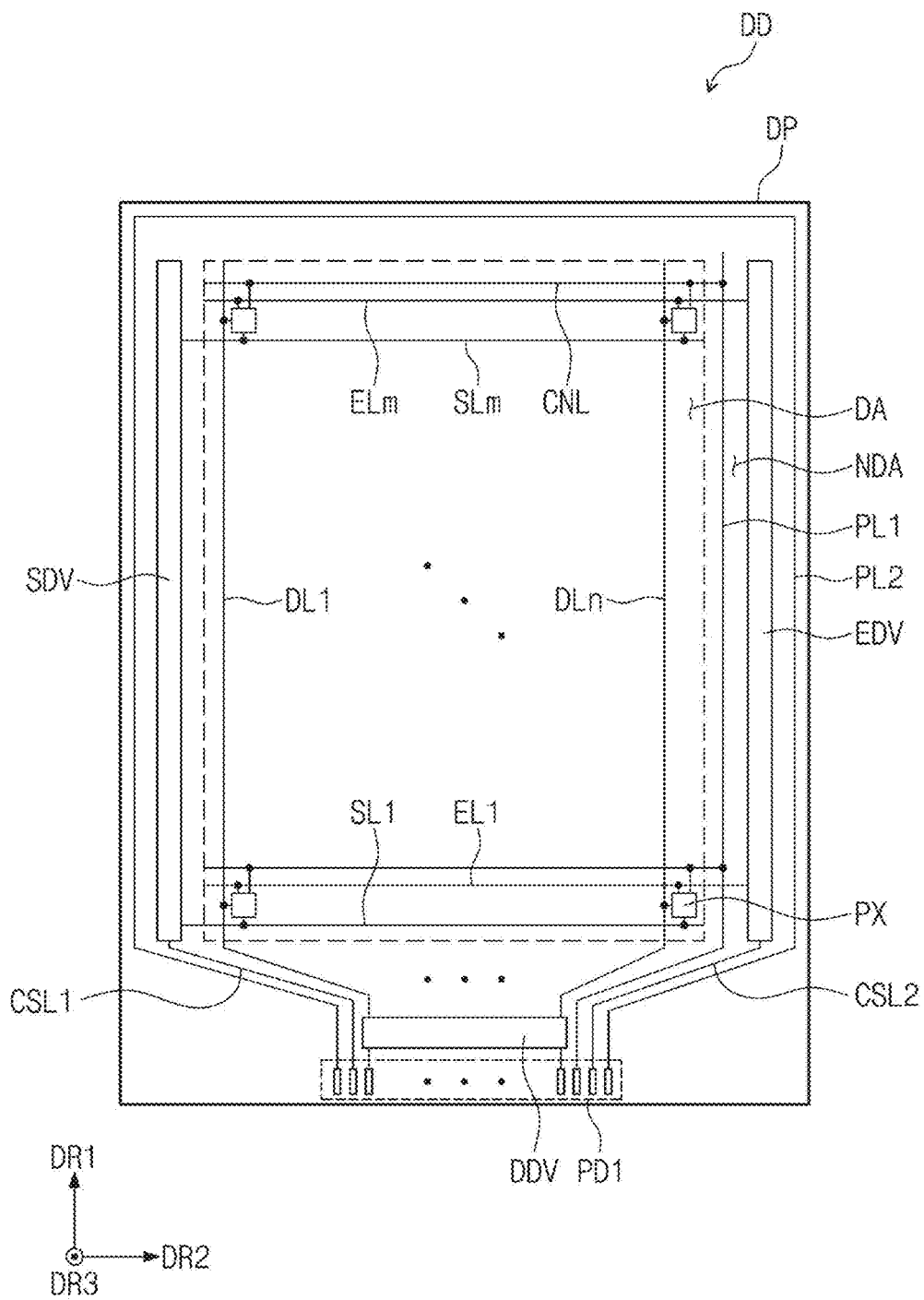
FIG. 4 is a plan view of the display panel shown in FIG. 2.

FIG. 4 is a plan view of the display panel shown in FIG. 2.

Referring to FIG. 4, the display device DD includes a display panel DP, a scan driver SDV, a data driver DDV, a light emission driver EDV, and a plurality of pads PD1.

The display panel DP may have a rectangular shape having long sides extending in the first direction DR1 and short sides extending in the second direction DR2, but the shape of the display panel DP is not limited thereto. The display panel DP may include a display area DA and a non-display area NDA surrounding the display area DA.

The display panel DP may include a plurality of pixels PX, a plurality of scan lines SL1 to SLm, a plurality of data lines DL1 to DLn, a plurality of light emitting lines EL1 to ELm, first and second control lines CSL1 and CSL2, first and second power lines PL1 and PL2, and connection lines CNL. m and n are natural numbers.

The pixels PX may be disposed in the display area DA. The scan driver SDV and the light emission driver EDV may be disposed in the non-display area NDA adjacent to respective long sides of the display panel DP. The data driver DDV may be disposed in the non-display area NDA adjacent to one of the short sides of the display panel DP. When viewed on a plane, the data driver DDV may be adjacent to the lower end of the display panel DP.

The scan lines SL1 to SLm may extend in the second direction DR2 and may be connected to the pixels PX and the scan driver SDV. The data lines DL1 to DLn may extend in the first direction DR1 to be connected to the pixels PX and the data driver DDV. The emission lines EU to ELm may extend in the second direction DR2 to be connected to the pixels PX and the light emission driver EDV.

The first power line PL1 may extend in the first direction DR1 and may be disposed in the non-display area NDA. The first power line PL1 may be disposed between the display area DA and the light emission driver EDV.

The connection lines CNL extend in the second direction DR2 and are arranged in the first direction DR1 to be connected to the first power line PL1 and the pixels PX. The first voltage may be applied to the pixels PX through the first power line PL1 connected to each other and the connection lines CNL.

The second power line PL2 is disposed in the non-display area NDA and may extend along long sides of the display panel DP and the other short side (e.g., a side adjacent to an upper end of the display panel DP) of the display panel DP on which the data driver DDV is not disposed. The second power line PL2 may be disposed outside the scan driver SDV and the light emission driver EDV. In one or more embodiments, the second power line PL2 may be around the scan driver SDV and the light emission driver EDV.

In one or more embodiments, the second power line PL2 may extend toward the display area DA to be connected to the pixels PX. A second voltage having a level lower than the first voltage may be applied to the pixels PX through the second power line PL2.

The first control line CSL1 may be connected to the scan driver SDV and may extend toward the lower end of the display panel DP. The second control line CSL2 may be connected to the light emission driver EDV and may extend toward a lower end of the display panel DP. The data driver DDV may be disposed between the first control line CSL1 and the second control line CSL2.

The pads PD1 may be disposed in the non-display area NDA adjacent to the lower end of the display panel DP, and may be closer to the lower end of the display panel DP than the data driver DDV. The data driver DDV, the first power line PL1, the second power line PL2, the first control line CSL1, and the second control line CSL2 may be connected to the pads PD1. The data lines DL1 to DLn may be connected to the data driver DDV, and the data driver DDV may be connected to the pads PD1 corresponding to the data lines DL1 to DLn.

In one or more embodiments, the display device DD may include a timing controller for controlling operations of the scan driver SDV, the data driver DDV, and the light emission driver EDV, and a voltage generation unit for generating first and second voltages. The timing controller and the voltage generation unit may be connected to the corresponding pads PD1 through a printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The light emission driver EDV generates a plurality of emission signals, and the emission signals may be applied to the pixels PX through the emission lines EU to ELm.

The pixels PX may be provided with the data voltages in response to the scan signals. The pixels PX may display an image by emitting light having luminance corresponding to data voltages in response to emission signals.

Figure 5:
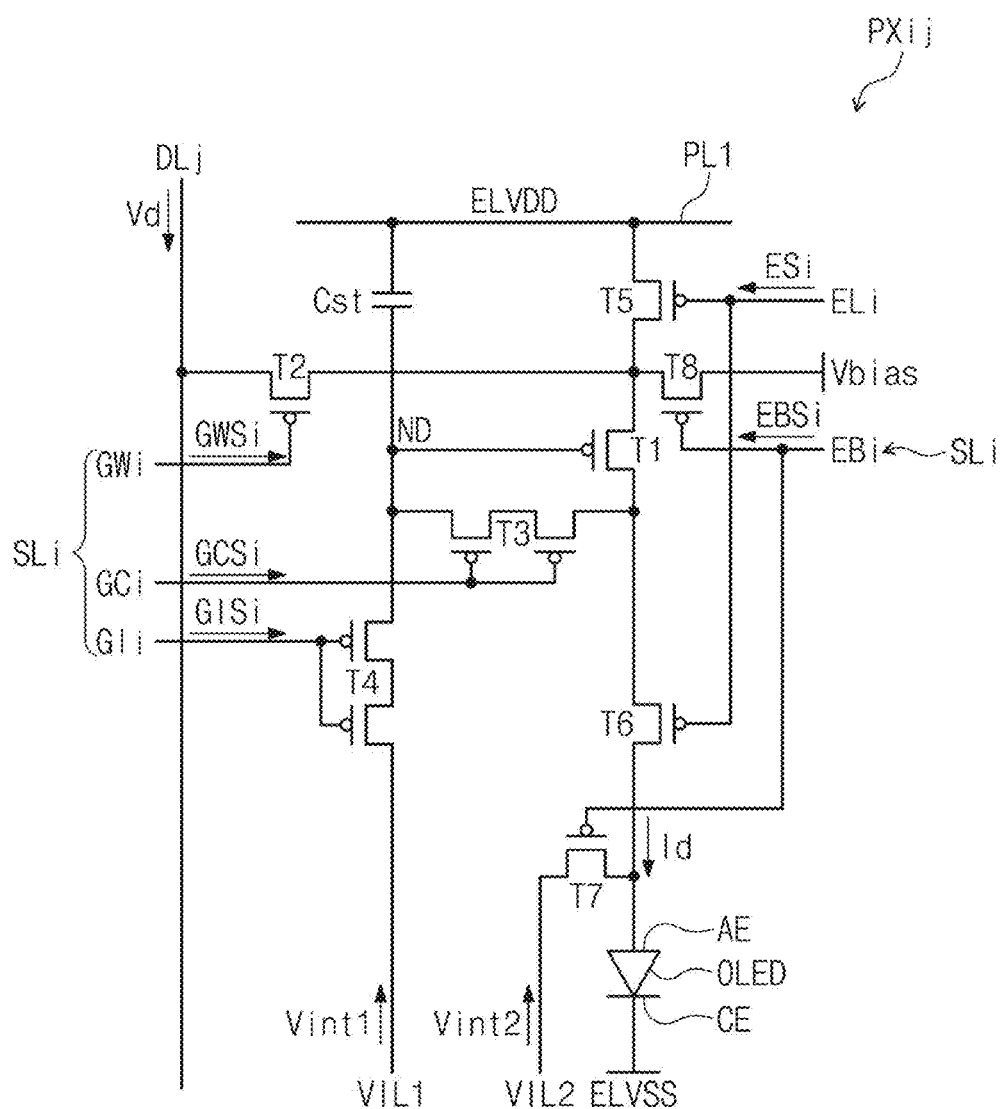
FIG. 5 is a diagram illustrating an equivalent circuit of one pixel shown in FIG. 4.
Figure 6:
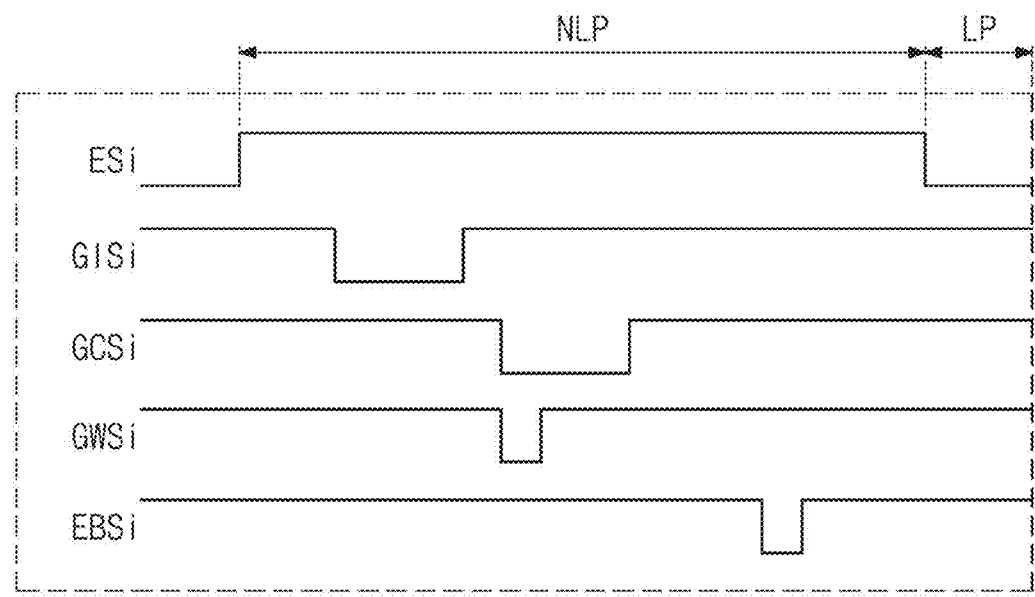
FIG. 6 is a timing diagram of signals for driving the pixel shown in FIG. 5.

FIG. 5 is a diagram illustrating an equivalent circuit of any one pixel shown in FIG. 4. FIG. 6 is a timing diagram of signals for driving the pixel shown in FIG. 5.

For example, in FIG. 5, a pixel PXij connected to an i-th scan line SLi, an i-th emission line ELi, and a j-th data line DLj is illustrated. i and j are natural numbers.

Referring to FIG. 5, the pixel PXij may include a light emitting element OLED, a plurality of transistors T1 to T8, and a capacitor Cst. The transistors T1 to T8 and the capacitor Cst may control the amount of current flowing through the light emitting element OLED. A light emitting element OLED may generate light having a luminance (e.g., predetermined luminance) according to the amount of received current.

The i-th scan line SLi may include an i-th write scan line GWi, an i-th compensation scan line GCi, an i-th initialization scan line Gli, and an i-th bias scan line EBi. The i-th write scan line GWi may receive the i-th write scan signal GWSi, and the i-th compensation scan line GCi may receive the i-th compensation scan signal GCSi. The i-th initialization scan line Gli may receive the i-th initialization scan signal GISi, and the i-th bias scan line EBi may receive the i-th bias scan signal EBSi. The i-th emission line ELi may receive the i-th emission signal ESi.

Each of the transistors T1 to T8 may include a source electrode, a drain electrode, and a gate electrode. Hereinafter, for convenience in FIG. 5, one of the source electrode and the drain electrode is defined as a first electrode, and the other is defined as a second electrode. Further, the gate electrode is defined as a control electrode.

The transistors T1 to T8 may include first to eighth transistors T1 to T8. The transistors T1 to T8 may include PMOS transistors, but the present disclosure is not limited thereto, and the transistors T1 to T8 may include NMOS transistors.

The first transistor T1 may be defined as a driving transistor, and the second transistor T2 may be defined as a switching transistor. The third transistor T3 may be defined as a compensation transistor. The fourth transistor T4 and the seventh transistor T7 may be defined as initialization transistors. The fifth and sixth transistors T5 and T6 may be defined as emission control transistors. The eighth transistor T8 may be defined as a bias transistor.

The light emitting element OLED may be defined as an organic light emitting element. The light emitting element OLED may include an anode AE and a cathode CE. The anode AE may receive the first voltage ELVDD through the sixth, first, and fifth transistors T6, T1, and T5. The first voltage ELVDD may be applied to the pixel PXij through the first power line PL1. The cathode CE may receive the second voltage ELVSS having a level lower than the first voltage ELVDD. The second voltage ELVSS may be applied to the pixel PXij through the second power line PL2 described above.

The first transistor T1 is connected between the anode AE and the first power line PL1 and may be switched by the voltage of the node ND. Specifically, the first transistor T1 may be connected between the fifth transistor T5 and the sixth transistor T6. The first transistor T1 may be connected to the first power line PL1 through the fifth transistor T5 and may be connected to the anode AE through the sixth transistor T6.

The first transistor T1 may include a first electrode connected to the first power line PL1 through the fifth transistor T5, a second electrode connected to the anode AE through the sixth transistor T6, and a control electrode connected to the node ND. The first electrode of the first transistor T1 may be connected to the fifth transistor T5, and the second electrode of the first transistor T1 may be connected to the sixth transistor T6. The first transistor T1 may control the amount of current flowing through the light emitting element OLED according to the voltage of the node ND applied to the control electrode of the first transistor T1.

The second transistor T2 is connected between the first transistor T1 and the data line DLj and may be switched by the write scan signal GWSi. Specifically, the second transistor T2 may be connected between the first electrode of the first transistor T1 and the data line DLj. The second transistor T2 may include a first electrode connected to the data line DLj, a second electrode connected to the first electrode of the first transistor T1, and a control electrode connected to the i-th write scan line GWi.

The second transistor T2 is turned on by the i-th write scan signal GWSi applied through the i-th write scan line Gwi to connect (e.g., electrically connect) the data line DLj and the first electrode of the first transistor T1. The second transistor T2 may perform a switching operation of providing the data voltage Vd applied through the data line DLj to the first electrode of the first transistor T1.

The third transistor T3 is connected between the node ND and the anode AE, and may be switched by the compensation scan signal GCSi. Specifically, the third transistor T3 may be connected to the anode AE through the sixth transistor T6. The third transistor T3 may be connected between the second electrode of the first transistor T1 and the node ND. The third transistor T3 may include a first electrode connected to the second electrode of the first transistor T1, a second electrode connected to the node ND, and a control electrode connected to the i-th compensation scan line GCi.

The third transistor T3 is turned on by the i-th compensation scan signal GCSi applied through the i-th compensation scan line GCi to connect (e.g., electrically connect) the second electrode of the first transistor T1 and the control electrode of the first transistor T1. When the third transistor T3 is turned on, the first transistor T1 may be diode-connected.

The third transistor T3 may be implemented as a dual gate structure to reduce leakage current. In the dual gate structure, two gate electrodes (control electrodes) are connected to each other to have the same potential, and the channel length may be longer than that of the single gate structure. When the channel length is increased, resistance is increased, so that leakage current is reduced during turn-off, so that operation stability may be secured or improved.

The fourth transistor T4 is connected between the node ND and the first initialization line VIL1 and may be switched by the i-th initialization scan signal GISi. The fourth transistor T4 may include a first electrode connected to the node ND, a second electrode connected to the first initialization line VIL1, and a control electrode connected to the i-th initialization scan line Gli.

The fourth transistor T4 is turned on by the i-th initialization scan signal GISi applied through the i-th initialization scan line Gli, so that the first initialization voltage Vint1 applied through the first initialization line VIL1 may be provided to the node ND. Similar to the third transistor T3, the fourth transistor T4 may be implemented as a dual gate structure to reduce leakage current.

The fifth transistor T5 may be connected between the first power line PL1 and the first transistor T1. The fifth transistor T5 may include a first electrode receiving a first voltage ELVDD, a second electrode connected to the first electrode of the first transistor T1, and a control electrode connected to the i-th emission line ELi.

The sixth transistor T6 may be connected between the first transistor T1 and the anode AE. The sixth transistor T6 may include a first electrode connected to the second electrode of the first transistor T1, a second electrode connected to the anode AE, and a control electrode connected to the i-th emission line ELi.

The fifth and sixth transistors T5 and T6 may be turned on by the i-th emission signal ESi applied through the i-th emission line ELi. The first voltage ELVDD is provided to the light emitting element OLED by the turned-on fifth transistor T5 and sixth transistor T6, so that a driving current may flow through the light emitting element OLED. Accordingly, a light emitting element OLED may emit light.

The seventh transistor T7 may include a first electrode connected to the anode AE, a second electrode connected to the second initialization line VIL2, and a control electrode connected to the i-th bias scan line EBi. The seventh transistor T7 is turned on by the i-th bias scan signal EBSi applied through the i-th bias scan line EBi, so that the second initialization voltage Vint2 received through the second initialization line VIL2 may be provided to the anode AE of the light emitting element OLED.

In one or more embodiments of the present disclosure, the seventh transistor T7 may be omitted. In one or more embodiments of the present disclosure, the second initialization voltage Vint2 may have the same level as the first initialization voltage Vint1, but is not limited thereto and may have a different level from the first initialization voltage Vint1.

The seventh transistor T7 may improve the black expression capability of the pixel PXij. When the seventh transistor T7 is turned on, a parasitic capacitor of the light emitting element OLED may be discharged. Accordingly, when the black luminance is implemented, the light emitting element OLED does not emit light due to the leakage current of the first transistor T1, and thus black expression capability may be improved.

The capacitor Cst may include a first electrode receiving the first voltage ELVDD and a second electrode connected to the node ND. When the fifth transistor T5 and the sixth transistor T6 are turned on, the amount of current flowing through the first transistor T1 may be determined according to the voltage stored in the capacitor Cst.

The eighth transistor T8 is connected to the first electrode of the first transistor T1, receives the bias voltage Vbias, and may be switched by the i-th bias scan signal EBSi. The eighth transistor T8 may include a first electrode that receives the bias voltage Vbias, a second electrode connected to the first electrode of the first transistor T1, and a control electrode connected to the i-th bias scan line EBi. The eighth transistor T8 may be turned on by the i-th bias scan signal EBSi and may provide the bias voltage Vbias to the first electrode of the first transistor T1.

Hereinafter, an operation of the pixel PXij will be described in more detail with reference to the timing diagram of FIG. 6. In FIG. 6, a low level may be defined as an activated signal, and a high level may be defined as an inactive signal.

Referring to FIGS. 5 and 6, the i-th emission signal ESi may be deactivated during the non-emission period NLP and may be activated during the emission period LP. In one or more embodiments, the activation section of the i-th initialization scan signal GISi and the activation section of the i-th compensation scan signal GCSi may be larger than the activation section of the i-th write scan signal GWSi and the activation section of the i-th bias scan signal EBSi.

After the i-th initialization scan signal GISi is activated, the i-th write scan signal GWSi and the i-th compensation scan signal GCSi may be activated. Thereafter, the i-th bias scan signal EBSi may be activated. Thereafter, the i-th emission signal ESi may be activated.

During the emission period LP, the i-th initialization scan signal GISi, the i-th write scan signal GWSi, the i-th compensation scan signal GCSi, and the i-th bias scan signal EBSi, respectively activated, may be applied to the pixel PXij.

Hereinafter, an operation in which each signal is applied to a corresponding transistor may refer to an operation in which an activated signal is applied to the transistor.

The i-th initialization scan signal GISi may be applied to the fourth transistor T4 to turn on the fourth transistor T4. The first initialization voltage Vint1 may be provided to the node ND through the fourth transistor T4. The first initialization voltage Vint1 may be applied to the control electrode of the first transistor T1, and the first transistor T1 may be initialized by the first initialization voltage Vint1. Such an operation may be defined as an initialization operation.

Thereafter, the i-th write scan signal GWSi is applied to the second transistor T2 so that the second transistor T2 may be turned on. Also, the i-th compensation scan signal GCSi may be applied to the third transistor T3 to turn on the third transistor T3.

The first transistor T1 and the third transistor T3 may be turned on such that the first transistor T1 is diode-connected. In this case, the compensation voltage Vd-Vth reduced by the threshold voltage Vth of the first transistor T1 from the data voltage Vd supplied through the data line DLj may be applied to the control electrode of the first transistor T1.

This operation may be defined as a threshold voltage compensation operation for the first transistor T1, and the threshold voltage compensation operation may be performed by the third transistor T3. When the threshold voltage Vth of the first transistor T1 is compensated, the driving current Id may be determined regardless of the threshold voltage Vth of the first transistor T1. This operation will be described in more detail below.

A first voltage ELVDD and a compensation voltage Vd-Vth may be applied to the first electrode and the second electrode of the capacitor Cst, respectively. A charge corresponding to a voltage difference between the voltage of the first electrode of the capacitor Cst and the voltage of the second electrode of the capacitor Cst may be stored in the capacitor Cst.

Thereafter, the i-th bias scan signal EBSi may be applied to the seventh and eighth transistors T7 and T8 to turn on the seventh and eighth transistors T7 and T8. The second initialization voltage Vint2 may be provided to the anode AE through the seventh transistor T7 to initialize the anode AE to the second initialization voltage Vint2. A bias voltage Vbias may be applied to the first electrode of the first transistor T1 through the eighth transistor T8.

Thereafter, during the emission period LP, the i-th emission signal ESi is applied to the fifth transistor T5 and the sixth transistor T6 through the i-th emission line ELi, so that the fifth transistor T5 and the sixth transistor T6 may be turned on. In this case, a driving current Id corresponding to a voltage difference between the voltage of the control electrode of the first transistor T1 and the first voltage ELVDD may be generated. The driving current Id is provided to the light emitting element OLED through the sixth transistor T6 so that the light emitting element OLED may emit light.

During the emission period LP, the source-gate voltage Vsg of the first transistor T1 may be defined as a voltage difference between the first voltage ELVDD and the compensation voltage Vd-Vth as shown in Equation 1 below.

$$Vsg=ELVDD-(Vd-Vth) \qquad \text{[Equation 1]}$$

The relationship between the current and voltage of the first transistor T1 is shown in Equation 2 below. Equation 2 is a current and voltage relationship of a general transistor.

$$Id=(\tfrac{1}{2})\mu Cox(W/L)(Vsg-Vth)^2 \qquad \text{[Equation 2]}$$

When Equation 1 is substituted into Equation 2, the threshold voltage Vth is removed, and the driving current Id may be proportional to a square value of a value obtained by subtracting the data voltage Vd from the first voltage ELVDD. In other words, the driving current Id may be proportional to $(ELVDD-Vd)^2$. Therefore, the threshold voltage compensation operation is performed by the third transistor T3, so that the driving current Id may be determined regardless of the threshold voltage Vth of the first transistor T1.

After the threshold voltage of the first transistor T1 is compensated, before the light emitting element OLED emits light, the bias voltage Vbias may be applied to the first electrode of the first transistor T1 through the eighth transistor T8. The shift of the hysteresis curve of the first transistor T1 may be suppressed by the bias voltage Vbias. This operation will be described in more detail below with reference to FIGS. 7A, 7B, 8A, and 8B.

Figure 7A:
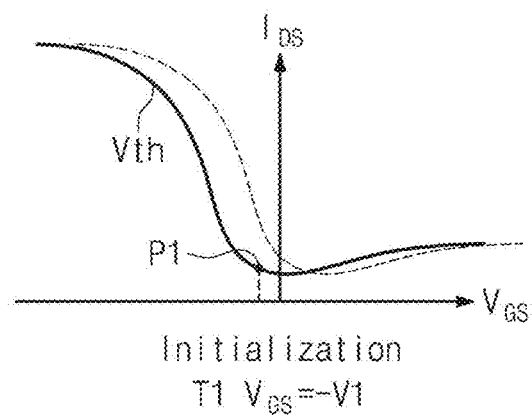
FIGS. 7A and 7B are diagrams illustrating a hysteresis curve of the first transistor when a bias voltage is not applied to the first transistor.
Figure 7B:
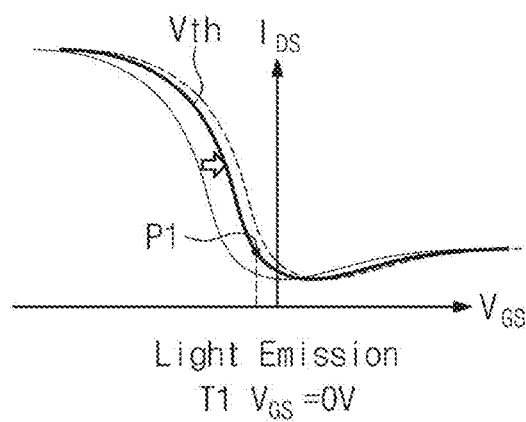
Figure 8A:
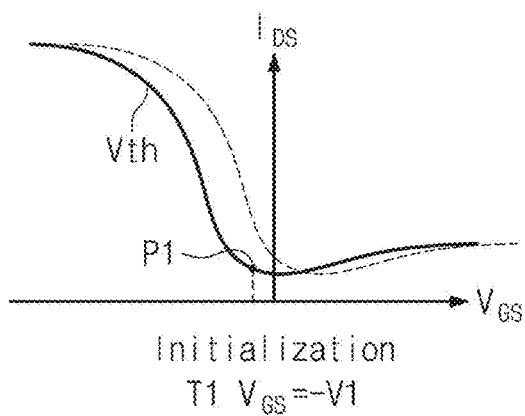
FIGS. 8A and 8B are diagrams illustrating a hysteresis curve of the first transistor when a bias voltage is applied to the first transistor.
Figure 8B:
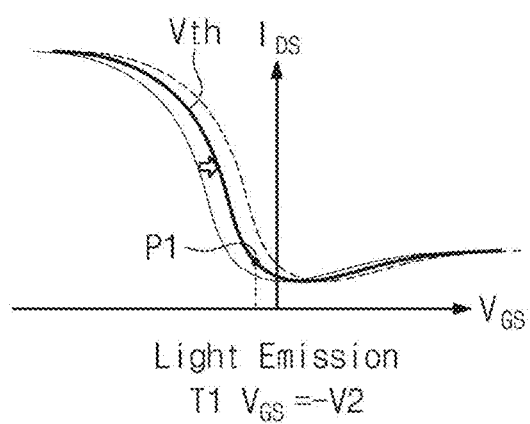

FIGS. 7A and 7B are diagrams illustrating a hysteresis curve of the first transistor when a bias voltage is not applied to the first transistor. FIGS. 8A and 8B are diagrams illustrating a hysteresis curve of the first transistor when a bias voltage is applied to the first transistor.

Referring to FIGS. 7A and 7B, during the initialization operation, the gate-source voltage Vgs of the first transistor T1 may have a first negative voltage −V1, and the hysteresis curve may move in a negative direction. Thereafter, during the light emitting operation, the gate-source voltage Vgs of the first transistor T1 may be approximately 0 V, and the hysteresis curve may shift to the right.

The first point P1 represents Vgs for displaying low luminance. Due to the shift of the hysteresis curve, the first point P1 for displaying the low luminance may be raised when proceeding from the initialization operation to the light emitting operation. In this case, the low luminance may not be normally displayed and the luminance may increase.

Referring to FIGS. 8A and 8B, during the initialization operation by the fourth transistor T4, the gate-source voltage Vgs of the first transistor T1 has a first negative voltage −V1, and the hysteresis curve may shift in the negative direction. After that, during light emitting operation, the gate-source voltage Vgs of the first transistor T1 may have a second negative voltage −V2 due to the bias voltage Vbias applied to the first electrode (source) of the first transistor T1.

Although the hysteresis curve may move to the right, the amount of movement of the hysteresis curve may be reduced in FIG. 8B as compared to FIG. 7B. That is, the shift of the hysteresis curve may be suppressed or reduced by the bias voltage Vbias.

When the first point P1 for displaying low luminance progresses from the initialization operation to the light emitting operation, it may be raised, but compared to FIG. 7B, in FIG. 8B, the degree of elevation of the first point P1 may be reduced. That is, the luminance change may be reduced. When the bias voltage Vbias is applied, the luminance change amount at the low luminance may be smaller than the luminance change amount at the low luminance when the bias voltage Vbias is not applied.

When the display device DD operates at a high frequency, a change in luminance may not be visually recognized because a screen change is rapidly performed. However, when the display device DD operates at a low frequency, a screen display period per frame may be lengthened, and thus screen switching may be performed slowly. Therefore, when the luminance change is large, such luminance change may be visually recognized at a low frequency. In one or more embodiments of the present disclosure, a driving frequency for driving the light emitting element OLED and the first to eighth transistors T1 to T8 may be set to 20 Hz to 48 Hz.

In one or more embodiments of the present disclosure, by applying the bias voltage Vbias to the first transistor T1, the movement of the hysteresis curve is suppressed, so that at low frequencies, the luminance change may be reduced.

Figure 9:
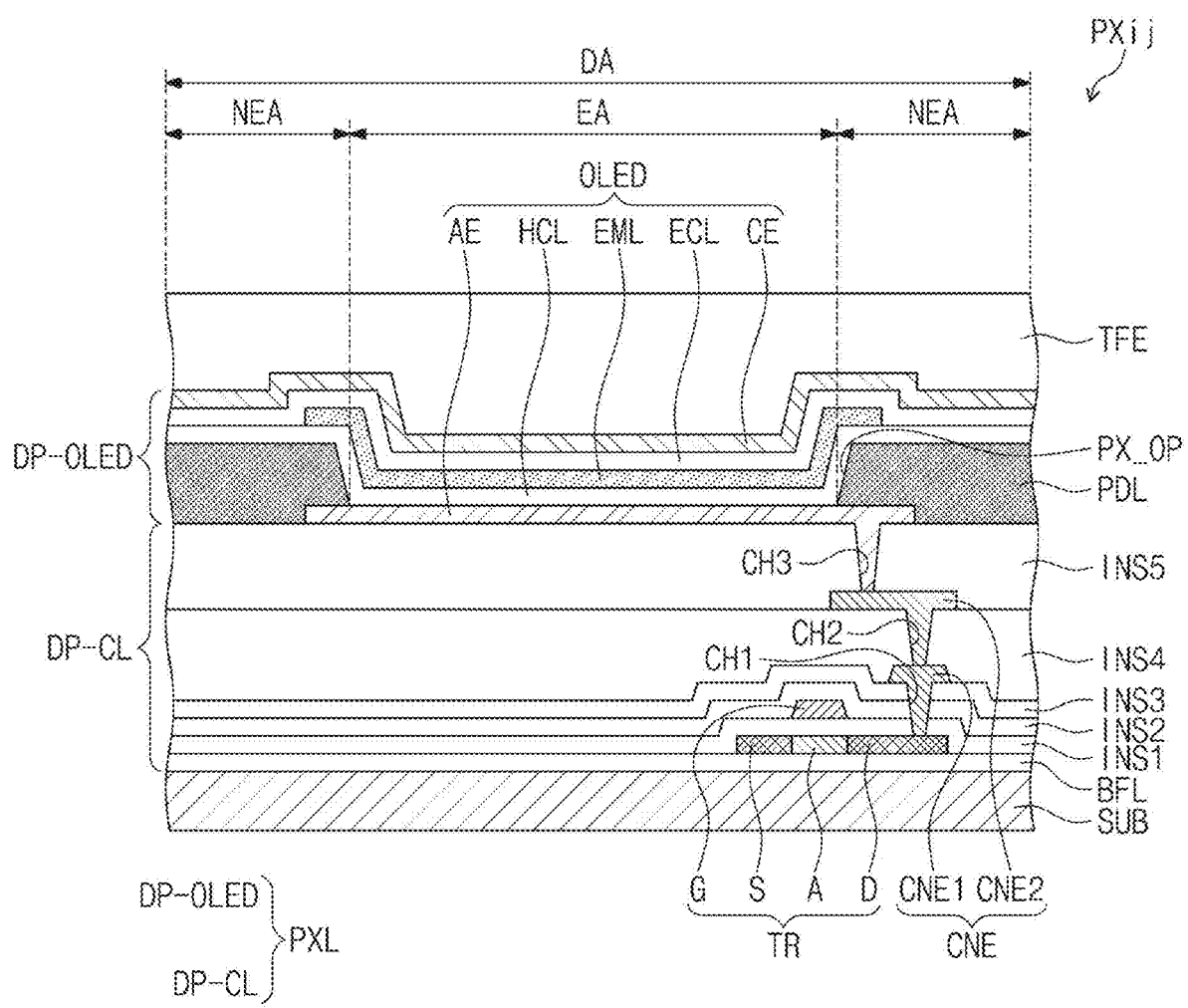
FIG. 9 is a view showing a cross-section of the light emitting element shown in FIG. 5.

FIG. 9 is a view showing a cross-section of the light emitting element shown in FIG. 5.

Referring to FIG. 9, the pixel PX may include a transistor TR and a light emitting element OLED. The transistor TR illustrated in FIG. 9 may be the sixth transistor T6 illustrated in FIG. 5.

The light emitting element OLED may include a first electrode AE, a second electrode CE, a hole control layer HCL, an electronic control layer ECL, and a light emitting layer EML. The first electrode AE may be defined as the anode, and the second electrode CE may be defined as the cathode. The light emitting layer EML may be disposed between the first electrode AE and the second electrode CE. The transistor TR and the light emitting element OLED may be disposed on the substrate SUB.

The display area DA may include an emission area EA corresponding to each of the pixels PX and a non-emission area NEA around the emission area EA.

The light emitting element OLED may be disposed in the emission area EA.

A buffer layer BFL may be disposed on the substrate SUB, and may be an inorganic layer. A semiconductor pattern may be disposed on the buffer layer BFL. The semiconductor pattern may include polysilicon, amorphous silicon, or metal oxide.

The semiconductor pattern may be doped with an N-type dopant or a P-type dopant. The semiconductor pattern may include a high doping area and a low doping area. The conductivity of the high doping area may be greater than that of the low doping area, and may substantially serve as a source electrode and a drain electrode of the transistor TR. The low doping area may substantially correspond to the active area (or channel) of the transistor.

The source electrode S, the active electrode A, and the drain electrode D of the transistor TR may be formed from a semiconductor pattern. The first insulating layer INS1 may be disposed on the semiconductor pattern. The first insulating layer INS1 may be defined as a first gate insulating layer. A gate electrode G of the transistor TR may be disposed on the first insulating layer INS1.

A second insulating layer INS2 may be disposed on the gate electrode G. The second insulating layer INS2 may be defined as a second gate insulating layer. The first and second insulating layers INS1 and INS2 may be sequentially disposed on the source-drain electrodes S and D, where the second insulating layer INS2 is also disposed on the gate electrode G. A third insulating layer INS3 may be disposed on the second insulating layer INS2. The third insulating layer INS3 may be defined as an interlayer insulating layer.

The connection electrode CNE may include a first connection electrode CNE1 and a second connection electrode CNE2 to connect the transistor TR and the light emitting element OLED. The first connection electrode CNE1 may be disposed on the third insulating layer INS3, and may be connected to the drain electrode D through the first contact hole CH1 defined in or through the first to third insulating layers INS1 to INS3.

A fourth insulating layer INS4 may be disposed on the first connection electrode CNE1. The fourth insulating layer INS4 may be disposed on the third insulating layer INS3 to cover the first connection electrode CNE1. The fourth insulating layer INS4 may be defined as a first planarization insulating layer.

The second connection electrode CNE2 may be disposed on the fourth insulating layer INS4. The second connection electrode CNE2 may be connected to the first connection electrode CNE1 through the second contact hole CH2 defined in or through the fourth insulating layer INS4.

A fifth insulating layer INS5 may be disposed on the second connection electrode CNE2. The fifth insulating layer INS5 may be defined as a second planarization insulating layer. A layer from the buffer layer BFL to the fifth insulating layer INS5 may be defined as a circuit element layer DP-CL. The first to third insulating layers INS1 to INS3 may be inorganic layers. The fourth and fifth insulating layers INS4 and INS5 may be organic layers.

The first electrode AE may be disposed on the fifth insulating layer INS5. The first electrode AE may be connected to the second connection electrode CNE2 through the third contact hole CH3 defined in or through the fifth insulating layer INS5. A pixel defining film PDL in which a pixel opening PX_OP for exposing a portion (e.g., a predetermined portion) of the first electrode AE is defined may be disposed on the first electrode AE and the fifth insulating layer INS5.

The hole control layer HCL may be disposed on the first electrode AE and the pixel defining film PDL. The hole control layer HCL may include a hole transport layer and a hole injection layer.

The light emitting layer EML may be disposed on the hole control layer HCL. The light emitting layer EML may be disposed in the pixel opening PX_OP. The light emitting layer EML may include an organic material and/or an inorganic material. The light emitting layer EML may generate any one of red light, green light, and blue light.

The electronic control layer ECL may be disposed on the light emitting layer EML and the hole control layer HCL. The electron control layer ECL may include an electron transport layer and an electron injection layer. The hole control layer HCL and the electron control layer ECL may be disposed (e.g., commonly disposed) in the emission area EA and the non-emission area NEA.

The second electrode CE may be disposed on the electronic control layer ECL. The second electrode CE may be disposed (e.g., commonly disposed) on the pixels PX. A layer on which a light emitting element OLED is disposed may be defined as a display element layer DP-OLED. The circuit element layer DP-CL and the display element layer DP-OLED may be defined as a pixel layer PXL.

The thin film sealing layer TFE may be disposed on the second electrode CE to cover the pixel PX. A thin film sealing layer TFE may include two inorganic layers and an organic layer between the inorganic layers. The inorganic layers may protect the pixel PX from moisture and/or oxygen. The organic layer may protect the pixel PX from foreign substances such as dust particles.

The first voltage ELVDD may be applied to the first electrode AE through the transistor TR, and the second voltage ELVSS may be applied to the second electrode CE. The holes and electrons injected into the light emitting layer EML may be combined to form excitons, and as the excitons transition to the ground state, the organic light emitting diode OLED may emit light.

FIGS. 10A to 10E are diagrams illustrating the planar structure of the pixel illustrated in FIG. 5 in stages.

Figure 10A:
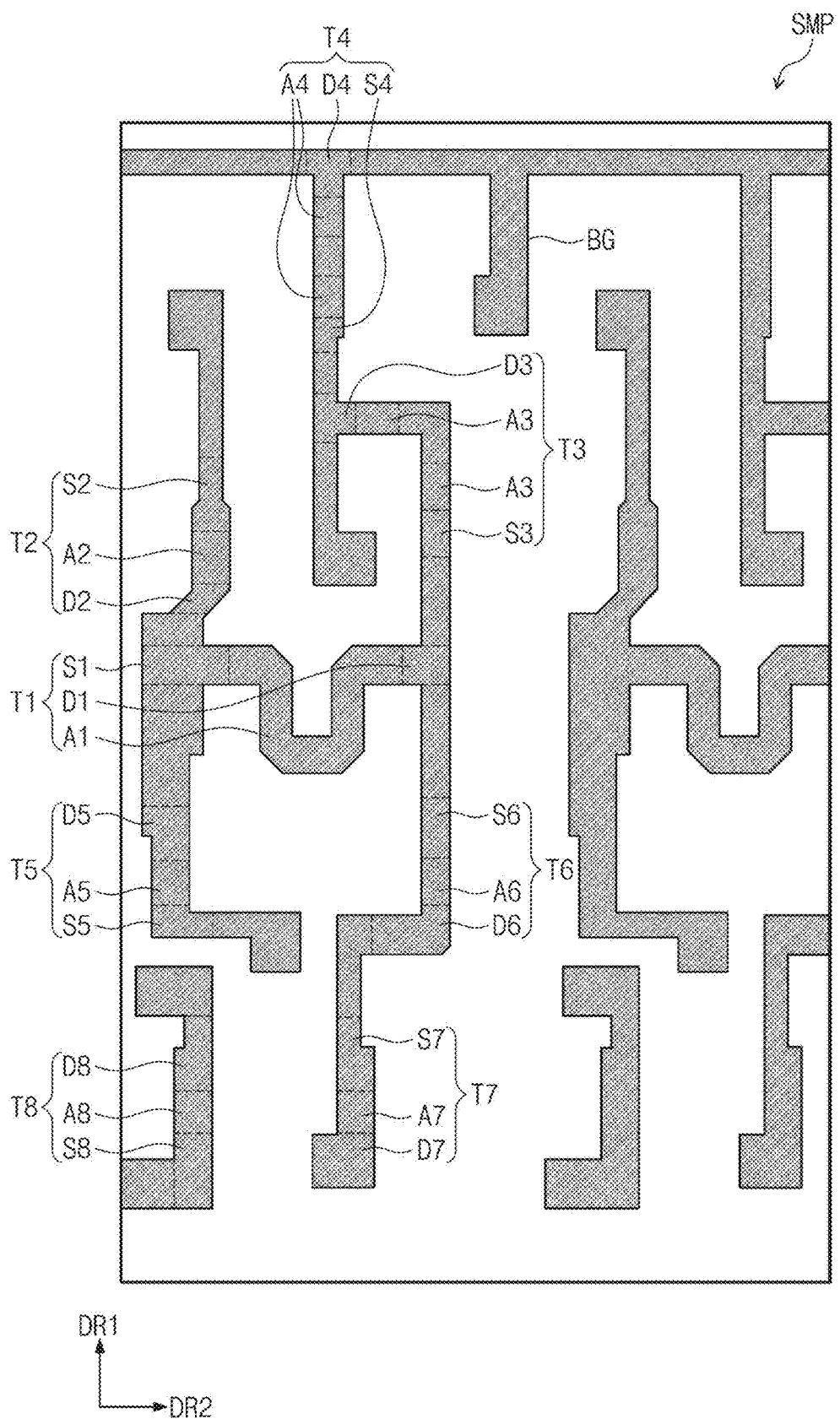
FIGS. 10A to 10E are diagrams illustrating the planar structure of the pixel illustrated in FIG. 5 in stages.
Figure 10B:
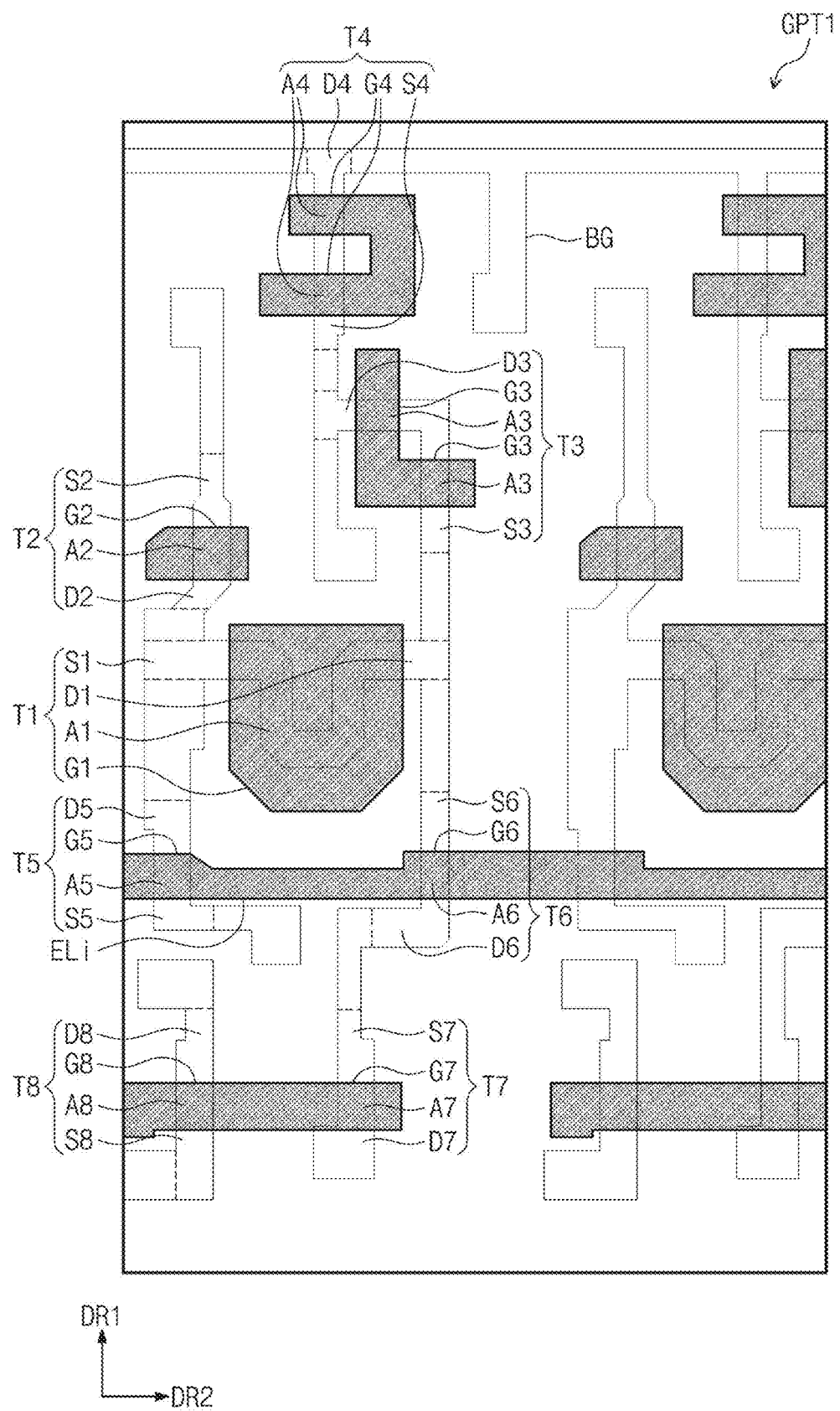
Figure 10C:
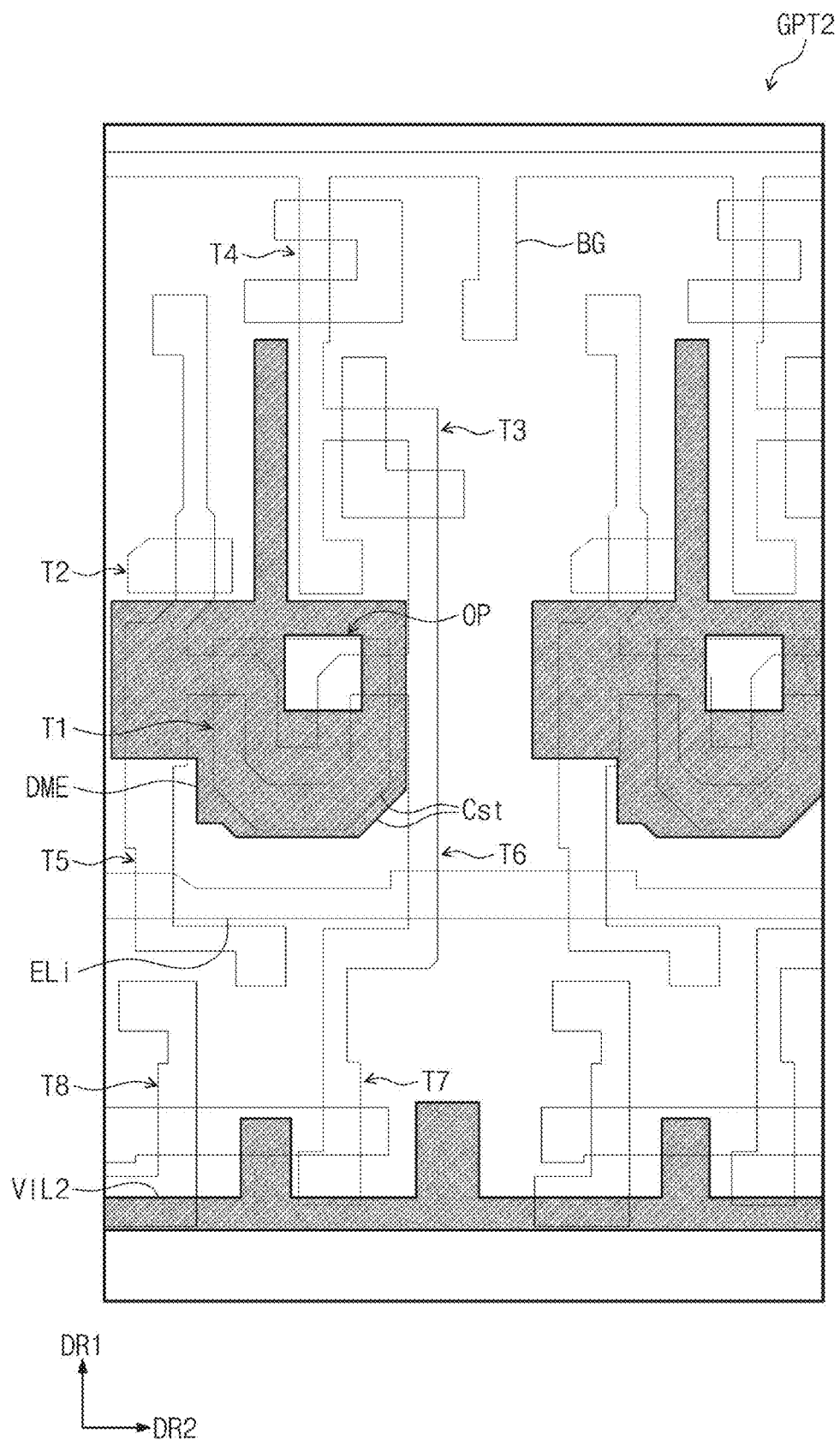
Figure 10D:
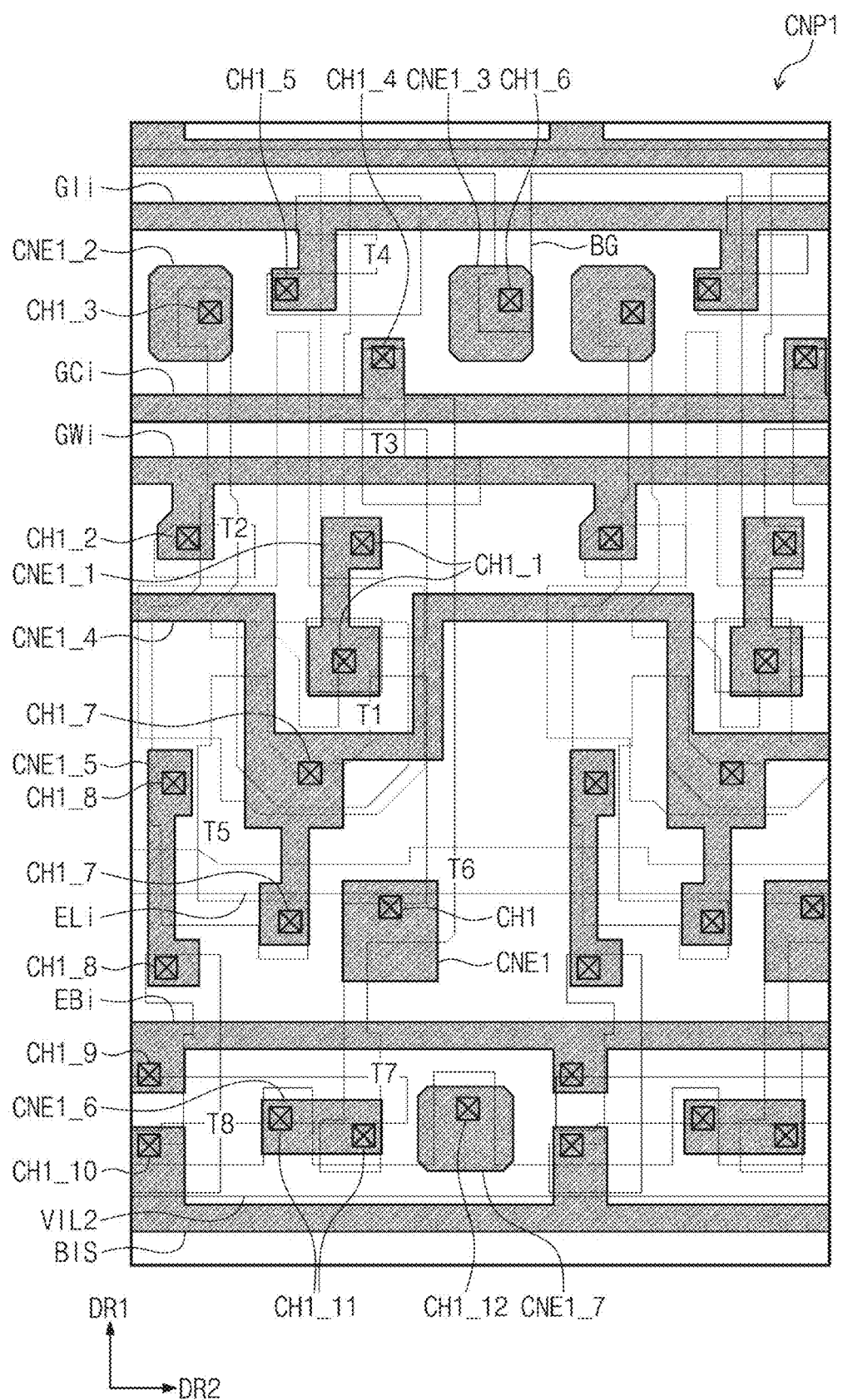
Figure 10E:
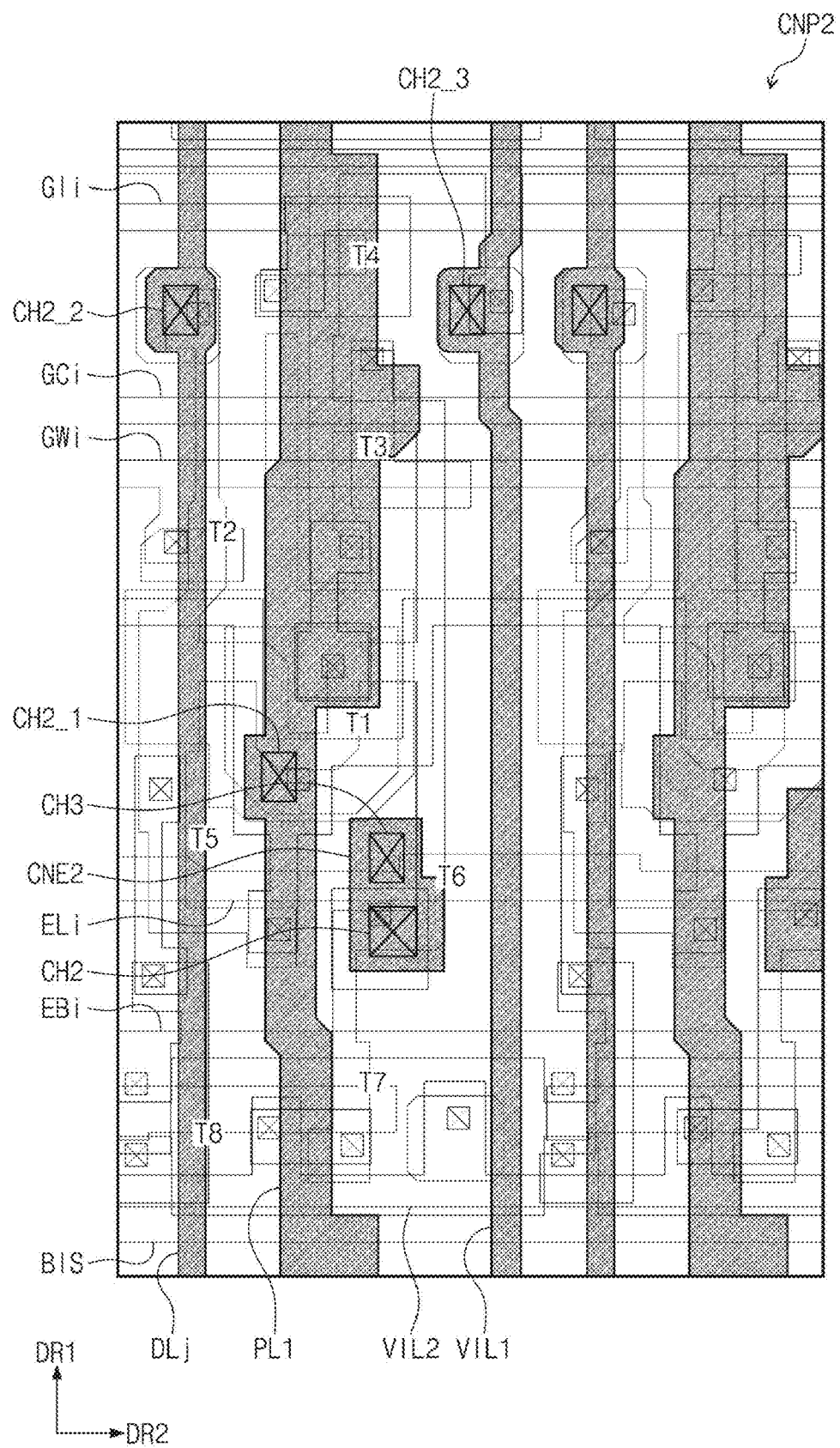

The plan view shown in FIG. 10E is substantially a plan view of the pixel PXij shown in FIG. 5, and a sequential stacking structure of patterns of the pixel PXij is illustrated through FIGS. 10A to 10E. The patterns of the pixel PXij may be defined as patterns for forming source electrodes S1 to S8, drain electrodes D1 to D8, active areas A1 to A8, gate electrodes G1 to G8, a capacitor Cst, and first and second connection electrodes CNE1 and CNE2.

Hereinafter, the source electrodes S1 to S8, the drain electrodes D1 to D8, the active areas A1 to A8, and the gate electrodes G1 to G8 are defined as first to eighth source electrodes S1 to S8, first to eighth drain electrodes D1 to D8, first to eighth active areas A1 to A8, and first to eighth gate electrodes G1 to G8.

FIG. 5 will be described together with FIGS. 10A to 10E below.

Referring to FIGS. 5 and 10A, a semiconductor pattern SMP may be disposed on a substrate SUB. The semiconductor pattern SMP is not limited to the shape shown in FIG. 10A and may have various suitable shapes.

The first to eighth source electrodes S1 to S8, the first to eighth drain electrodes D1 to D8, and the first to eighth active areas A1 to A8 of the first to eighth transistors T1 to T8 may be formed by the semiconductor pattern SMP. The first to eighth active areas A1 to A8 may be respectively disposed between the first to eighth source electrodes S1 to S8 and the first to eighth drain electrodes D1 to D8. Each of the third and fourth active areas A3 and A4 of the third and fourth transistors T4 having a dual gate structure may be formed of two active areas.

The second drain electrode D2 of the second transistor T2 and the fifth drain electrode D5 of the fifth transistor T5 may be formed to extend from the first source electrode S1 of the first transistor T1. The sixth source electrode S6 of the sixth transistor T6 and the third source electrode S3 of the third transistor T3 may be formed to extend from the first drain electrode D1 of the first transistor T1.

The fourth source electrode S4 of the fourth transistor T4 may extend from the third drain electrode D3 of the third transistor T3. The seventh source electrode S7 of the seventh transistor T7 may be formed to extend from the sixth drain electrode D6 of the sixth transistor T6.

The eighth source electrode S8, the eighth drain electrode D8, and the eighth active area A8 of the eighth transistor T8 may be adjacent to the semiconductor pattern SMP of the fifth transistor T5. The semiconductor pattern SMP of the eighth transistor T8 may be formed in an island shape.

The semiconductor pattern SMP extending from the fourth drain electrode D4 of the fourth transistor T4 may extend in the second direction DR2 and may branch in the first direction DR1. A portion of the semiconductor pattern SMP branched in the first direction DR1 may be defined as a branch BG. In one or more embodiments, the branch BG may extend in the first direction DR1 from the portion of the semiconductor pattern SMP extending in the second direction DR2 from the fourth drain electrode D4 of the fourth transistor T4.

Hereinafter, when referring to the lines shown in FIGS. 10B to 10E, the "i-th" name is omitted.

Referring to FIGS. 5 and 10B, a first gate pattern GPT1 may be disposed on the semiconductor pattern SMP. The first gate pattern GPT1 may include first to fourth gate electrodes G1 to G4, seventh and eighth gate electrodes G7 and G8, and an emission line ELi. The emission line ELi may extend in the second direction DR2.

The first to fourth gate electrodes G1 to G4 of the first to fourth transistors T1 to T4 and the seventh and eighth gate electrodes G7 and G8 of the seventh and eighth transistors T7 and T8 may be formed by the first gate pattern GPT1. Each of the third and fourth gate electrodes G3 and G4 of the third and fourth transistors T3 and T4 having a dual gate structure may be formed of two gates.

The emission line ELi may extend to cross the semiconductor pattern SMP. The fifth gate electrode G5 of the fifth transistor T5 and the sixth gate electrode G6 of the sixth transistor T6 may be formed by the emission line ELi. When viewed in a plan view, portions of the emission line ELi overlapping the semiconductor pattern SMP may be defined as fifth and sixth gate electrodes G5 and G6. When viewed in a plan view, the first to eighth gate electrodes G1 to G8 may overlap the first to eighth active areas A1 to A8, respectively.

Hereinafter, the symbols of the source electrode, the gate electrode, and the active area for each of the first to eighth transistors T1 to T8 are omitted from the drawings, and the symbols of the first to eighth transistors T1 to T8 will be shown.

Referring to FIGS. 5, 10B, and 10C, a second gate pattern GPT2 may be disposed on the first gate pattern GPT1. The second gate pattern GPT2 may include a dummy electrode DME and a second initialization line VIL2.

When viewed in a plan view, the dummy electrode DME may partially overlap the first gate electrode G1. An opening OP may be defined in the dummy electrode DME. The capacitor Cst may be formed by the dummy electrode DME and the first gate electrode G1 overlapping each other.

The second initialization line VIL2 may extend in the second direction DR2. The second initialization line VIL2 may be connected to the seventh transistor T7. This structure will be described below with reference to FIG. 10D.

Hereinafter, symbols for the dummy electrode DME and the capacitor Cst are omitted in the drawings.

Referring to FIGS. 5, 10B, 10C, and 10D, a first connection pattern CNP1 may be disposed on the second gate pattern GPT2. The first connection pattern CNP1 may include a plurality of first connection electrodes CNE1 and CNE1_1 to CNE1_7. The first connection pattern CNP1 may be defined as a first conductive pattern.

The first connection electrode CNE1 may be the first connection electrode CNE1 illustrated in FIG. 9. The first connection electrodes CNE1_1 to CNE1_7 may be disposed on or at the same layer as the first connection electrode CNE1. The first connection electrodes CNE1_1 to CNE1_7 may be formed by being concurrently (e.g., simultaneously) patterned with the same material as the first connection electrode CNE1.

A plurality of first contact holes CH1 and CH1_1 to CH1_12 may be defined. The first contact hole CH1 may be the first contact hole CH1 illustrated in FIG. 9. The first contact holes CH1_1 to CH1_12 may be formed to be substantially the same as the first contact hole CH1.

The first connection pattern CNP1 extends in the second direction DR2 and may include a write scan line GWi, a compensation scan line GCi, an initialization scan line Gli, a bias scan line EBi, and a bias line BIS arranged in the first direction DR1. The bias line BIS may receive a bias voltage Vbias.

The first connection electrode CNE1_1 may be connected to the first gate electrode G1 of the first transistor T1, the third drain electrode D3 of the third transistor T3, and the fourth source electrode S4 of the fourth transistor T4 through the first contact holes CH1_1. One first contact hole CH1_1 may overlap the opening OP on the first gate electrode G1.

The write scan line GWi may be connected to the second gate electrode G2 of the second transistor T2 through the first contact hole CH1_2. The first connection electrode CNE1_2 may be connected to the second source electrode S2 of the second transistor T2 through the first contact hole CH1_3.

The compensation scan line GCi may be connected to the third gate electrode G3 of the third transistor T3 through the first contact hole CH1_4. The initialization scan line Gli may be connected to the fourth gate electrode G4 of the fourth transistor T4 through the first contact hole CH1_5.

The first connection electrode CNE1_3 may be connected to the branch BG through the first contact hole CH1_6. Because the branch BG extends from the fourth drain electrode D4 of the fourth transistor T4, the first connection electrode CNE1_3 may be connected to the fourth drain electrode D4 through the first contact hole CH1_6.

The first connection electrode CNE1_4 may be connected to the fifth source electrode S5 and the dummy electrode DME of the fifth transistor T5 through the first contact holes CH1_7. The first connection electrode CNE1_1 may be connected to the first gate electrode G1 of the first transistor T1, the third drain electrode D3 of the third transistor T3, and the fourth source electrode S4 of the fourth transistor T4 through the first contact holes CH1_1. The first connection electrode CNE1 may be connected to the sixth drain electrode D6 of the sixth transistor T6 through the first contact hole CH1.

The bias scan line EBi may be connected to the eighth gate electrode G8 of the eighth transistor T8 and the seventh gate electrode G7 of the seventh transistor T7 through the first contact hole CH1_9. The bias line BIS may be connected to the eighth source electrode S8 of the eighth transistor T8 through the first contact hole CH1_10.

The first connection electrode CNE1_6 may be connected to the second initialization line VIL2 and the seventh drain electrode D7 of the seventh transistor T7 through the first contact holes CH1_11. The first connection electrode CNE1_7 may be connected to the second initialization line VIL2 through the first contact hole CH1_12.

Hereinafter, in FIG. 10E, symbols for the first connection electrodes CNE1 and CNE1_1 to CNE1_7 and the first contact holes CH1 and CH1_1 to CH1_12 illustrated in FIG. 10D are omitted.

Referring to FIGS. 5, 10B, 10C, 10D, and 10E, a second connection pattern CNP2 may be disposed on the first connection pattern CNP1. The second connection pattern CNP2 may include a second connection electrode CNE2, a first power line PL1, a data line DLj, and a first initialization line VIL1. The second connection pattern CNP2 may be defined as a second conductive pattern.

The second connection electrode CNE2 may be the second connection electrode CNE2 illustrated in FIG. 9. The second connection electrode CNE2, the first power line PL1, the data line DLj, and the first initialization line VIL1 may be disposed on or at the same layer. The second connection electrode CNE2, the first power line PL1, the data line DLj, and the first initialization line VIL1 may be formed by being concurrently (e.g., simultaneously) patterned with the same material.

A plurality of second contact holes CH2 and CH2_1 to CH2_3 may be defined. The second contact hole CH2 may be the second contact hole CH2 illustrated in FIG. 9. The second contact holes CH2_1 to CH2_3 may be formed to be substantially the same as the second contact hole CH2.

The first power line PL1, the data line DLj, and the first initialization line VIL1 may extend in the first direction DR1 and may be arranged in the second direction DR2. The second connection electrode CNE2 may be disposed between the first power line PL1 and the data line DLj.

The second connection electrode CNE2 may be connected to the first connection electrode CNE1 through the second contact hole CH2. The second connection electrode CNE2 may be connected to the aforementioned first electrode AE through the third contact hole CH3.

The first power line PL1 may be connected to the first connection electrode CNE1_4 through the second contact hole CH2_1. The first power line PL1 may be connected to the fifth source electrode S5 and the dummy electrode DME of the fifth transistor T5 through the first connection electrode CNE1_4.

The data line DLj may be connected to the first connection electrode CNE1_2 through the second contact hole CH2_2. The data line DLj may be connected to the second source electrode S2 of the second transistor T2 through the first connection electrode CNE1_2.

The first initialization line VIL1 may be connected to the first connection electrode CNE1_3 through the second contact hole CH2_3. The first initialization line VIL1 may be connected to the branch BG through the first connection electrode CNE1_3 to be connected to the fourth transistor T4.

Figure 11:
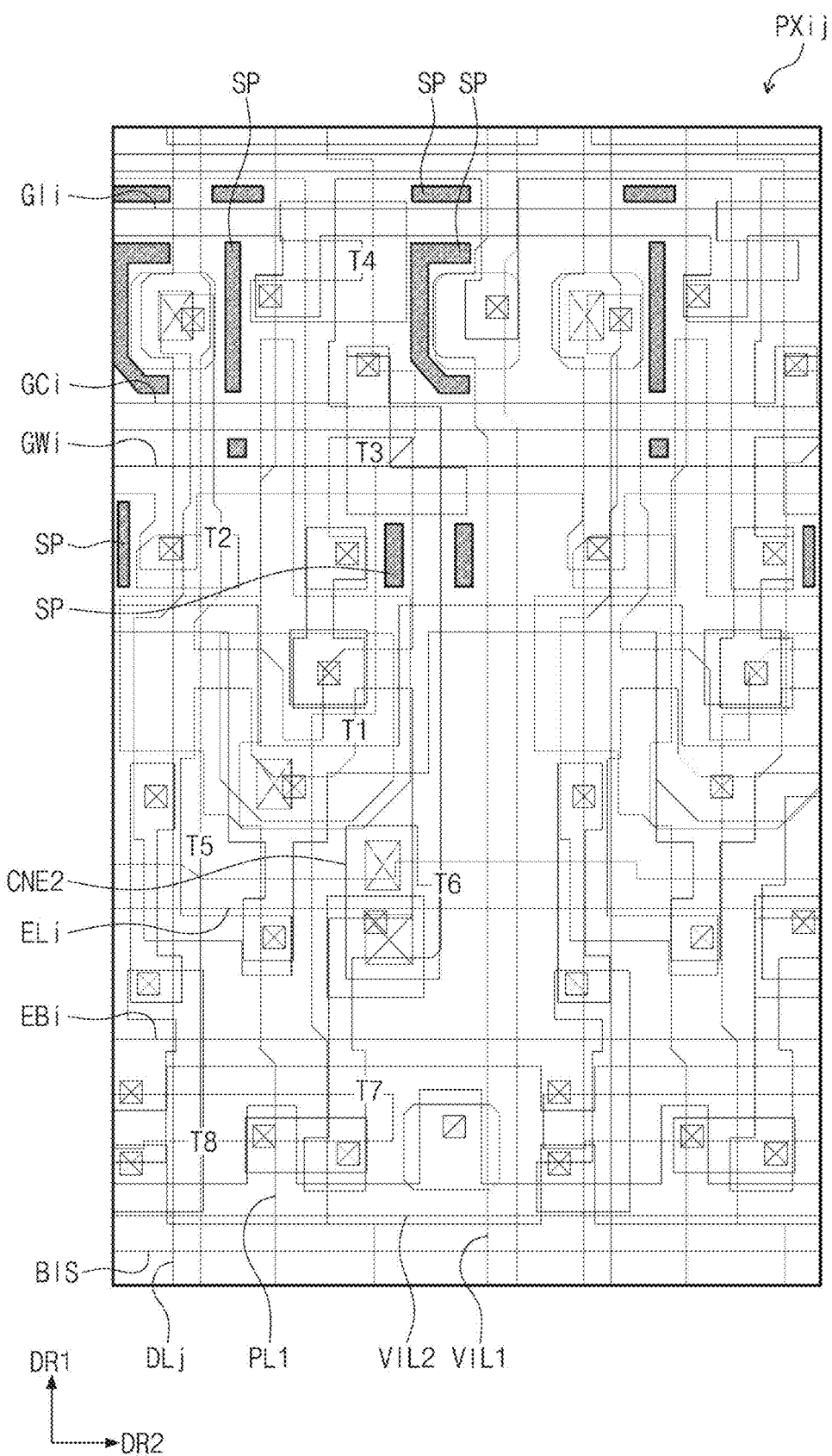
FIG. 11 is a view illustrating light blocking patterns formed in portions adjacent to third and fourth transistors in the plan view of FIG. 10E.

FIG. 11 is a view illustrating light blocking patterns formed in portions adjacent to third and fourth transistors in the plan view of FIG. 10E.

Hereinafter, in the drawings, for convenience of description, symbols of the second contact holes CH2 and CH2_1 to CH2_3 are omitted.

Referring to FIG. 11, when viewed in a plan view, light blocking patterns SP may be disposed around the third and fourth transistors T3 and T4. When viewed in a plan view, the light blocking patterns SP may not overlap (e.g., may not overlap in a thickness direction of the display device DD) the third and fourth transistors T3 and T4 but may be adjacent to the third and fourth transistors T3 and T4. When viewed in a plan view, the light blocking patterns SP may be disposed to be around (e.g., surround) the third and fourth transistors T3 and T4. The cross-sectional structure of the light blocking patterns SP will be described in more detail below.

The light blocking patterns SP may not overlap (e.g., may not overlap in the thickness direction of the display device DD) the semiconductor pattern SMP, the first and second gate patterns GPT1 and GPT2, and the first and second connection patterns CNP1 and CNP2. Accordingly, the light blocking patterns SP may not overlap (e.g., may not overlap in the thickness direction of the display device DD) the first and second conductive patterns defined by the source electrodes S1 to S8, the drain electrodes D1 to D8, the active areas A1 to A8, the gate electrodes G1 to G8, and the first and second connection patterns CNP1 and CNP2.

Figure 12:
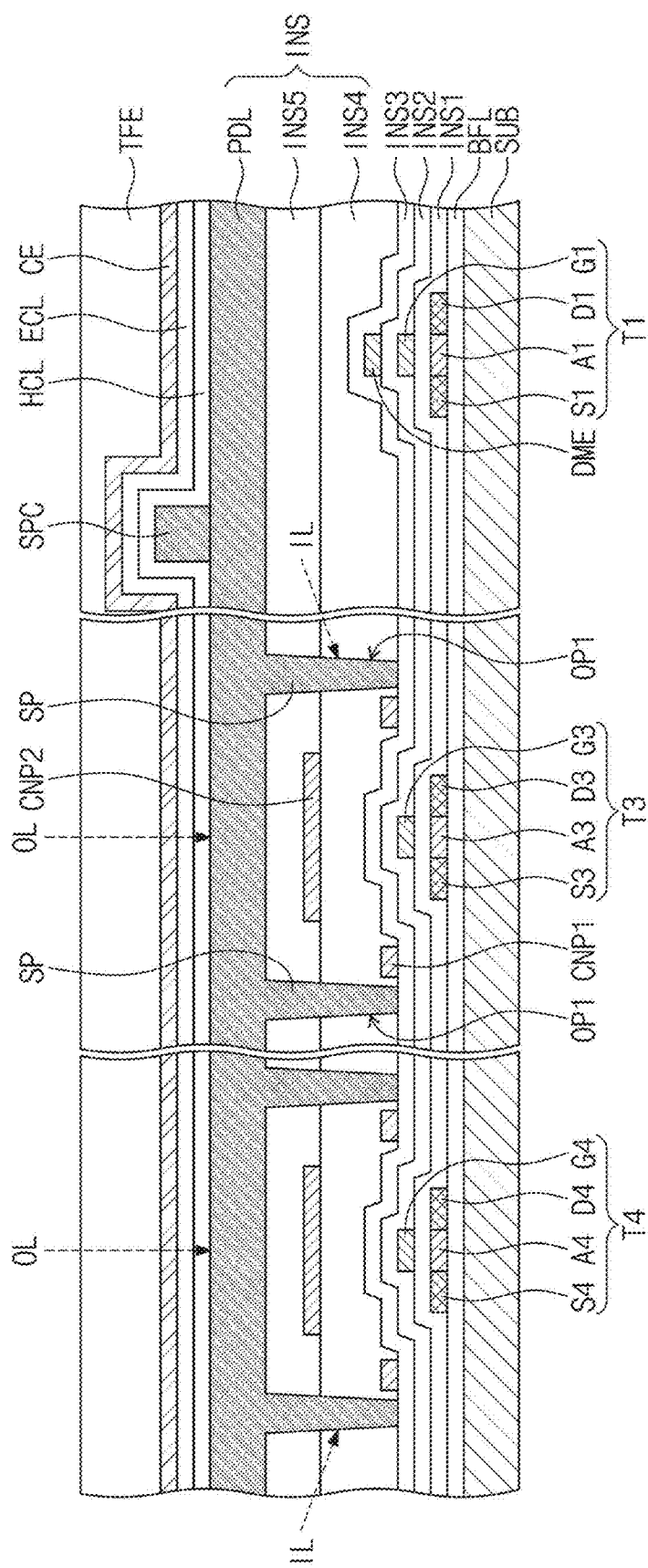
FIG. 12 is a diagram illustrating a cross-sectional structure of the first, third, and fourth transistors and light blocking patterns shown in FIG. 11.

FIG. 12 is a diagram illustrating a cross-sectional structure of the first, third, and fourth transistors and light blocking patterns shown in FIG. 11.

Referring to FIG. 12, the fourth insulating layer INS4, the fifth insulating layer INS5, and the pixel defining film PDL may be defined as the insulating layer INS. The insulating layer INS may be disposed on the first, third, and fourth transistors T1, T3, and T4. In one or more embodiments, the insulating layer INS may be disposed on the other transistors T2 and T5 to T8.

A first connection pattern CNP1 (or a first conductive pattern) may be disposed on the third insulating layer INS3 (or the interlayer insulating layer). The fourth insulating layer INS4 (or the first planarization insulating layer) may be disposed on the third insulating layer INS3 to cover the first connection pattern CNP1. The second connection pattern CNP2 (or the second conductive pattern) may be disposed on the fourth insulating layer INS4 (or the first planarization insulating layer). The fifth insulating layer INS5 (or the second planarization insulating layer) may be disposed on the fourth insulating layer INS4 to cover the second connection pattern CNP2.

A spacer SPC may be disposed on the pixel defining film PDL. In one or more embodiments, a plurality of spacers SPC may be provided on the pixel defining film PDL. In manufacturing the display device DD, a mask in which an opening through which a deposition material for forming the light emitting layer EML is defined may be used. The mask may be disposed on the spacer SPC and supported by the spacer SPC.

The light blocking patterns SP may be formed to protrude from the insulating layer INS. For example, the light blocking patterns SP may protrude downward from the pixel defining film PDL to be adjacent to the third and fourth transistors T3 and T4. The spacer SPC, the pixel defining film PDL, and the light blocking patterns SP may have a black color to block light.

When viewed in a plan view, the light blocking patterns SP may not overlap (e.g., may not overlap in the thickness direction of the display device DD) the first and second connection patterns CNP1 and CNP2. Also, when viewed from a plane, the light blocking patterns may not overlap (e.g., may not overlap in the thickness direction of the display device DD) the source electrodes S1, S3, and S4, the drain electrodes D1, D3, and D4, the active areas A1, A3, and A4, and the gate electrodes G1, G3, and G4 of the first, third, and fourth transistors T1, T3, and T4. The light blocking patterns SP may protrude from the pixel defining film PDL and may be disposed in the openings OP1 defined in the fourth and fifth insulating layers INS4 and INS5.

Referring to FIG. 5, the third and fourth transistors T3 and T4 may be connected to the control electrode of the first transistor T1 through a node ND. When the leakage current generated in the third and fourth transistors T3 and T4 is increased, the voltage of the control electrode of the first transistor T1 may be greatly changed. In this case, the change in luminance may be large, and the luminance may not be displayed normally (e.g., the luminance may not be at a desired level).

When the display device DD operates at a high frequency, a change in luminance may not be visually recognized because a screen change is rapidly performed. However, when the display device DD operates at a low frequency, a screen display period per frame may be lengthened, and thus screen switching may be performed slowly. Accordingly, such a luminance change may be visually recognized.

Referring to FIG. 12, as the intensity of light provided to the third and fourth transistors T3 and T4 increases, the leakage current generated by the third and fourth transistors T3 and T4 may increase. The light provided to the third and fourth transistors T3 and T4 may include external light OL and internal light IL. The external light OL may be provided from the outside of the display device DD toward the third and fourth transistors T3 and T4. The internal light IL is light generated by the light emitting element OLED and is not emitted to the outside. The internal light IL may travel inside the display device DD and may be provided toward the third and fourth transistors T3 and T4.

As the intensity of light increases, leakage currents generated in the third and fourth transistors T3 and T4 may increase. Therefore, when the display device DD displays high luminance, because the intensity of light generated by the light emitting element OLED increases, a leakage current generated in the third and fourth transistors T3 and T4 may increase. As the leakage current of the third and fourth transistors T3 and T4 increases, the potential of the control electrode of the first transistor T1 may be changed more greatly (i.e., changed to a greater degree), so that the luminance change may be increased at high luminance.

In one or more embodiments of the present disclosure, the external light OL provided toward the third and fourth transistors T3 and T4 may be blocked by the pixel defining film PDL. The internal light IL provided toward the third and fourth transistors T3 and T4 may be blocked by the light blocking patterns SP. Accordingly, leakage currents of the third and fourth transistors T3 and T4 that may be generated by the external light OL and the internal light IL are reduced, so that a luminance change at high luminance may be reduced.

Figure 13:
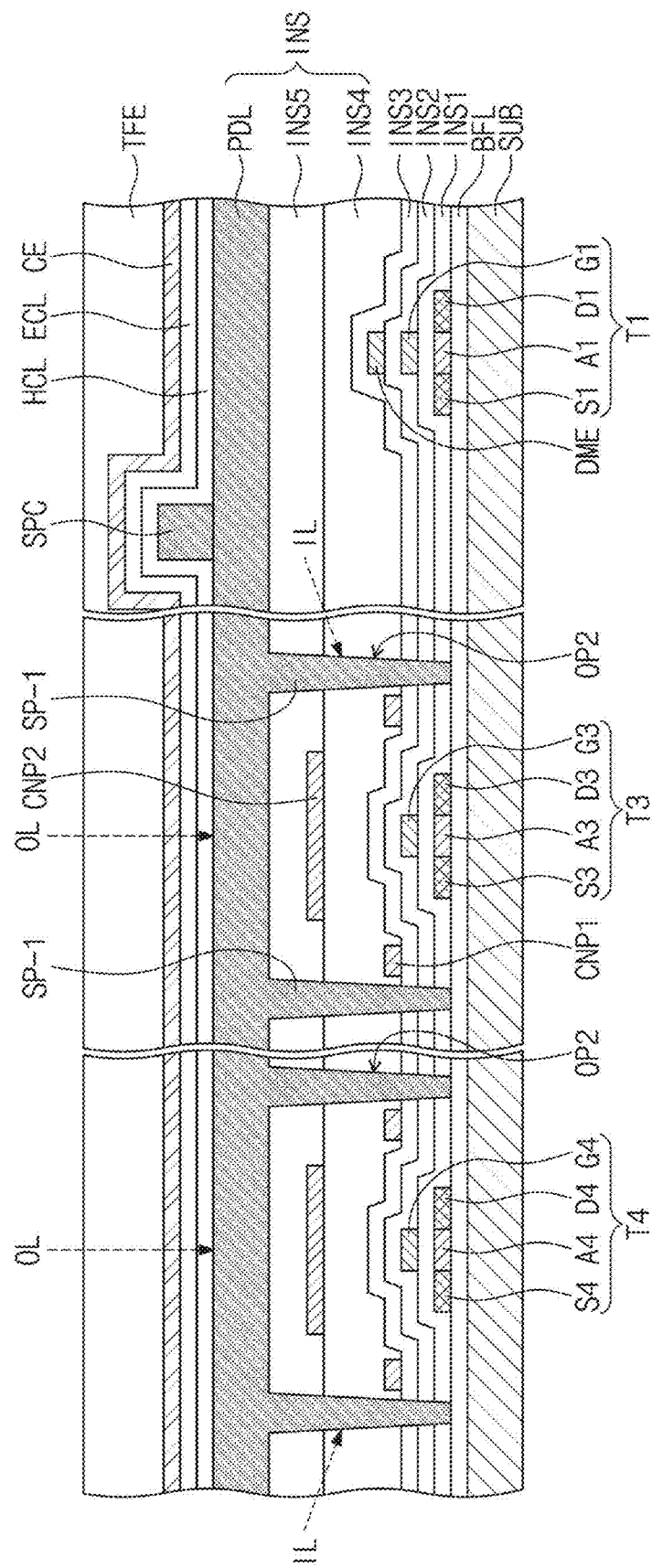
FIG. 13 is a diagram illustrating the light blocking patterns shown in FIG. 11 according to one or more embodiments of the present disclosure.

FIG. 13 is a diagram illustrating the light blocking patterns shown in FIG. 11 according to one or more embodiments of the present disclosure.

Referring to FIG. 13, the light blocking patterns SP-1 may protrude to various suitable depths. For example, as shown in FIG. 13, the light blocking patterns SP-1 may protrude from the pixel defining film PDL and may be disposed in the openings OP2 defined in the first to fifth insulating layers INS1 to INS5.

Figure 14A:
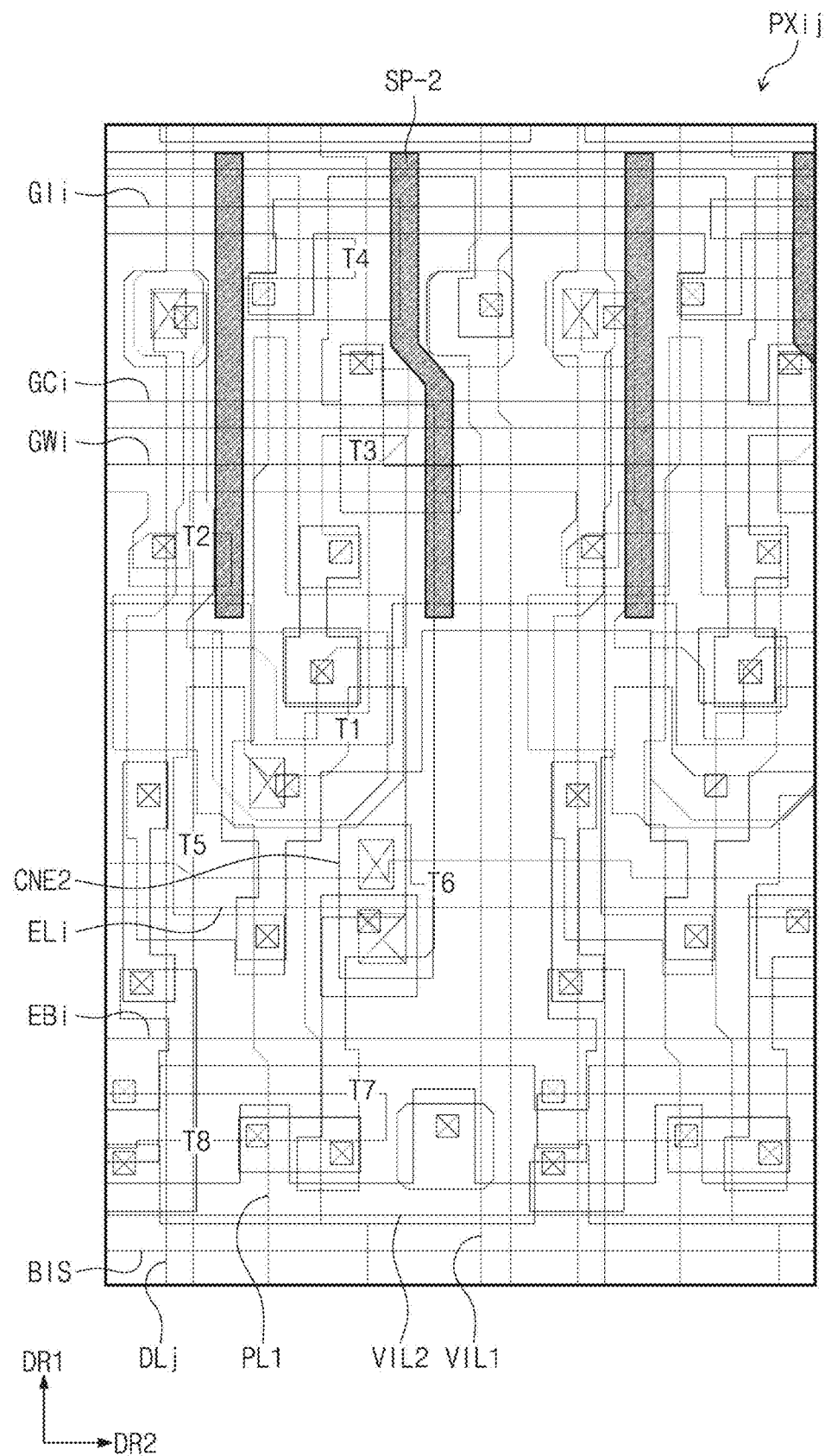
FIG. 14A is a view showing light blocking patterns in the plan view shown in FIG. 10E according to one or more embodiments of the present disclosure.
Figure 14B:
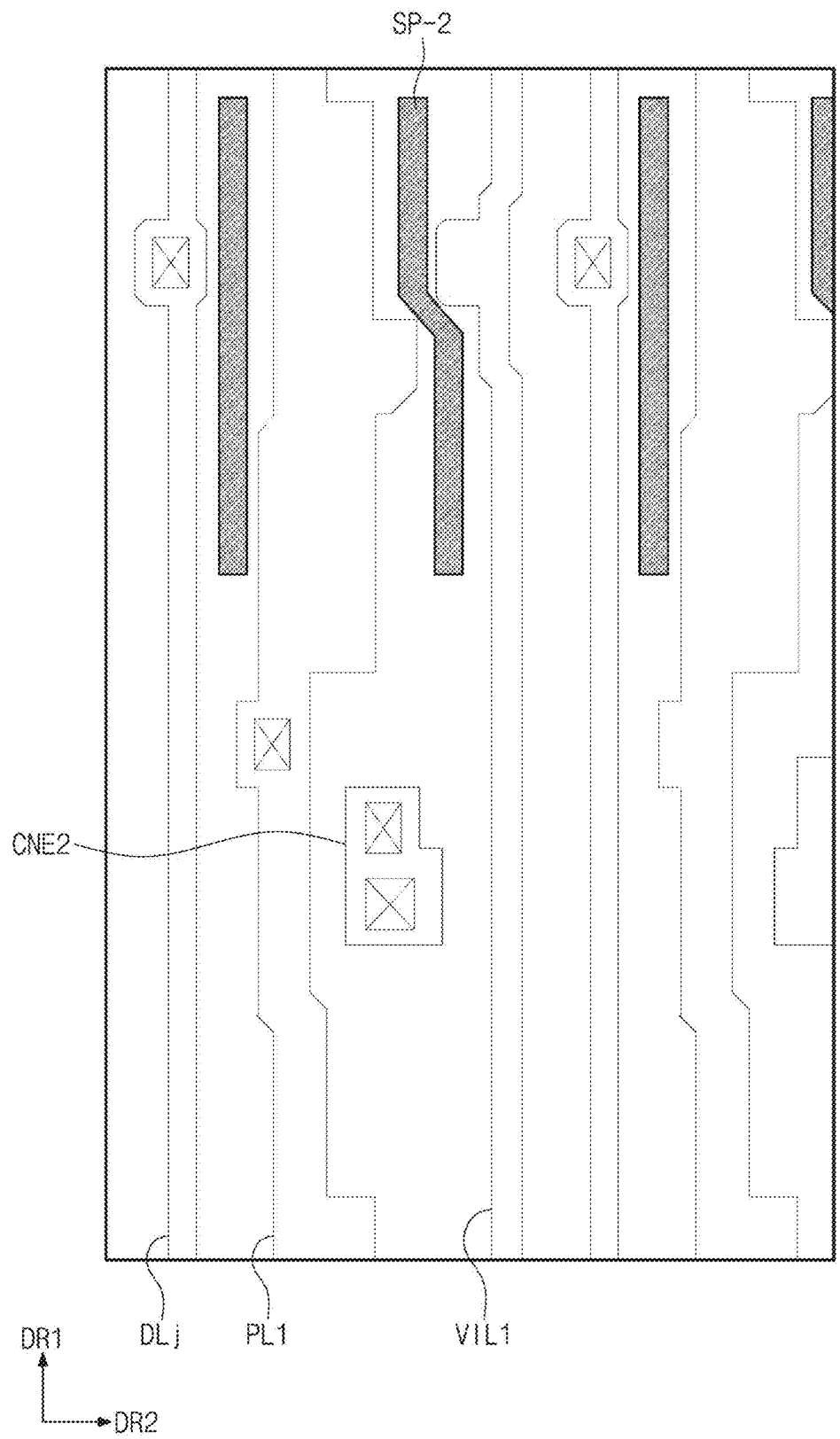
FIG. 14B is a diagram illustrating only the second connection pattern and light blocking patterns in FIG. 14A.

FIG. 14A is a view showing light blocking patterns in the plan view shown in FIG. 10E according to one or more embodiments of the present disclosure. FIG. 14B is a diagram illustrating only the second connection pattern and light blocking patterns in FIG. 14A.

Referring to 14A and 14B, when viewed in a plan view, the light blocking patterns SP-2 may be adjacent to the third and fourth transistors T3 and T4. The light blocking patterns SP-2 may extend in the first direction DR1 and may be arranged in or along the second direction DR2 without overlapping the second connection pattern CNP2 (or the second conductive pattern). In the second direction DR2, the third and fourth transistors T3 and T4 may be disposed between the light blocking patterns SP-2.

Figure 15:
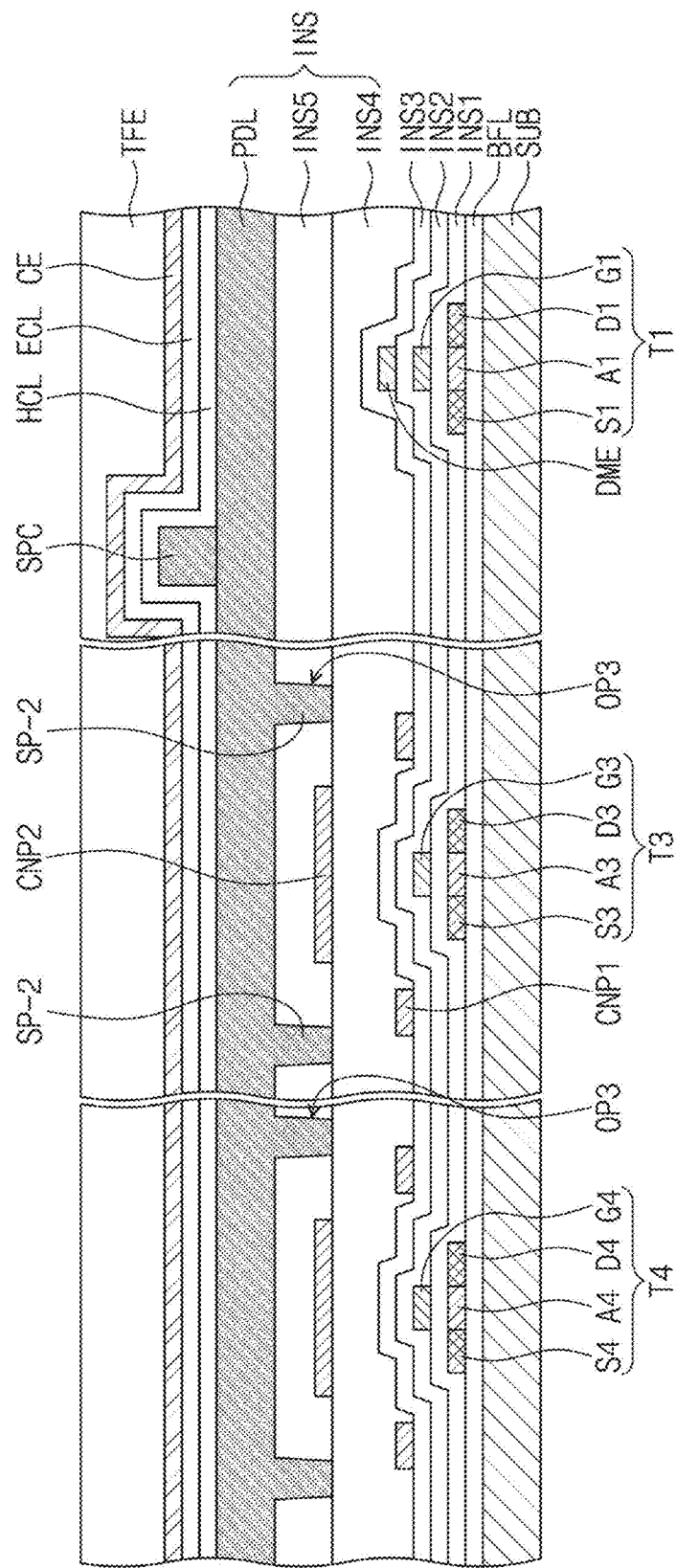
FIG. 15 is a diagram illustrating a cross-sectional structure of the first, third, and fourth transistors and light blocking patterns shown in FIG. 14A.

FIG. 15 is a diagram illustrating a cross-sectional structure of the first, third, and fourth transistors and light blocking patterns shown in FIG. 14A.

Referring to FIG. 15, the light blocking patterns SP-2 may protrude from the pixel defining film PDL, and may be disposed in the openings OP3 defined in the fifth insulating layer INS5 (or the second planarization insulating layer).

Figure 16:
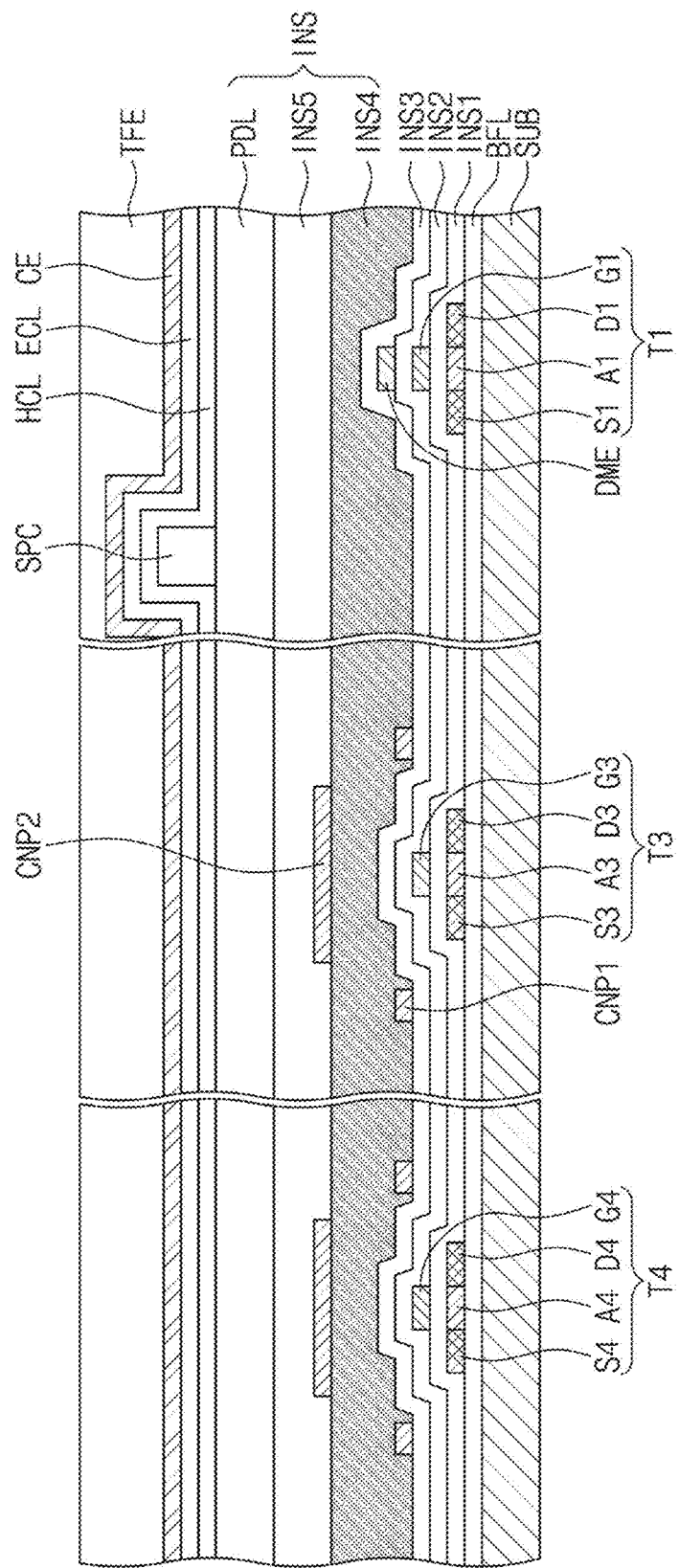
FIGS. 16 and 17 are views showing structures of light blocking patterns according to one or more embodiments of the present disclosure.
Figure 17:
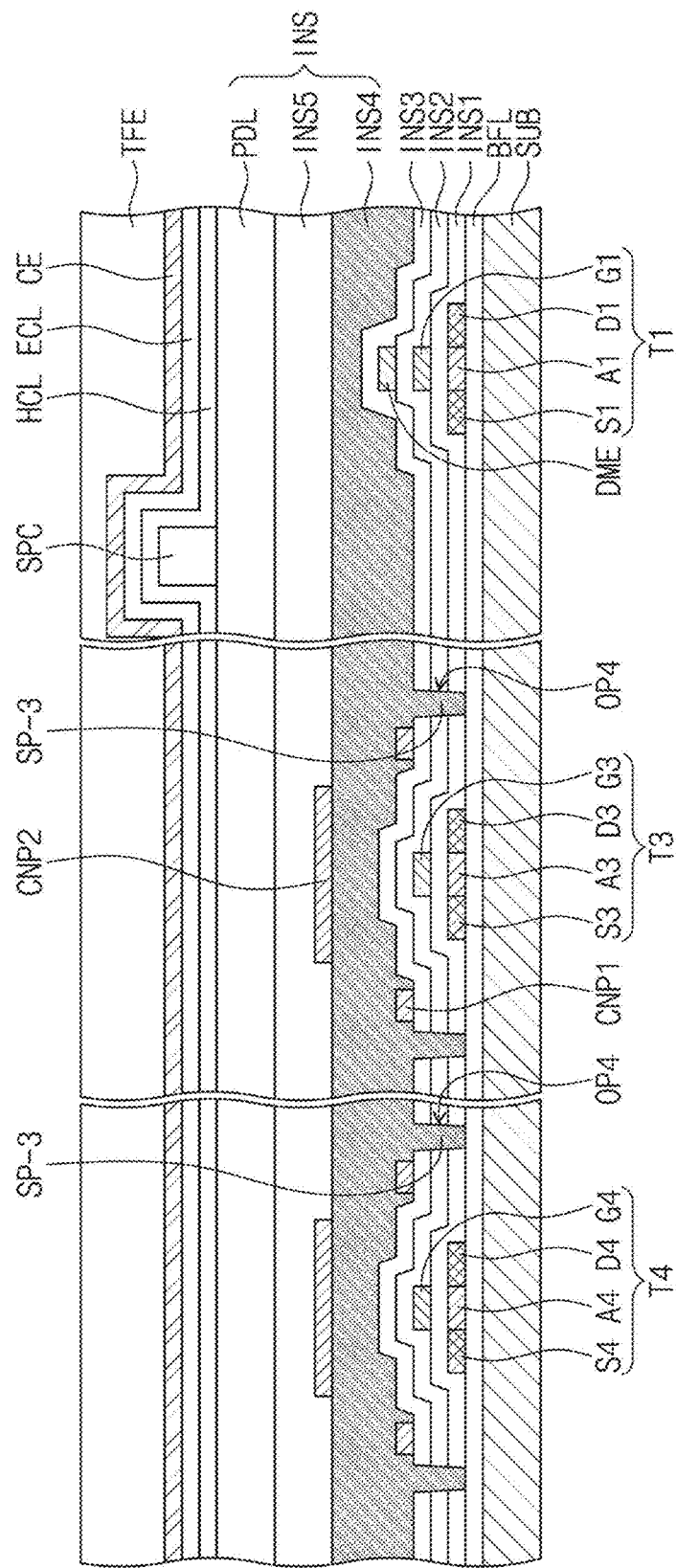

FIGS. 16 and 17 are views showing structures of light blocking patterns according to one or more embodiments of the present disclosure.

Referring to FIG. 16, the fourth insulating layer INS4 (or the first planarization insulating layer) may have a black color to block light. Because separate light blocking patterns are not formed and the fourth insulating layer INS4 adjacent to the third and fourth transistors T3 and T4 has a black color, light provided to the third and fourth transistors T3 and T4 may be blocked.

Referring to FIG. 17, the light blocking patterns SP-3 may protrude from the fourth insulating layer INS4 and may be disposed in the openings OP4 defined in the first to third insulating layers INS1 to INS3.

Figure 18:
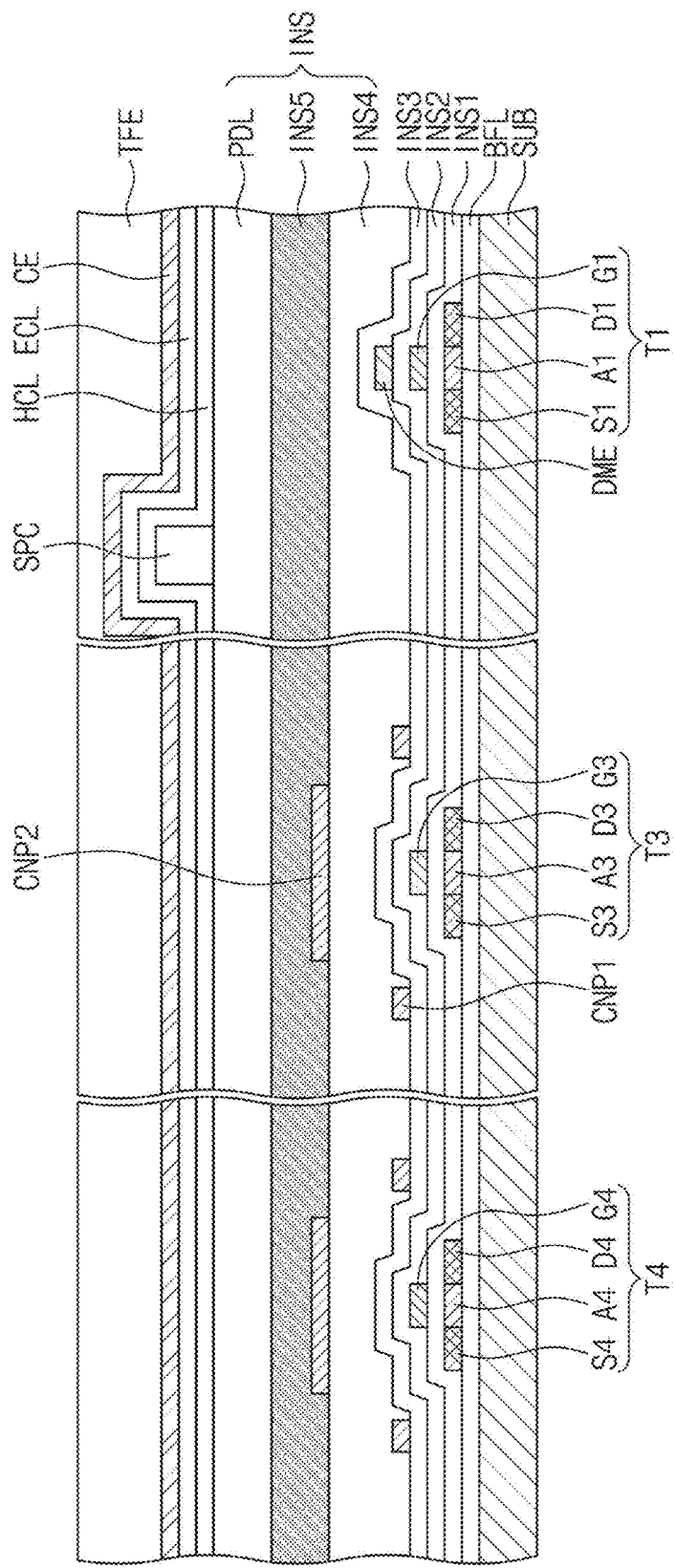
FIGS. 18, 19, and 20 are views showing structures of light blocking patterns according to one or more embodiments of the present disclosure.
Figure 19:
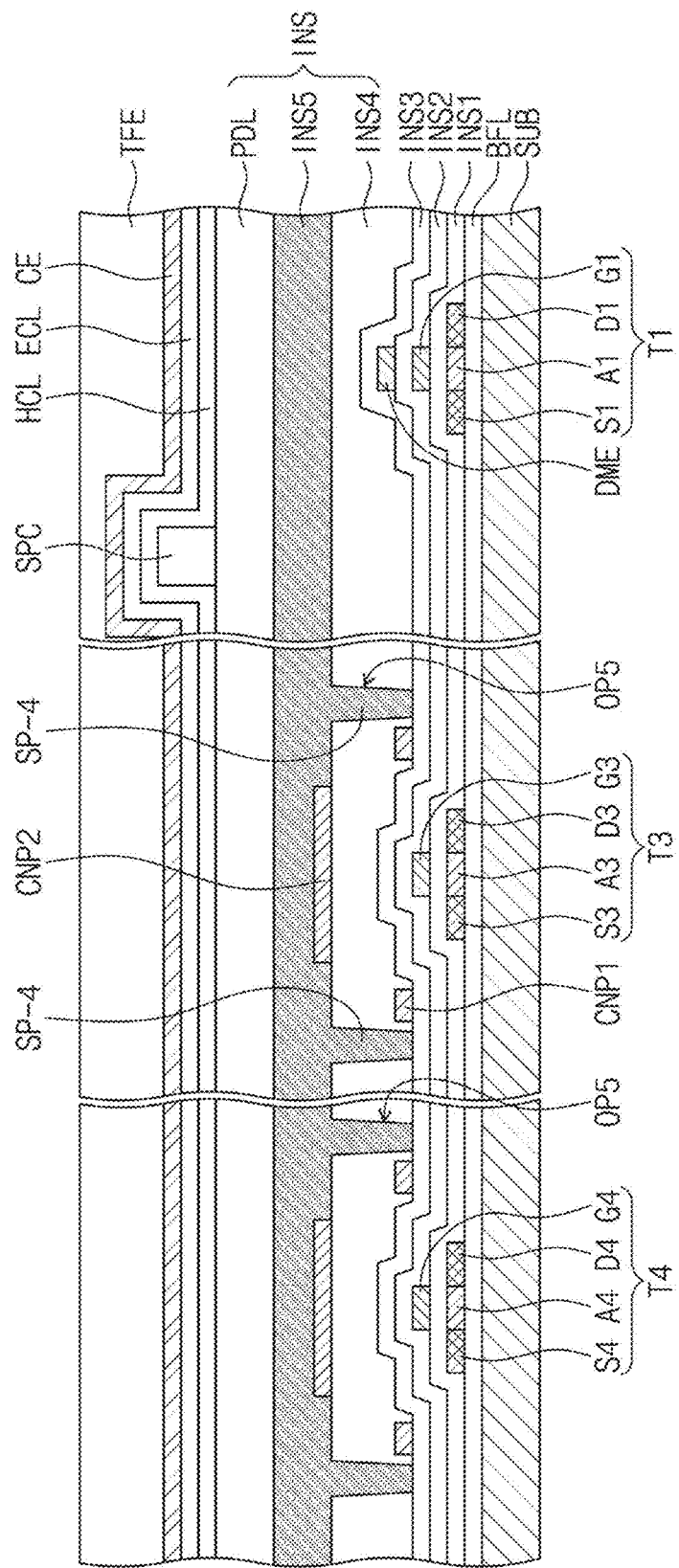
Figure 20:
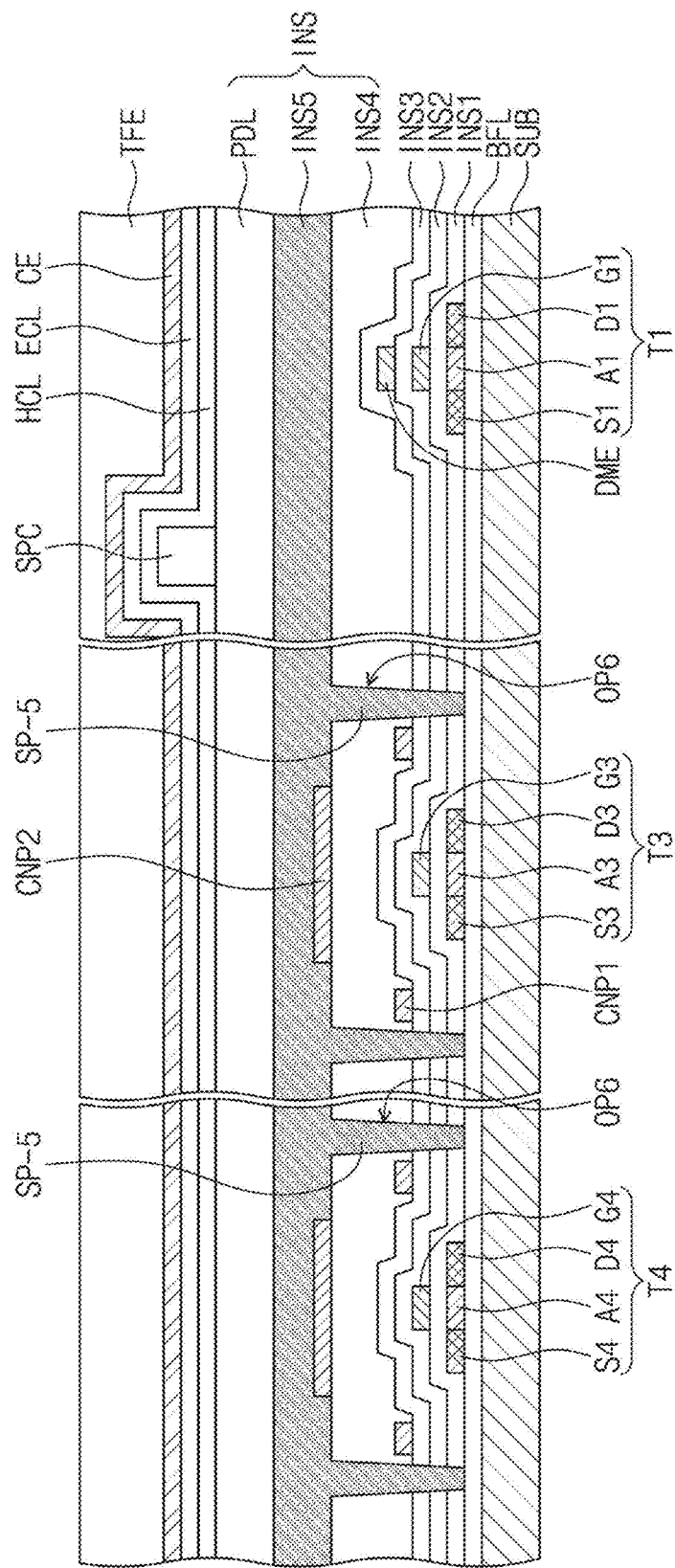

FIGS. 18, 19, and 20 are views showing structures of light blocking patterns according to one or more embodiments of the present disclosure.

Referring to FIG. 18, the fifth insulating layer INS5 (or the second planarization insulating layer) may have a black color to block light. Because separate light blocking patterns are not formed and the fifth insulating layer INS5 adjacent to the third and fourth transistors T3 and T4 has a black color, light provided to the third and fourth transistors T3 and T4 may be blocked.

Referring to FIG. 19, the light blocking patterns SP-4 may protrude from the fifth insulating layer INS5 and may be disposed in the openings OP5 defined in the fourth insulating layer INS4.

Referring to FIG. 20, the light blocking patterns SP-5 may protrude from the fifth insulating layer INS5 and may be disposed in the openings OP6 defined in the first to fourth insulating layers INS1 to INS4.

Figure 21:
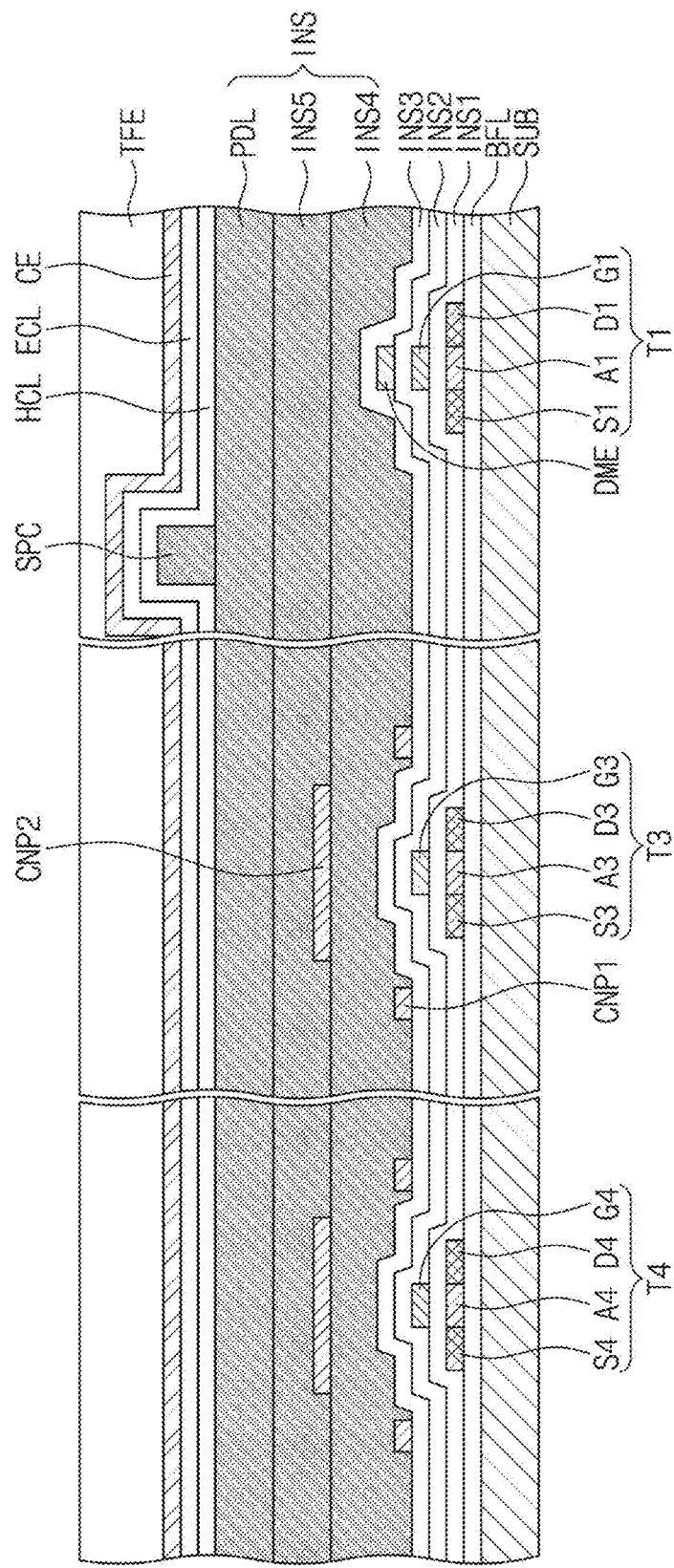
FIGS. 21 and 22 are views showing structures of light blocking patterns according to one or more embodiments of the present disclosure.
Figure 22:
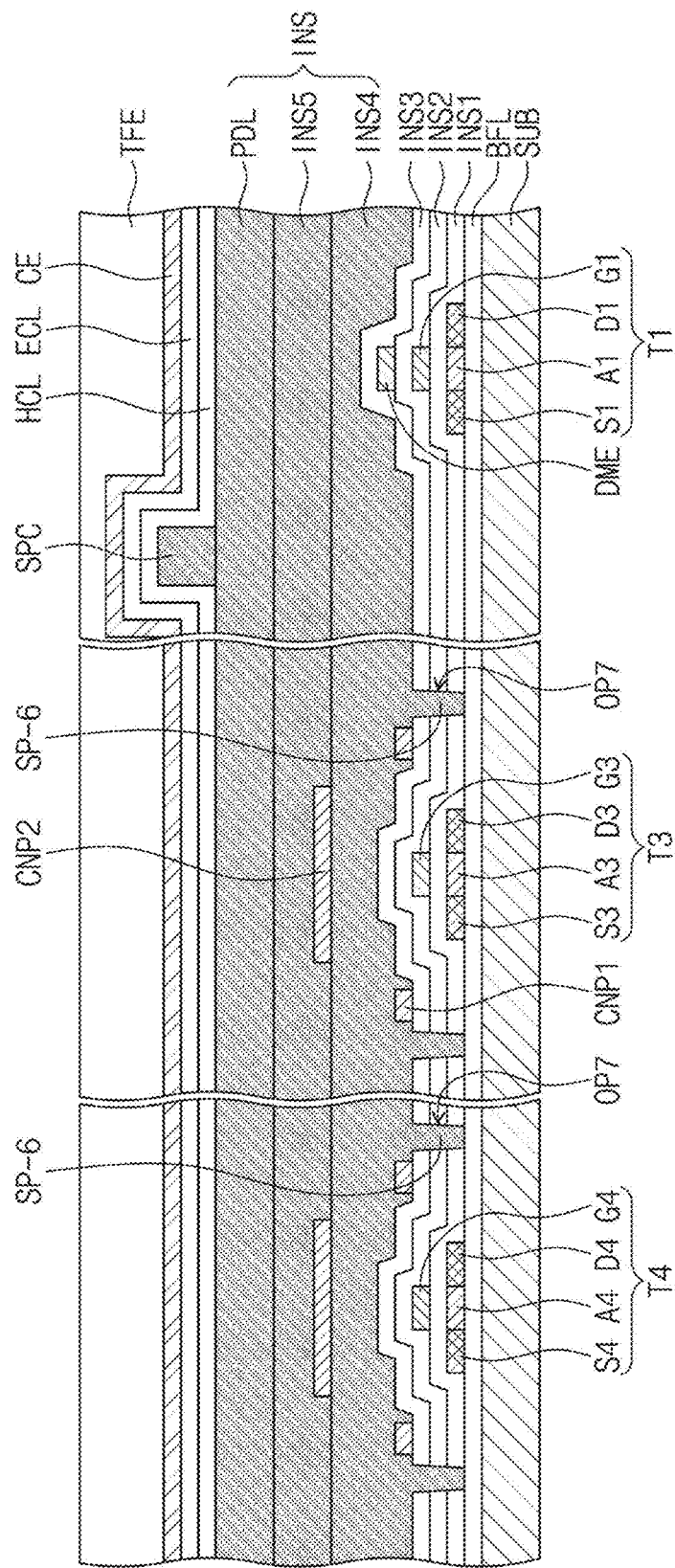

FIGS. 21 and 22 are views showing structures of light blocking patterns according to one or more embodiments of the present disclosure.

Referring to FIG. 21, the spacer SPC, the pixel defining film PDL, and the fourth and fifth insulating layers INS4 and INS5 may have a black color to block light. As separate light blocking patterns are not formed and the spacer SPC, the pixel defining film PDL, and the fourth and fifth insulating layers INS4 and INS5 have a black color, light provided to the third and fourth transistors T3 and T4 may be blocked.

Referring to FIG. 22, the spacer SPC, the pixel defining film PDL, the light blocking patterns SP-6, and the fourth and fifth insulating layers INS4 and INS5 may have a black color to block light. The light blocking patterns SP-6 may protrude from the fourth insulating layer INS4 and may be disposed in the openings OP7 defined in the first to third insulating layers INS1 to INS3.

Figure 23:
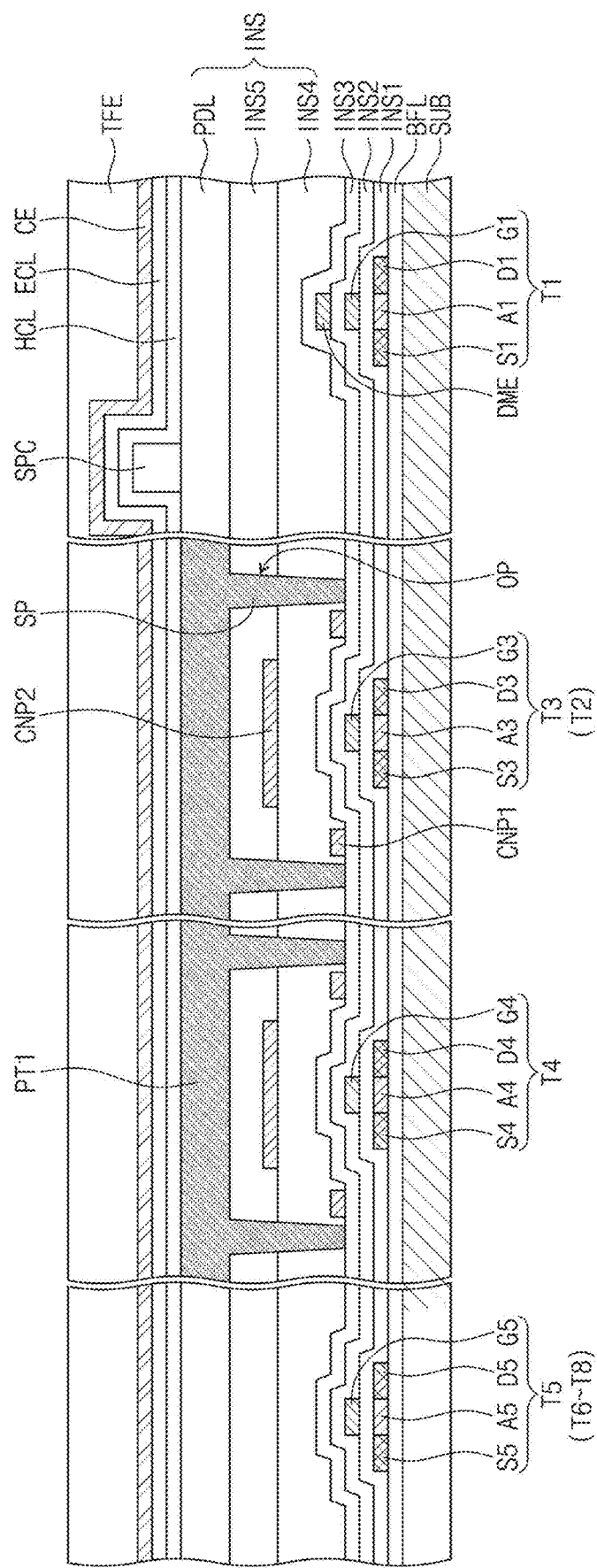
FIG. 23 is a view showing the structure of light blocking patterns according to one or more embodiments of the present disclosure.

FIG. 23 is a view showing the structure of light blocking patterns according to one or more embodiments of the present disclosure.

Referring to FIG. 23, the first portion PT1 of the pixel defining film PDL disposed on the third and fourth transistors T3 and T4 may have a black color. The light blocking patterns SP may protrude from the first portion PT1. As shown in FIG. 11, because the light blocking patterns SP are also disposed adjacent to the second transistor T2, the first portion PT1 of the pixel defining film PDL disposed on the second transistor T2 may also have a black color.

The second portion PT2 of the pixel defining film PDL disposed on the first transistor T1 may not have a black color. Also, the second portion PT2 of the pixel defining film PDL disposed on the fifth to eighth transistors T5 to T8 may not have a black color. For example, the second portion PT2 may be transparent.

Figure 24:
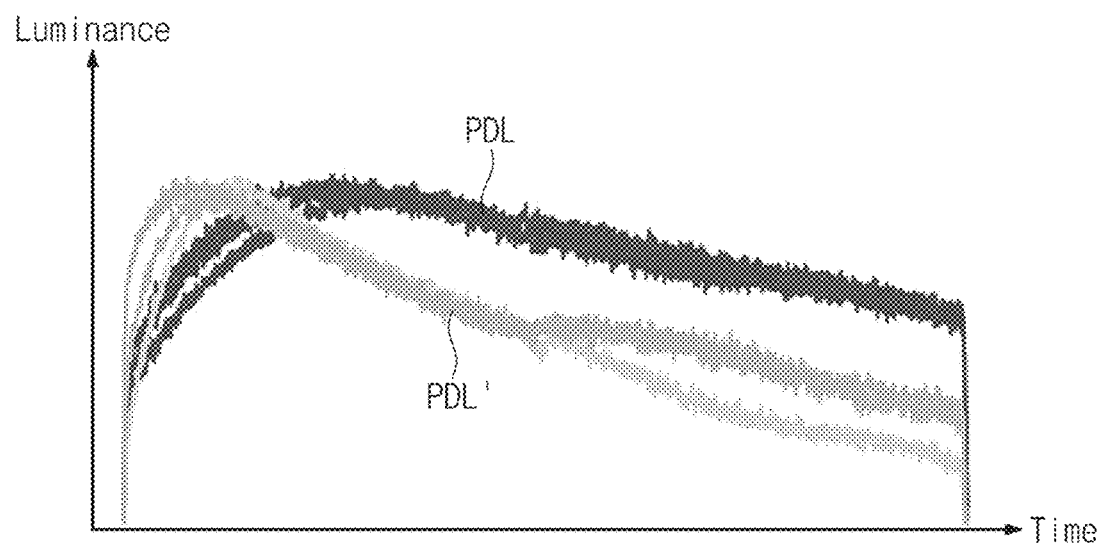
FIG. 24 is a graph illustrating a change in luminance of a display device including a black pixel defining film and light blocking patterns and a change in luminance of a display device including a transparent pixel defining film.
Figure 25:
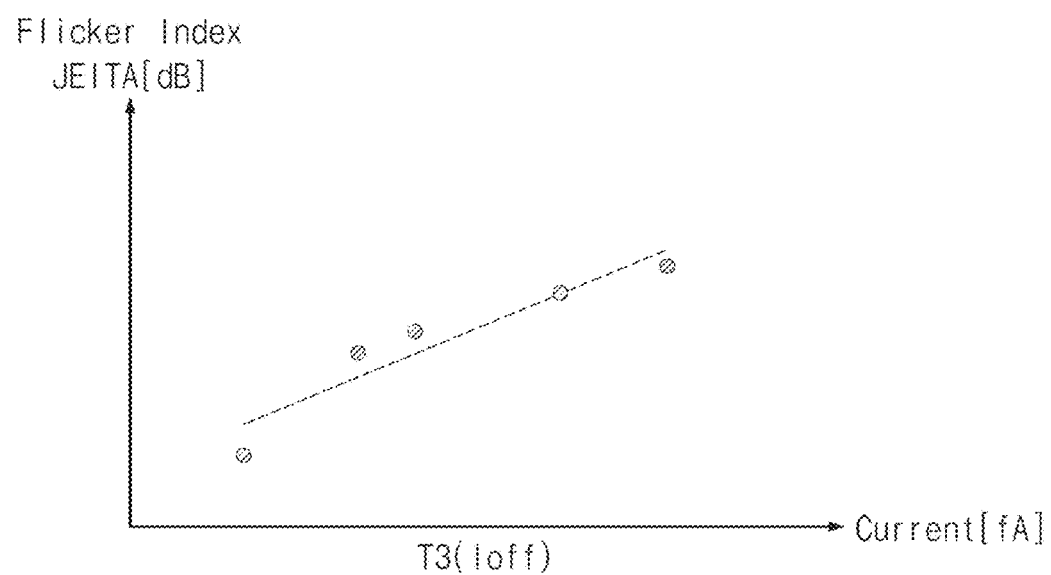
FIG. 25 is a diagram illustrating a flicker index according to leakage current.

FIG. 24 is a graph illustrating a change in luminance of a display device including a black pixel defining film and light blocking patterns and a change in luminance of a display device including a transparent pixel defining film. FIG. 25 is a diagram illustrating a flicker index according to leakage current.

FIG. 24 may be data measured at high luminance in which leakage currents of the third and fourth transistors T3 and T4 may be increased, and the high luminance is set to 400 nits. In FIG. 24, the horizontal axis may indicate time, and the vertical axis may indicate luminance. FIG. 24 shows the luminance change according to the leakage current of the third and fourth transistors T3 and T4 at high luminance. Also, FIG. 24 shows results of a test for a pixel defining film PDL having a black color with light blocking patterns SP and a test for a pixel defining film PDL' having no black color and no light blocking patterns SP (e.g., the pixel defining film PDL' may be transparent and have no light blocking patterns SP).

Test results for three display devices having a pixel defining film PDL are shown together in FIG. 24, and the test results are partially overlapped. Test results for three display devices having a pixel defining film PDL' are shown together in FIG. 24, and the test results are partially overlapped.

In FIG. 25, the horizontal axis may indicate current, and the vertical axis may indicate JEITA (dB) as a flicker index. In FIG. 25, the unit of current is femtoampere (fA), and the current represents the leakage current Ioff of the third transistor T3. As JEITA (dB) is higher, the flicker according to the luminance difference may be more easily recognized by the user. As JEITA (dB) is lower, the flicker according to the luminance difference may not be or may be less easily recognized by the user. FIG. 25 shows flicker indices according to measured values of leakage currents for five transistors T3 as five samples. The test results are shown with 5 dots.

Referring to FIG. 24, the change in luminance of the pixel defining film PDL may be smaller than the change in luminance of the pixel defining film PDL'.

Referring to FIG. 25, as the leakage current decreases, the flicker index may decrease, and as the leakage current increases, the flicker index may increase.

Referring to FIGS. 24 and 25, when a pixel defining film PDL' is used, because the light provided to the third and fourth transistors T3 and T4 is not blocked, a leakage current may increase and a change in luminance may increase.

When a pixel defining film PDL is used, because light provided to the third and fourth transistors T3 and T4 is blocked, a leakage current may be reduced, and a change in luminance may be reduced.

As the leakage current is smaller, the luminance change is smaller, and the flicker index may be lowered. Accordingly, the flickering of the screen may not be or may be less easily recognized by the user. As the leakage current is greater, the change in luminance is greater, which may increase the flicker index. Accordingly, the flickering of the screen may be more easily recognized by the user.

Figure 26:
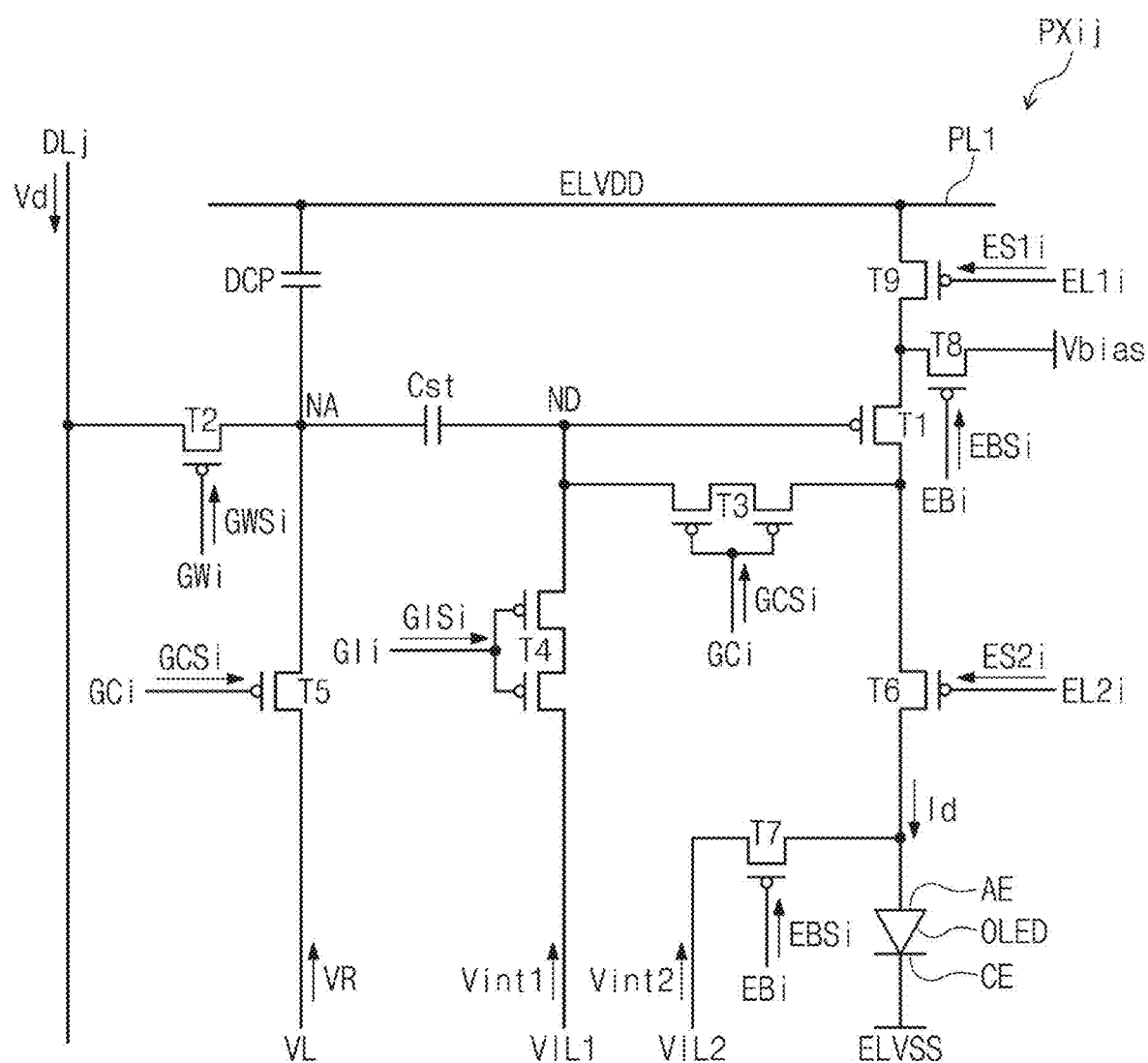
FIG. 26 is a diagram illustrating an equivalent circuit of one pixel illustrated in FIG. 4 according to one or more embodiments.
Figure 27:
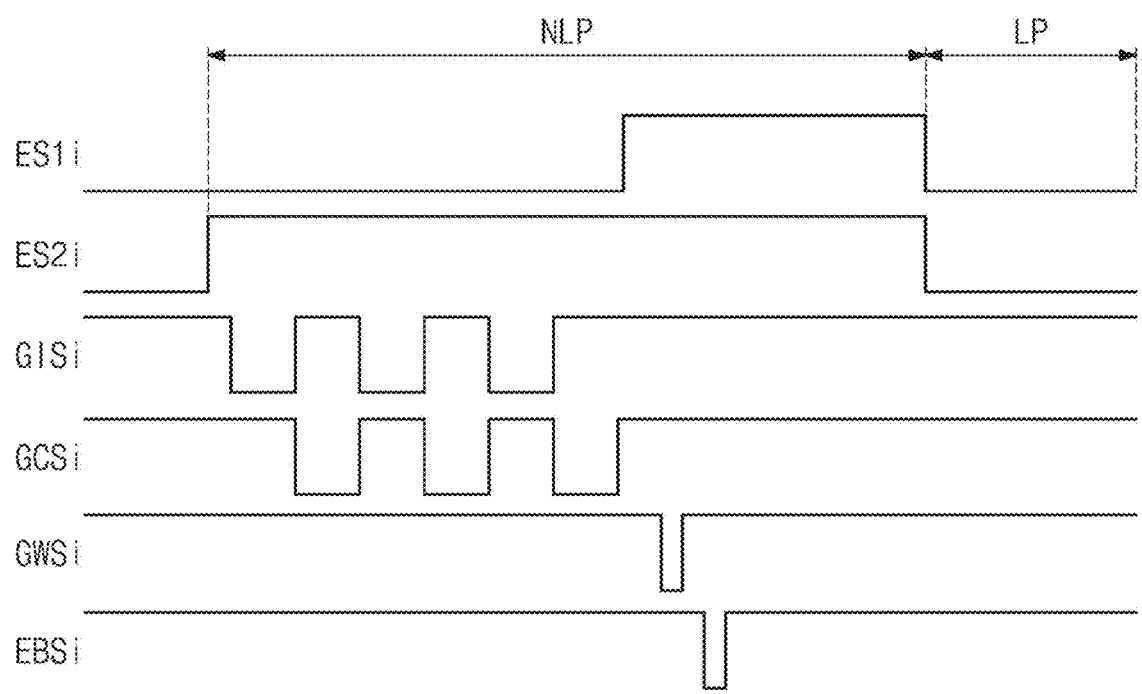
FIG. 27 is a timing diagram of signals for driving the pixel shown in FIG. 26.

FIG. 26 is a diagram illustrating an equivalent circuit of one pixel illustrated in FIG. 4 according to one or more embodiments. FIG. 27 is a timing diagram of signals for driving the pixel shown in FIG. 26.

Hereinafter, in FIG. 26, a structure similar to the structure shown in FIG. 5 will be briefly described.

Referring to FIG. 26, the pixel PXij may include a light emitting element OLED, first to ninth transistors T1 to T9, a capacitor Cst, and a dummy capacitor DCP. The transistors T1 to T9 may include PMOS transistors. The pixel PXij may be connected to an i-th write scan line GWi, an i-th compensation scan line GCi, an i-th initialization scan line Gli, an i-th bias scan line EBi, and an i-th first emission line EL1i, an i-th second emission line EL2i, and a j-th data line DLj.

The i-th write scan line GWi, the i-th compensation scan line GCi, the i-th initialization scan line Gli, and the i-th bias scan line EBi may be the components of the scan lines SL1 to SLm. The i-th first emission line EL1i and the i-th second emission line EL2i may be the above-described emission lines EU to ELm.

The i-th write scan line GWi may receive the i-th write scan signal GWSi, and the i-th compensation scan line GCi may receive the i-th compensation scan signal GCSi. The i-th initialization scan line Gli may receive the i-th initialization scan signal GISi, and the i-th bias scan line EBi may receive the i-th bias scan signal EBSi. The i-th first emission line EL1i and the i-th second emission line EL2i may receive an i-th first emission signal ES1i and an i-th second emission signal ES2i, respectively.

Each of the transistors T1 to T9 may include a source electrode, a drain electrode, and a gate electrode. Hereinafter, for convenience in FIG. 26, one of the source electrode and the drain electrode is defined as the first electrode, the other is defined as the second electrode, and the gate electrode is defined as the control electrode.

The light emitting element OLED may include an anode AE and a cathode CE. The anode AE may receive the first voltage ELVDD through the sixth, first, and ninth transistors T6, T1, and T9. The cathode CE may receive the second voltage ELVSS.

The first transistor T1 may include a first electrode connected to the first power line PL1 through the ninth transistor T9, a second electrode connected to the anode AE through the sixth transistor T6, and a control electrode connected to the node ND. A first electrode of the first transistor T1 may be connected to the ninth transistor T9, and a second electrode of the first transistor T1 may be connected to the sixth transistor T6.

The second transistor T2 may be connected between the first transistor T1 and the data line DLj. Specifically, the second transistor T2 may be connected between the control electrode of the first transistor T1 and the data line DLj. The second transistor T2 may include a first electrode connected to the data line DLj, a second electrode connected to the control electrode of the first transistor T1, and a control electrode connected to the i-th write scan line GWi. The second transistor T2 may be connected to the control electrode of the first transistor T1 through a capacitor Cst.

The second transistor T2 may be connected to the control electrode of the first transistor T1 through a capacitor Cst.

The second transistor T2 is turned on by the i-th write scan signal GWSi applied through the i-th write scan line GWi to receive the data voltage Vd through the data line DLj. The data voltage Vd may be provided to the capacitor Cst.

The third transistor T3 may include a first electrode connected to the second electrode of the first transistor T1, a second electrode connected to the node ND, and a control electrode connected to the i-th compensation scan line GCi. The third transistor T3 may be implemented with a dual gate structure. When the third transistor T3 is turned on, the first transistor T1 may be diode-connected.

The fourth transistor T4 may include a first electrode connected to the node ND, a second electrode connected to the first initialization line VIL1, and a control electrode connected to the i-th initialization scan line Gli. The fourth transistor T4 may provide the first initialization voltage Vint1 applied through the first initialization line VIL1 to the node ND. The fourth transistor T4 may be implemented with a dual gate structure.

The fifth transistor T5 may include a first electrode connected to the second electrode of the second transistor T2, a second electrode connected to the reference voltage line VL, and a control electrode connected to the i-th compensation scan line GCi. The fifth transistor T5 is turned on by the i-th compensation scan signal GCSi applied through the i-th compensation scan line GCi to receive the reference voltage VR through the reference voltage line VL.

The sixth transistor T6 may include a first electrode connected to the second electrode of the first transistor T1, a second electrode connected to the anode AE, and a control electrode connected to the i-th second emission line EL2i. The sixth transistor T6 may be turned on by the i-th second emission signal ES2i applied through the i-th second emission line EL2i.

The seventh transistor T7 may include a first electrode connected to the anode AE, a second electrode connected to the second initialization line VIL2, and a control electrode connected to the i-th bias scan line EBi. The seventh transistor T7 is turned on by the i-th bias scan signal EBSi applied through the i-th bias scan line EBi, so that the second initialization voltage Vint2 may be received through the second initialization line VIL2.

The eighth transistor T8 may include a first electrode that receives the bias voltage Vbias, a second electrode connected to the first electrode of the first transistor T1, and a control electrode connected to the i-th bias scan line EBi. The eighth transistor T8 may be turned on by the i-th bias scan signal EBSi and may receive the bias voltage Vbias.

The ninth transistor T9 may include a first electrode receiving the first voltage ELVDD, a second electrode connected to the first electrode of the first transistor T1, and a control electrode connected to an i-th first emission line EL1i. The second electrode of the ninth transistor T9 may be connected to the second electrode of the eighth transistor T8. The ninth transistor T9 may be turned on by the i-th first emission signal ES1i applied through the i-th first emission line EL1i.

The dummy capacitor DCP may include a first electrode connected to the second electrode of the second transistor T2 and a second electrode receiving the first voltage ELVDD.

Hereinafter, activation of each signal indicates a low level in the timing diagram of FIG. 27, and deactivation of each signal indicates a high level in the timing diagram of FIG. 27.

Referring to FIGS. 26 and 27, the i-th first emission signal ES1i may be activated and deactivated during the non-emission period NLP. During the emission period LP, the i-th first emission signal ES1i may be activated. The i-th second emission signal ES2i may be deactivated during the non-emission period NLP and activated during the emission period LP.

The i-th initialization scan signal GISi and the i-th compensation scan signal GCSi may be repeatedly activated during the activation section of the i-th first emission signal ES1i in a non-emission period NLP. The i-th initialization scan signal GISi may be activated first, and the i-th compensation scan signal GCSi may be activated next.

In the non-emission period NLP, during the non-activation section of the i-th first emission signal ES1i, the i-th initialization scan signal GISi and the i-th compensation scan signal GCSi may be deactivated. In the non-activation section of the i-th first emission signal ES1i, the i-th write scan signal GWSi may be activated, and then, the i-th bias scan signal EBSi may be activated.

In the non-emission period NLP, the ninth transistor T9 may be turned on by the i-th first emission signal ES1i so that the first voltage ELVDD may be applied to the first electrode (or source) of the first transistor T1. The fourth transistor T4 may be turned on by the i-th initialization scan signal GISi. The first initialization voltage Vint1 may be provided to the node ND through the fourth transistor T4, and the first transistor T1 may be initialized. As described above, this operation may be defined as an initialization operation.

Then, the i-th compensation scan signal GCSi may be applied to the third transistor T3 to turn on the third transistor T3. The first transistor T1 and the third transistor T3 may be turned on such that the first transistor T1 is diode-connected. In this case, the compensation voltage ELVDD-Vth reduced by the threshold voltage Vth of the first transistor T1 from the first voltage ELVDD may be applied to the control electrode of the first transistor T1. As described above, this operation may be defined as a threshold voltage compensation operation.

The i-th compensation scan signal GCSi may be applied to the fifth transistor T5 to turn on the fifth transistor T5. In this case, the reference voltage VR may be applied to the node NA between the second transistor T2 and the capacitor Cst.

As the i-th initialization scan signal GISi and the i-th compensation scan signal GCSi are repeatedly activated, the initialization and compensation operations may be repeatedly performed. As the initialization operation is repeatedly performed, data written to the node ND in the previous frame is completely removed, so that the first transistor T1 may be completely initialized.

A parasitic capacitor may be present in the third and fourth transistors T3 and T4. The dummy capacitor DCP may have a larger capacity than the parasitic capacitor. In the third and fourth transistors T3 and T4 having a dual gate structure, a floating state is present between the double gates. When the i-th compensation scan signal GCSi and the i-th initialization scan signal GISi are applied to the third and fourth transistors T3 and T4, due to a coupling phenomenon caused by internal parasitic capacitors, gate-source voltages of the third and fourth transistors T3 and T4 may be changed.

A dummy capacitor DCP having a larger capacitance may be connected to the third and fourth transistors T3 and T4 through the node ND. The dummy capacitor DCP having a larger capacitance may suppress variations in gate-source voltage levels of the third and fourth transistors T3 and T4.

Thereafter, the ninth transistor T9 may be turned off by the inactivated i-th first emission signal ES1i, and the activated i-th write scan signal GWSi may be applied to the second transistor T2 to turn on the second transistor T2. The data voltage Vd may be provided to the capacitor Cst through the second transistor T2. In this case, the data voltage Vd is applied to the node NA, and the voltage of the node ND may be ELVDD−Vth+Vd−VR.

Thereafter, the seventh and eighth transistors T7 and T8 may be turned on by the activated i-th bias scan signal EBSi. The second initialization voltage Vint2 may be applied to the anode AE through the seventh transistor T7, and the bias voltage Vbias may be applied to the first electrode of the first transistor T1 through the eighth transistor T8.

Thereafter, the i-th first and second emission signals ES1i and ES2i are applied to the ninth transistor T9 and the sixth transistor T6 during the emission period LP, so that the ninth transistor T9 and the sixth transistor T6 may be turned on. The driving current Id is provided to the light emitting element OLED through the sixth transistor T6 so that the light emitting element OLED may emit light.

The source-gate voltage Vsg of the first transistor T1 may be defined as a voltage difference between the first voltage ELVDD and the voltage ELVDD-Vth+Vd-VR of the node ND. When the source-gate voltage Vsg of the first transistor T1 is substituted in Equation 2 above, the threshold voltage Vth is removed, and the driving current Id may be proportional to the square of a value obtained by subtracting the data voltage Vd from the reference voltage VR. In other words, the driving current Id may be proportional to $(VR-Vd)^2$. Accordingly, the driving current Id may be determined regardless of the threshold voltage Vth of the first transistor T1.

FIGS. 28A to 28E are diagrams illustrating the planar structure of the pixel shown in FIG. 26 in stages.

Figure 28A:
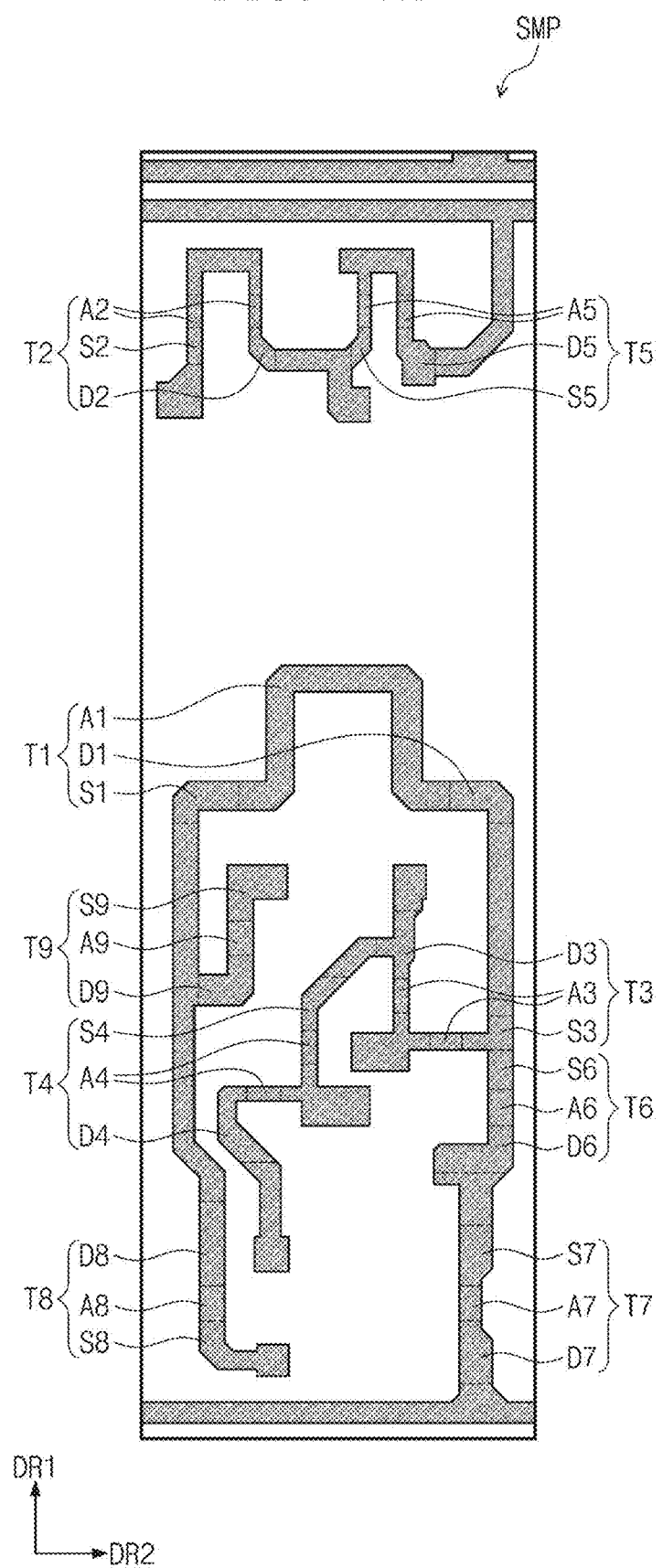
FIGS. 28A to 28E are diagrams illustrating the planar structure of the pixel shown in FIG. 26 in stages.
Figure 28B:
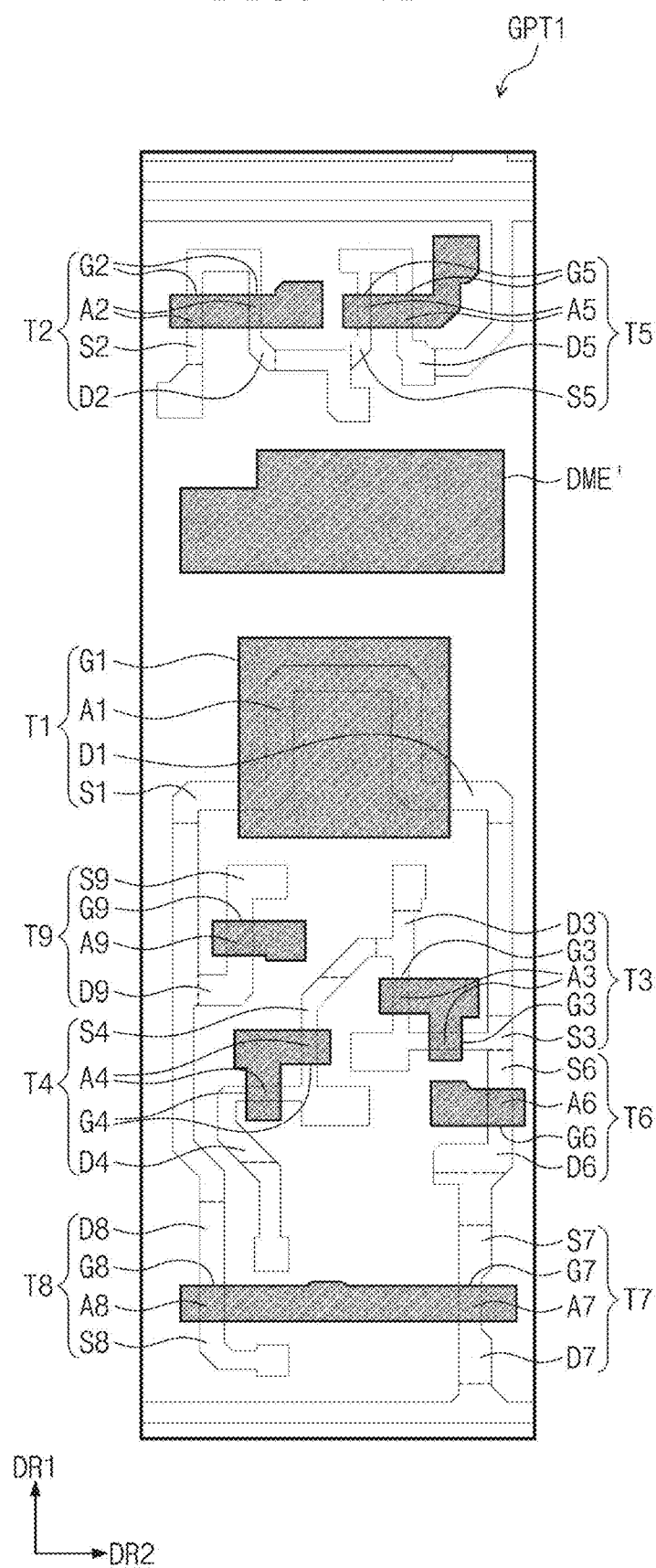
Figure 28C:
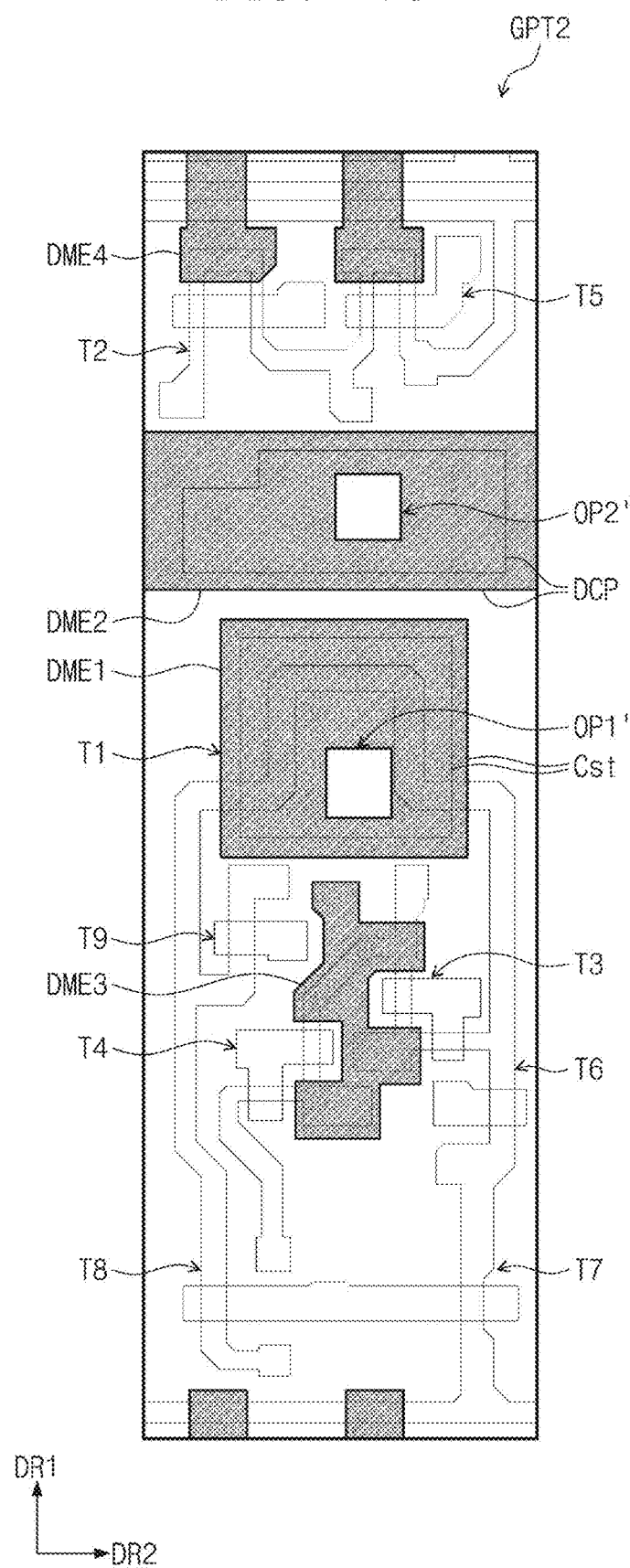
Figure 28D:
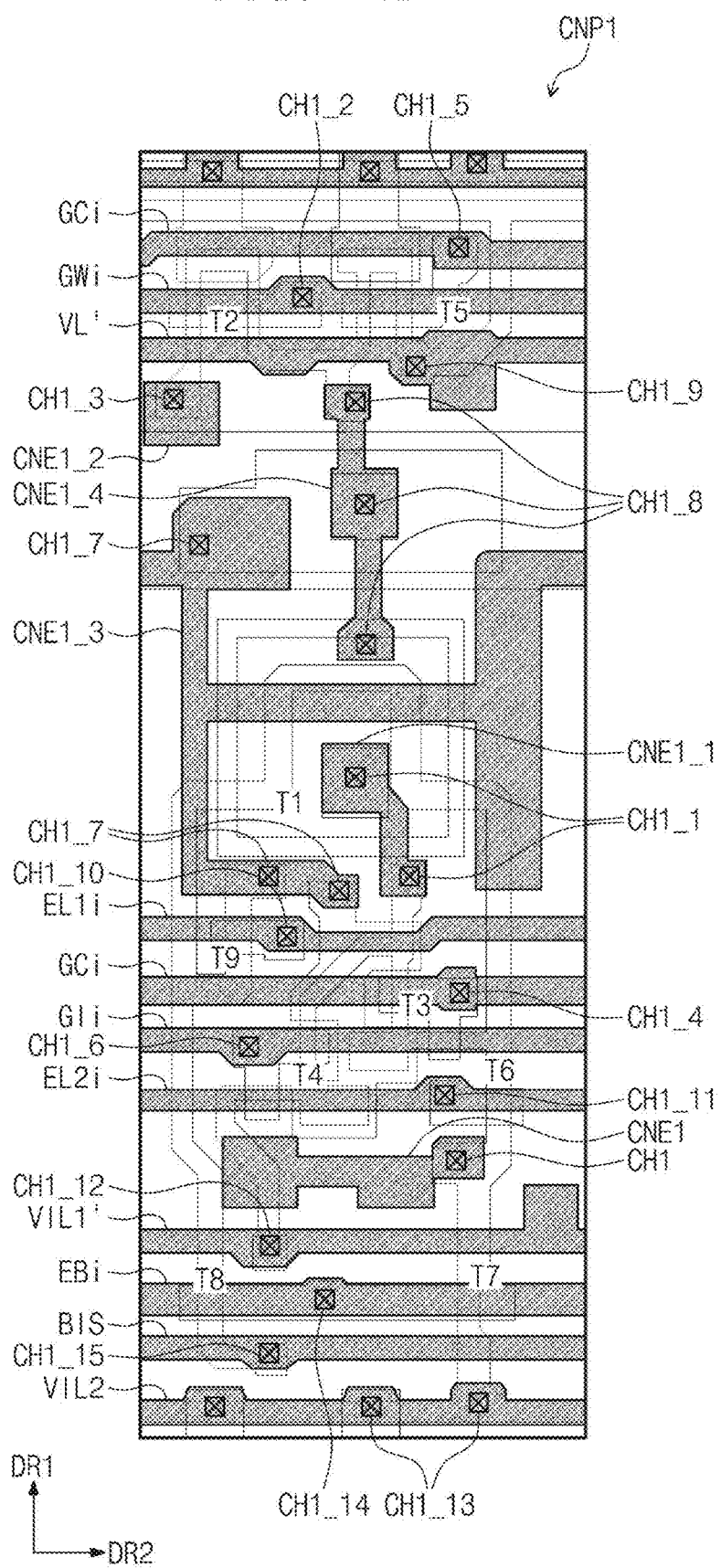
Figure 28E:
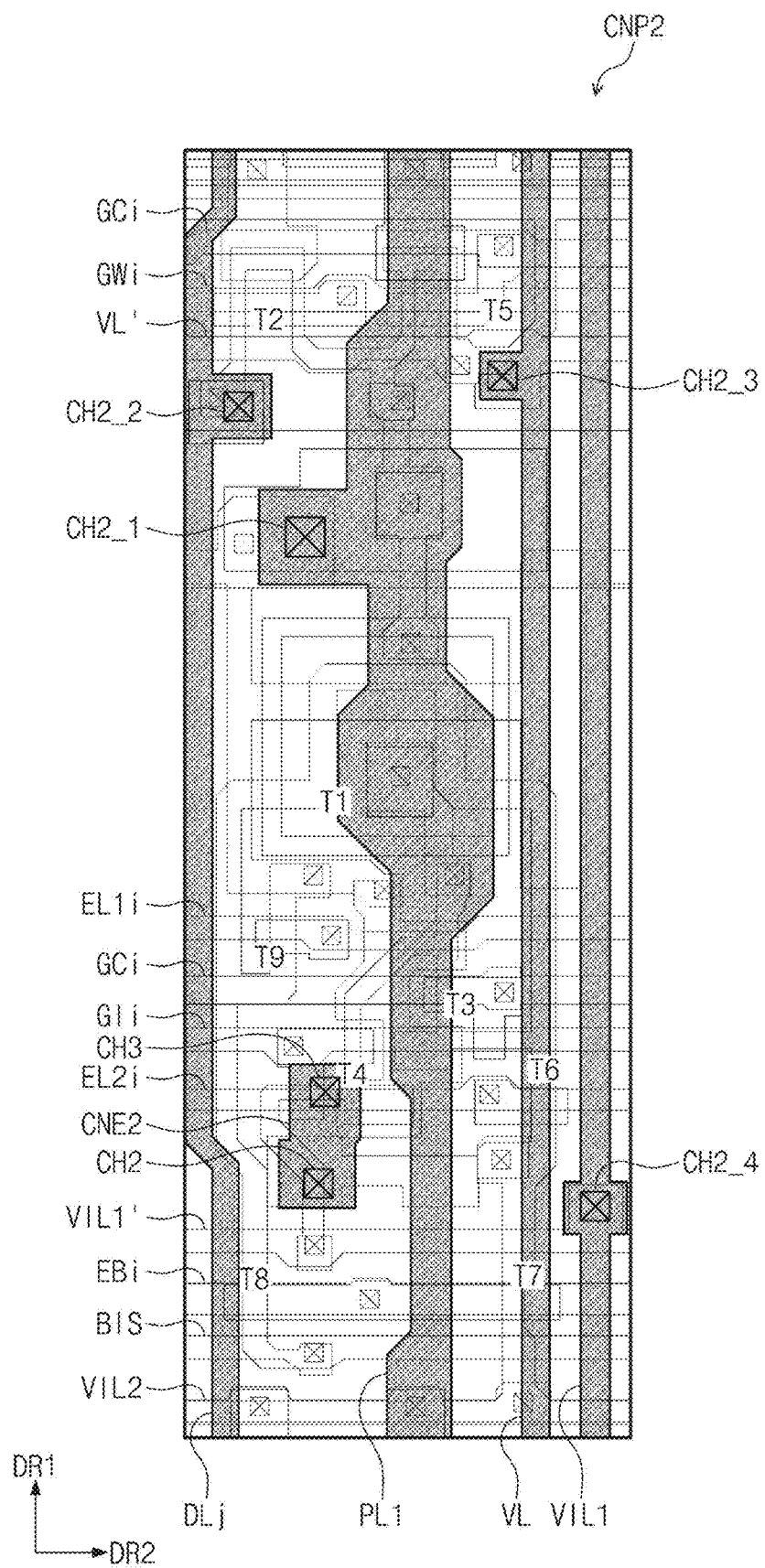

The plan view shown in FIG. 28E is substantially a plan view of the pixel PXij shown in FIG. 26, and a sequential stacking structure of patterns of the pixel PXij is illustrated through FIGS. 28A to 28E. FIG. 26 will be described together with FIGS. 28A to 28E below.

Referring to FIGS. 26 and 28A, a semiconductor pattern SMP may be disposed on the substrate SUB. First to ninth source electrodes S1 to S9, first to ninth drain electrodes D1 to D9 of the first to ninth transistors T1 to T9, and first to ninth active areas A1 to A9 may be formed by the semiconductor pattern SMP. The first to ninth active areas A1 to A9 may be respectively disposed between the first to ninth source electrodes S1 to S9 and the first to ninth drain electrodes D1 to D9.

The ninth drain electrode D9 of the ninth transistor T9 and the eighth drain electrode D8 of the eighth transistor T8 may be formed to extend from the first source electrode S1 of the first transistor T1. The third source electrode S3 of the third transistor T3 and the sixth source electrode S6 of the sixth transistor T6 may be formed to extend from the first drain electrode D1 of the first transistor T1.

The fourth source electrode S4 of the fourth transistor T4 may extend from the third drain electrode D3 of the third transistor T3. The seventh source electrode S7 of the seventh transistor T7 may be formed to extend from the sixth drain electrode D6 of the sixth transistor T6.

The second source electrode S2, the second drain electrode D2, and the second active area A2 of the second transistor T2, and the fifth source electrode S5, the fifth drain electrode D5, and the fifth active area A5 of the fifth transistor T5 may be spaced apart from the semiconductor pattern SMP of the first, third, fourth, and sixth to ninth transistors T1, T3, T4, and T6 to T9. The second drain electrode D2 of the second transistor T2 may extend from the fifth source electrode S5 of the fifth transistor T5.

Referring to FIGS. 26 and 28B, a first gate pattern GPT1 may be disposed on the semiconductor pattern SMP. The first gate pattern GPT1 may include first to ninth gate electrodes G1 to G9 and a dummy electrode DME'. First to ninth gate electrodes G1 to G9 of the first to ninth transistors T1 to T9 may be formed by the first gate pattern GPT1. Each of the third and fourth gate electrodes G3 and G4 of the third and fourth transistors T3 and T4 having a dual gate structure may be formed of two gates.

In a plan view, the first to ninth gate electrodes G1 to G9 may overlap the first to ninth active areas A1 to A9, respectively. The dummy electrode DME' may be disposed between the first, third, fourth, and sixth to ninth transistors T1, T3, T4, T6 to T9 and the second and fifth transistors T2 and T5.

Hereinafter, the symbols of the source electrode, the gate electrode, and the active area for each of the first to ninth transistors T1 to T9 are omitted from the drawings, and the symbols of the first to ninth transistors T1 to T9 will be shown.

Referring to FIGS. 26, 28B, and 28C, a second gate pattern GPT2 may be disposed on the first gate pattern GPT1. The second gate pattern GPT2 may include first, second, third, and fourth dummy electrodes DME1, DME2, DME3, and DME4. The first dummy electrode DME1 may be disposed between the second dummy electrode DME2 and the third dummy electrode DME3. The second dummy electrode DME2 may be disposed between the first dummy electrode DME1 and the fourth dummy electrodes DME4.

When viewed in a plan view, the first dummy electrode DME1 may overlap the first gate electrode G1. An opening OP1' may be defined in the first dummy electrode DME1. The aforementioned capacitor Cst may be formed by the first dummy electrode DME1 and the first gate electrode G1.

When viewed in a plan view, the second dummy electrode DME2 may overlap the dummy electrode DME'. An opening OP2' may be defined in the second dummy electrode DME2. The aforementioned dummy capacitor DCP may be formed by the second dummy electrode DME2 and the dummy electrode DME'.

The third dummy electrode DME3 may partially overlap the third and fourth transistors T3 and T4 when viewed in a plan view. The fourth dummy electrode DME4 may partially overlap the second and fifth transistors T2 and T5 when viewed in a plan view.

In the following drawings, symbols for the first to fourth dummy electrodes DME1 to DME4, the capacitor Cst, and the dummy capacitor DCP will be omitted. In addition, when referring to the lines shown in FIGS. 28D and 28E below, the "i-th" name is omitted.

Referring to FIGS. 26, 28B, 28C, and 28D, a first connection pattern CNP1 may be disposed on the second gate pattern GPT2. The first connection pattern CNP1 may include a plurality of first connection electrodes CNE1 and CNE1_1 to CNE1_4. The first connection pattern CNP1 may be defined as a first conductive pattern.

The first connection electrode CNE1 may be the first connection electrode CNE1 illustrated in FIG. 9. The first connection electrodes CNE1_1 to CNE1_4 may be disposed on or at the same layer as the first connection electrode CNE1, and may be concurrently (e.g., simultaneously) patterned and formed of the same material as the first connection electrode CNE1. A plurality of first contact holes CH1 and CH1_1 to CH1_15 may be defined. The first contact hole CH1 may be the first contact hole CH1 illustrated in FIG. 9. The first contact holes CH1_1 to CH1_15 may be formed to be substantially the same as the first contact hole CH1.

The first connection pattern CNP1 may include a write scan line GWi, compensation scan lines GCi, an initialization scan line Gli, a bias scan line EBi, a bias line BIS, a sub reference voltage line VL', first and second emission lines EL1i and EL2i, a first sub initialization line VIL1', and a second initialization line VIL2 extending in the second direction DR2 and arranged in or along the first direction DR1.

The first connection electrode CNE1_1 may be connected to the first gate electrode G1 of the first transistor T1 and the third drain electrode D3 of the third transistor T3 through the first contact holes CH1_1. One first contact hole CH1_1 may overlap the opening OP1' disposed on the first gate electrode G1.

The write scan line GWi may be connected to the second gate electrode G2 of the second transistor T2 through the first contact hole CH1_2. The first connection electrode CNE1_2 may be connected to the second source electrode S2 of the second transistor T2 through the first contact hole CH1_3.

One compensation scan line GCi may be connected to the third gate electrode G3 of the third transistor T3 through the first contact hole CH1_4. The other compensation scan line GCi may be connected to the fifth gate electrode G5 of the fifth transistor T5 through the first contact hole CH1_5.

The initialization scan line Gli may be connected to the fourth gate electrode G4 of the fourth transistor T4 through the first contact hole CH1_6. The first connection electrode CNE1_3 may be connected to the second dummy electrode DME2, the ninth source electrode S9 of the ninth transistor T9, and the third dummy electrode DME3 through the first contact holes CH1_7.

The first connection electrode CNE1_4 may be connected to the second drain electrode D2 of the second transistor T2, the fifth source electrode S5 of the fifth transistor T5, the dummy electrode DME', and the first dummy electrode DME1 through the first contact holes CH1_8. One first contact hole CH1_8 may overlap the opening OP2'.

The sub reference voltage line VL' may be connected to the fifth drain electrode D5 of the fifth transistor T5 through the first contact hole CH1_9. The first emission line EL1i may be connected to the ninth gate electrode G9 of the ninth transistor T9 through the first contact hole CH1_10. The second emission line EL2i may be connected to the sixth gate electrode G6 of the sixth transistor T6 through the first contact hole CH1_11.

The first sub initialization line VIL1' may be connected to the fourth drain electrode D4 of the fourth transistor T4 through the first contact hole CH1_12. The second initialization line VIL2 may be connected to the seventh drain electrode D7 of the seventh transistor T7 through one first contact hole CH1_13. The second initialization line VIL2 may be connected to the fourth dummy electrodes DME4 through the remaining first contact holes CH1_13.

The bias scan line EBi may be connected to the seventh gate electrode G7 of the seventh transistor T7 and the eighth gate electrode G8 of the eighth transistor T8 through the first contact hole CH1_14. The bias line BIS may be connected to the eighth source electrode S8 of the eighth transistor T8 through the first contact hole CH1_15. The first connection electrode CNE1 may be connected to the sixth drain electrode D6 of the sixth transistor T6 through the first contact hole CH1.

Hereinafter, in FIG. 28E, symbols for the first connection electrodes CNE1 and CNE1_1 to CNE1_4 and the first contact holes CH1 and CH1_1 to CH1_15 illustrated in FIG. 28D are omitted.

Referring to FIGS. 26, 28B, 28C, 28D, and 28E, a second connection pattern CNP2 may be disposed on the first connection pattern CNP1. The second connection pattern CNP2 may include a second connection electrode CNE2, a first power line PL1, a data line DLj, a reference voltage line VL, and a first initialization line VIL1. The second connection pattern CNP2 may be defined as a second conductive pattern.

The second connection electrode CNE2 may be the second connection electrode CNE2 illustrated in FIG. 9. The second connection electrode CNE2, the first power line PL1, the data line DLj, the reference voltage line VL, and the first initialization line VIL1 may be disposed on or at the same layer, and may be formed by being concurrently (e.g., simultaneously) patterned from the same material. A plurality of second contact holes CH2 and CH2_1 to CH2_4 may be defined. The second contact hole CH2 may be the second contact hole CH2 illustrated in FIG. 9. The second contact holes CH2_1 to CH2_4 may be formed to be substantially the same as the second contact hole CH2.

The first power line PL1, the data line DLj, the reference voltage line VL, and the first initialization line VIL1 may extend in the first direction DR1 and may be arranged in the second direction DR2. The second connection electrode CNE2 may be disposed between the first power line PL1 and the data line DLj.

The second connection electrode CNE2 may be connected to the first connection electrode CNE1 through the second contact hole CH2. The second connection electrode CNE2 may be connected to the aforementioned first electrode AE through the third contact hole CH3.

The first power line PL1 may connect the second contact hole CH2_1 to the first connection electrode CNE1_3. The first power line PL1 may be connected to the dummy capacitor DCP and the ninth transistor T9 through the first connection electrode CNE1_3.

The data line DLj may be connected to the first connection electrode CNE1_2 through the second contact hole CH2_2. The data line DLj may be connected to the second transistor T2 through the first connection electrode CNE1_2.

The reference voltage line VL may be connected to the sub reference voltage line VL' through the second contact hole CH2_3. The reference voltage line VL may be connected to the fifth transistor T5 through the sub reference voltage line VL'.

The first initialization line VIL1 may connect the second contact hole CH2_4 to the first sub initialization line VIL1'. The first initialization line VIL1 may be connected to the fourth transistor T4 through the first sub initialization line VIL1'.

Figure 29A:
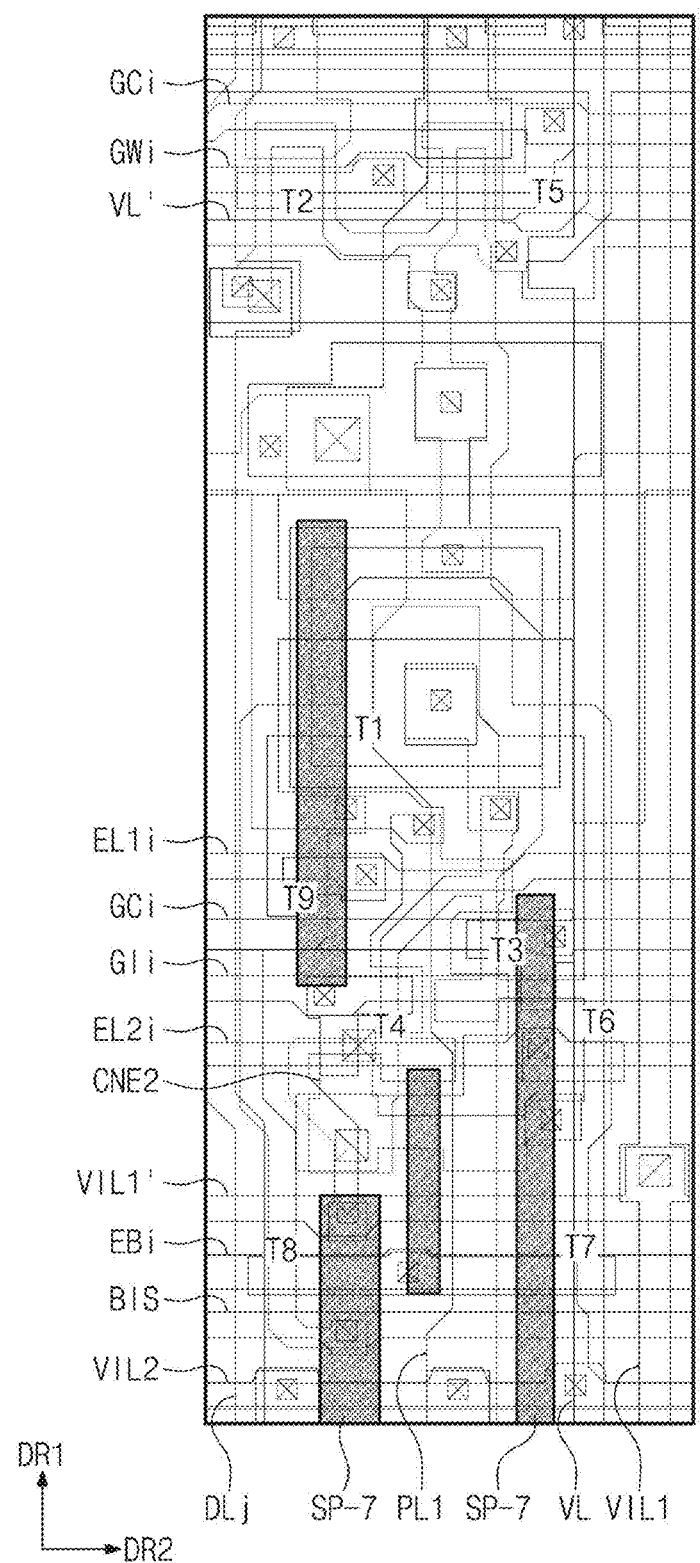
FIG. 29A is a view showing an embodiment of light blocking patterns in the plan view shown in FIG. 28E.
Figure 29B:
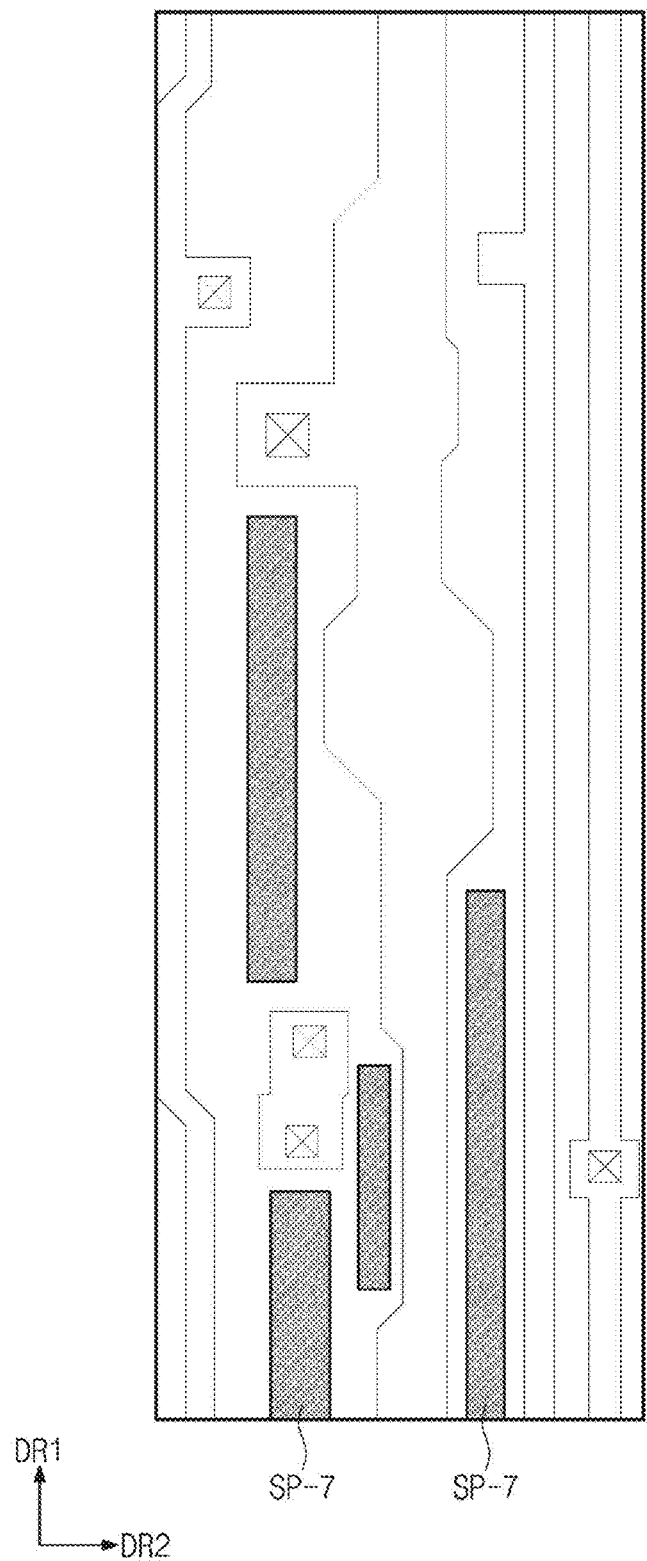
FIG. 29B is a diagram illustrating only the second connection pattern and light blocking patterns in FIG. 29A.

FIG. 29A is a view showing an embodiment of light blocking patterns in the plan view shown in FIG. 28E. FIG. 29B is a diagram illustrating only the second connection pattern and light blocking patterns in FIG. 29A.

Hereinafter, in the drawings, for convenience of description, symbols of the second contact holes CH2 and CH2_1 to CH2_4 are omitted.

Referring to FIGS. 29A and 29B, when viewed in a plan view, the light blocking patterns SP-7 may be adjacent to the third and fourth transistors T3 and T4. The light blocking patterns SP-7 may extend in the first direction DR1 and may be arranged in or along the second direction DR2 without overlapping the second connection pattern CNP2. In the second direction DR2, the third and fourth transistors T3 and T4 may be disposed between the light blocking patterns SP-7.

Figure 30:
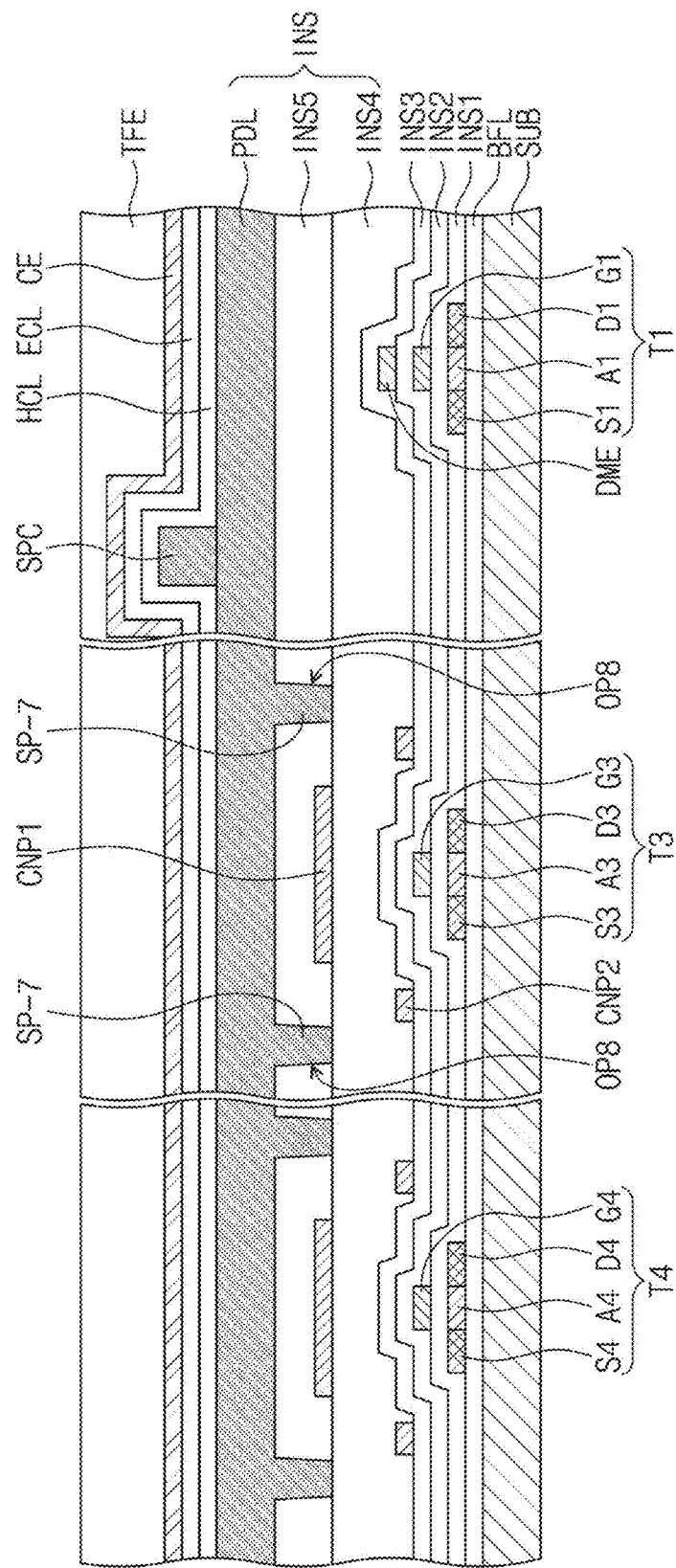
FIG. 30 is a diagram illustrating a cross-sectional structure of the first, third, and fourth transistors and light blocking patterns shown in FIG. 29A.

FIG. 30 is a diagram illustrating a cross-sectional structure of the first, third, and fourth transistors and light blocking patterns shown in FIG. 29A.

Referring to FIG. 30, the light blocking patterns SP-7 and the pixel defining film PDL may have a black color. The light blocking patterns SP-7 may protrude from the pixel defining film PDL and may be disposed in the openings OP8 defined in the fifth insulating layer INS5.

Figure 31:
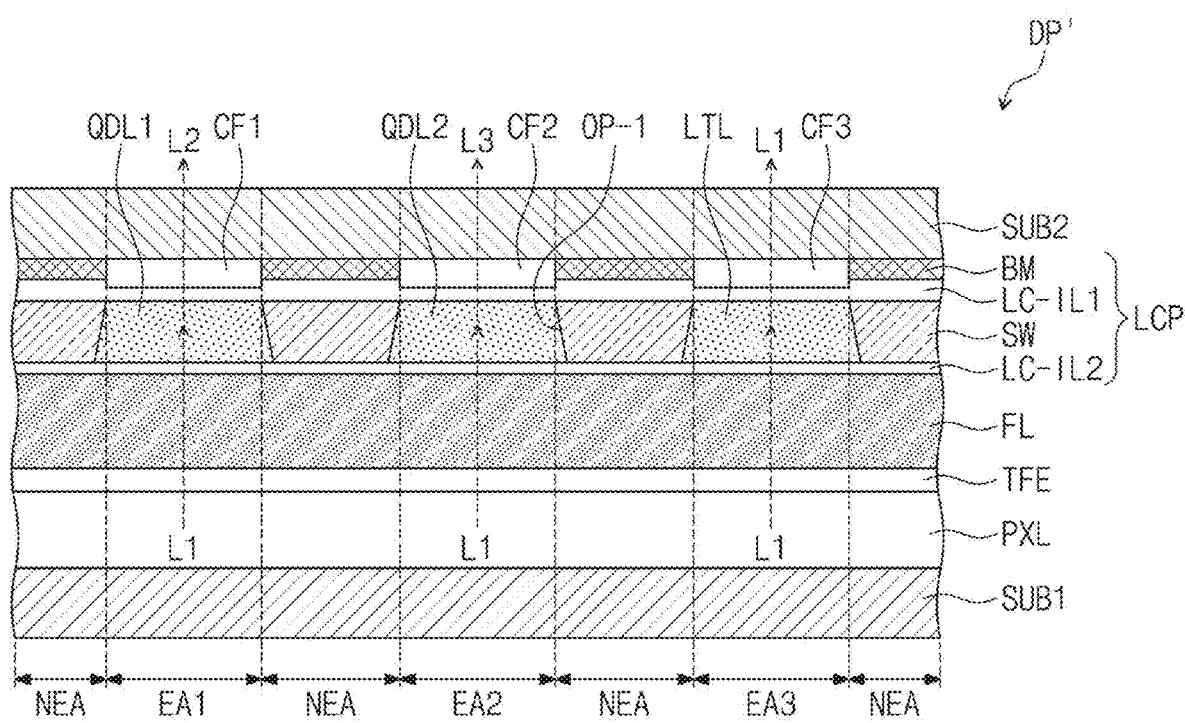
FIG. 31 is a diagram illustrating a configuration of a display panel according to one or more embodiments.

FIG. 31 is a diagram illustrating a configuration of a display panel according to one or more embodiments.

Referring to FIG. 31, the display panel DP' may include a first substrate SUB1, a second substrate SUB2, a pixel layer PXL, a thin film sealing layer TFE, a filler FL, and a light conversion part LCP. The pixel layer PXL and the thin film sealing layer TFE may be the pixel layer PXL and the thin film sealing layer TFE shown in FIG. 9.

The pixel layer PXL, the thin film sealing layer TFE, the filler FL, and the light conversion part LCP may be disposed between the first substrate SUB1 and the second substrate SUB2. The light conversion part LCP may be disposed on the thin-film sealing layer TFE, and the filler FL may be disposed between the light conversion part LCP and the thin film sealing layer TFE. The light conversion part LCP may be disposed under the second substrate SUB2.

An area between the first, second, and third emission areas EA1, EA2, and EA3 may be defined as a non-emission area NEA. The emission area EA shown in FIG. 9 may correspond to each of the first, second, and third emission areas EA1, EA2, and EA3. The first, second, and third emission areas EA1, EA2, and EA3 may generate the first light L1. For example, the first light L1 may be blue light.

The light conversion part LCP may include first and second quantum dot layers QDL1 and QDL2, a light transmitting layer LTL, first, second, and third color filters CF1, CF2, and CF3, a black matrix BM, a partition layer SW, and first and second insulating layers LC-IL1 and LC-IL2.

The first, second, and third color filters CF1, CF2, and CF3 and the black matrix BM may be disposed under the second substrate SUB2. The first color filter CF1 may overlap the first emission area EA1, the second color filter CF2 may overlap the second emission area EA2, and the third color filter CF3 may overlap the third emission area EA3. The black matrix BM may overlap the non-emission area NEA.

The first color filter CF1 may include a red color filter. The second color filter CF2 may include a green color filter. The third color filter CF3 may include a blue color filter. A first insulating layer LC-IL1 may be disposed under the first, second, and third color filters CF1, CF2, and CF3 and the black matrix BM. The partition layer SW may be disposed under the first insulating layer LC-IL1.

Openings OP-1 for disposing the first and second quantum dot layers QDL1 and QDL2 and the light transmitting layer LTL may be defined in the partition layer SW. The openings OP-1 may overlap the first, second, and third emission areas EA1, EA2, and EA3, and the partition layer SW may overlap the non-emission area NEA. The partition layer SW may have a black color.

The first and second quantum dot layers QDL1 and QDL2 and the light transmitting layer LTL may be disposed under the first insulating layer LC-IL1. The first and second quantum dot layers QDL1 and QDL2 and the first transmitting layer LTL may be disposed in the openings OP-1. The first quantum dot layer QDL1 may overlap the first emission area EA1, the second quantum dot layer QDL2 may overlap the second emission area EA2, and the light transmitting layer LTL may overlap the third emission area EA3.

The first light L1 generated in the first emission area EA1 may be provided to the first quantum dot layer QDL1, and the first light L1 generated in the second emission area EA2 may be provided to the second quantum dot layer QDL2. The first light L1 generated in the third emission area EA3 may be provided to the light transmitting layer LTL.

The first quantum dot layer QDL1 may convert the first light L1 into the second light L2. The second quantum dot layer QDL2 may convert the first light L1 into the third light L3. For example, the second light L2 may be a red light, and the third light L3 may be a green light. The first quantum dot layer QDL1 may include first quantum dots, and the second quantum dot layer QDL2 may include second quantum dots.

The first quantum dots may convert the first light L1 having the blue wavelength band into the second light L2 having the red wavelength band. The second quantum dots may convert the first light L1 having the blue wavelength band into the third light L3 having the green wavelength band. The light transmitting layer LTL may transmit the first light L1 without performing a light conversion operation.

The first quantum dot layer QDL1 may emit the second light L2, the second quantum dot layer QDL2 may emit the third light L3, and the light transmitting layer LTL may emit or transmit the first light L1. Accordingly, an image (e.g., a predetermined image) may be displayed by the second light L2, the third light L3, and the first light L1 displaying a red color, a green color, and a blue color, respectively.

A portion of the first light L1 may be provided to the first color filter CF1 by passing through the first quantum dot layer QDL1 without being light-converted by the first quantum dots. For example, the first light L1 that is not converted into the second light L2 because it did not contact with the first quantum dots may be present. The first color filter CF1 may block light of different colors. The first light L1 that is not converted in the first quantum dot layer QDL1 may be blocked by the first color filter CF1 having a red color filter and thus may not be emitted upward (e.g., emitted outside the display panel DP').

A portion of the first light L1 may be provided to the second color filter CF2 by passing through the second quantum dot layer QDL2 without being light-converted by the second quantum dots. For example, the first light L1 that is not converted into the third light L3 because it is not in contact with the second quantum dots may be present. The second color filter CF2 may block light of different colors. The first light L1 that is not converted in the second quantum dot layer QDL2 may be blocked by the second color filter CF2 having a green color filter and thus may not be emitted upward (e.g., emitted outside the display panel DP').

External light may be provided toward the display device DD. When the external light is reflected from the display panel DP and provided to an external user again, the user may recognize the external light like a mirror.

The first, second, and third color filters CF1, CF2, and CF3 may prevent or substantially prevent reflection of external light. For example, the first, second, and third color filters CF1, CF2, and CF3 may filter external light into red, green, and blue colors. That is, the first, second, and third color filters CF1, CF2, and CF3 may filter the external light with the same color into the second light L2, the third light L3, and the first light L1. In this case, external light may not be recognized by the user.

When the display panel DP' illustrated in FIG. 31 is used, the antireflection layer RPL illustrated in FIG. 2 may not be used.

The black matrix BM may block unnecessary light in the non-emission area NEA. A partition layer SW having a black color may also block unnecessary light in a non-emission area NEA as a function similar to the black matrix BM.

Figure 32:
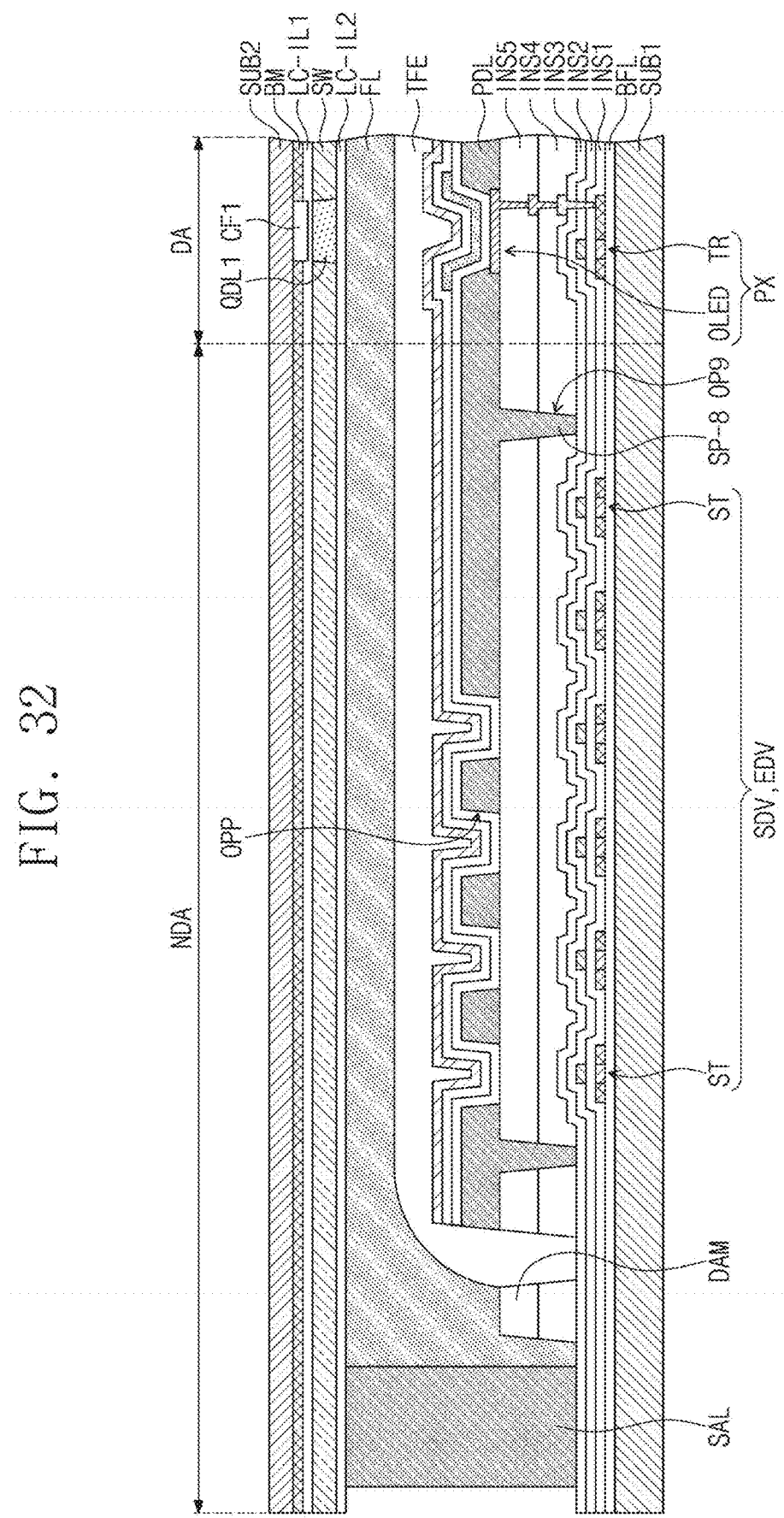
FIG. 32 is a view illustrating an outer structure other than the display panel shown in FIG. 31.

FIG. 32 is a view illustrating an outer structure other than the display panel shown in FIG. 31.

Hereinafter, a plan view of the display panel shown in FIG. 4 will be described together with FIGS. 31 and 32 below.

Referring to FIGS. 4, 31, and 32, the display panel DP may include a sealant SAL. The sealant SAL may be disposed in the non-display area NDA. The sealant SAL may be disposed between the first substrate SUB1 and the second substrate SUB2. The sealant SAL is adjacent to the edges of the first and second substrates SUB1 and SUB2 and may extend along the edges of the first and second substrates SUB1 and SUB2. The partition layer SW and the black matrix BM may extend to edges of the first and second substrates SUB1 and SUB2 and may be disposed in the non-display area NDA.

The pixel PX may be sealed by the sealant SAL. For example, the light emitting element OLED and transistors T1 to T8 and T1 to T9 shown in FIGS. 5 and 26 may be disposed between the first substrate SUB1 and the second substrate SUB2 and may be sealed by the sealant SAL. The sealant SAL may have a black color to block external light.

A dam DAM may be disposed on the first substrate SUB1. The dam DAM may be disposed in the non-display area NDA. The thin film sealing layer TFE may be disposed up to the dam DAM disposed adjacent to the sealant SAL.

The scan driver SDV and the light emission driver EDV shown in FIG. 4 may be defined as a driver that generates driving signals for driving the light emitting element OLED and the transistors T1 to T8 and T1 to T9. The scan driver SDV or the light emission driver EDV may include a plurality of elements ST disposed on or at the same layer as the transistors T1 to T8 and T1 to T9 to generate driving signals. The elements ST may be disposed on the first substrate SUB1. The elements ST may be disposed in the non-display area NDA. The elements ST may include transistors. The elements ST may be sealed by a sealant SAL.

Light blocking patterns SP-8 protruding from the pixel defining film PDL may be disposed around the elements ST. The light blocking patterns SP-8 may be disposed adjacent to the elements ST when viewed in a plan view. The pixel defining film PDL and the light blocking patterns SP-8 may have a black color.

Openings OPP may be defined in the pixel defining film PDL in the non-display area NDA. When external moisture or the like is provided to the pixels PX of the display area DA through the pixel defining film PDL, the pixels PX may be damaged. Moisture introduced through the pixel defining film PDL may be blocked by the openings OPP and may not be provided to the pixels PX. Also, a gas generated from the organic material in the display panel DP may be discharged through the openings OPP.

When light is provided to the elements ST, a leakage current may occur in the elements ST. Because the sealant SAL, the pixel defining film PDL, and the light blocking patterns SP-8 have a black color, light provided to the elements ST may be blocked. Accordingly, leakage currents of the elements ST that may be generated by light may be reduced.

Figure 33:
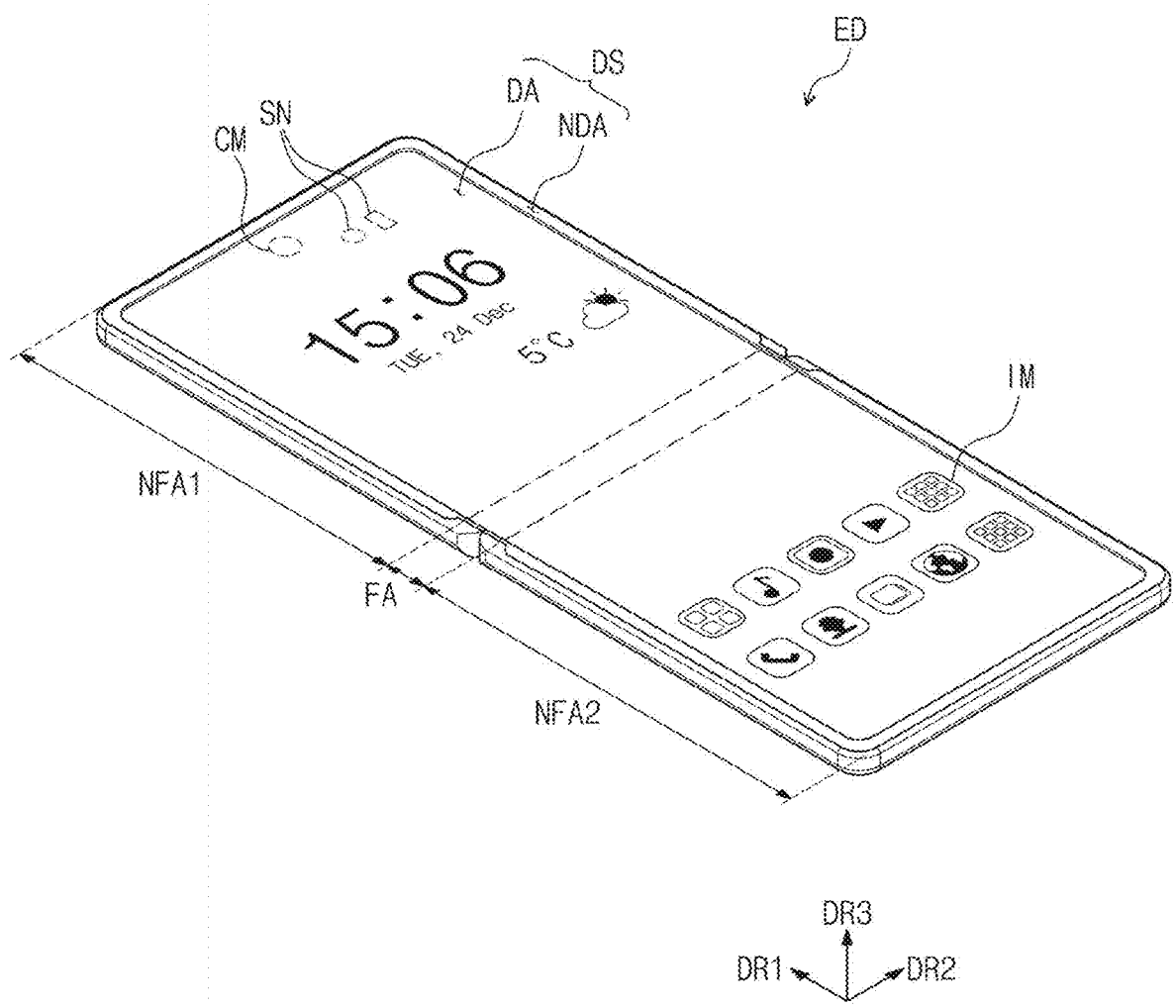
FIG. 33 is a perspective view of an electronic device including the display device shown in FIG. 1.
Figure 34:
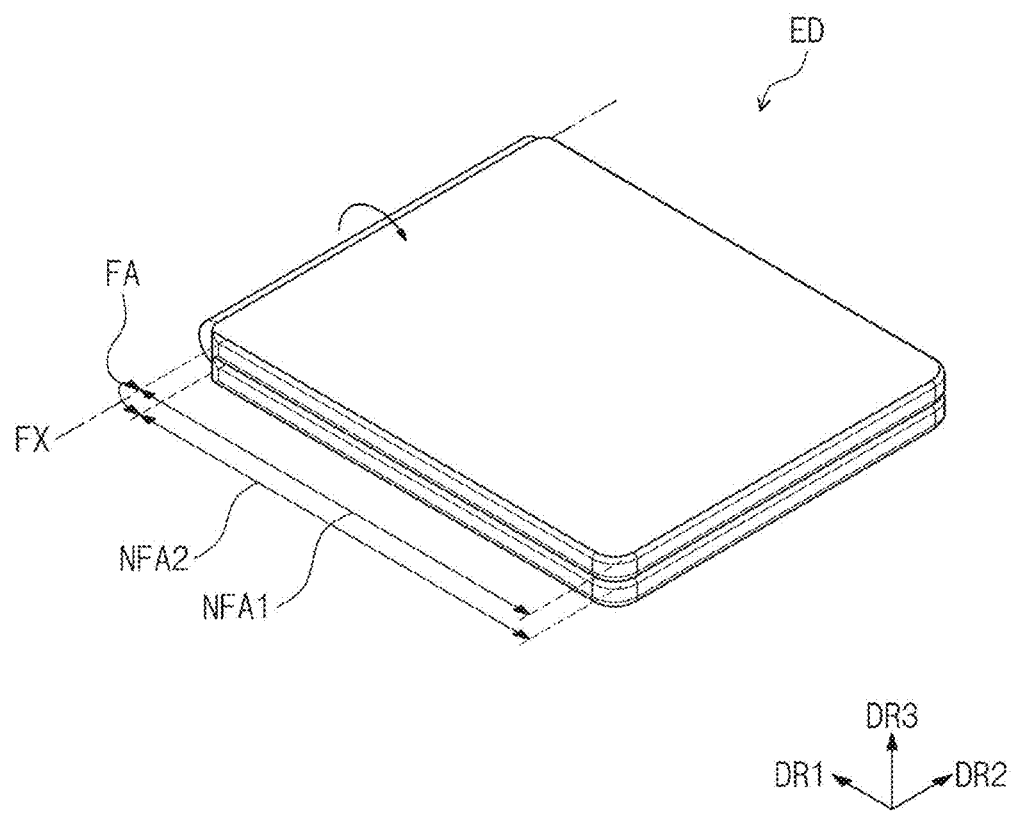
FIG. 34 is a diagram illustrating a folded state of the electronic device shown in FIG. 33.

FIG. 33 is a perspective view of an electronic device including the display device shown in FIG. 1. FIG. 34 is a diagram illustrating a folded state of the electronic device shown in FIG. 33.

Referring to FIG. 33, the electronic device ED according to one or more embodiments may have a rectangular shape having long sides extending in a first direction DR1 and short sides extending in a second direction DR2. However, the present disclosure is not limited thereto, and the electronic device ED may have various suitable shapes such as a circle and a polygon. The electronic device ED may be a flexible electronic device.

The electronic device ED may include a folding area FA and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The first non-folding area NFA1, the folding area FA, and the second non-folding area NFA2 may be arranged in or along the first direction DR1.

For example, one folding area FA and the two non-folding areas NFA1 and NFA2 are illustrated but the number of folding areas FA and non-folding areas NFA1 and NFA2 is not limited thereto. For example, the electronic device ED may include more than two non-folding areas and a plurality of folding areas disposed between the non-folding areas (e.g., between adjacent ones of the non-folding areas).

The upper surface of the electronic device ED may be defined as the display surface DS and may have a plane defined by the first direction DR1 and the second direction DR2. The images IM generated by the electronic device ED may be provided to the user through the display surface DS (e.g., through a portion of the display surface DS).

The display surface DS may include a display area DA and a non-display area NDA around the display area DA. The display area DA may display an image, and the non-display area NDA may not display an image. The non-display area NDA may be around (e.g., surround) the display area DA and may define an outline portion of the electronic device ED printed in a color (e.g., a predetermined color).

The electronic device ED may include a plurality of sensors SN and at least one camera CM. The sensors SN and the camera CM may be adjacent to an edge of the electronic device ED. The sensors SN and the camera CM may be disposed in the display area DA adjacent to the non-display area NDA (e.g., a portion of the non-display area NDA at the edge of the electronic device ED). The sensors SN and the camera CM may be disposed in the first non-folding area NFA1, but the locations of the sensors SN and the camera CM are not limited thereto.

In one or more embodiments, the sensors SN may be a proximity sensor, but the types of the sensors SN are not limited thereto. The camera CM may capture an external image.

Referring to FIG. 34, the electronic device ED may be a foldable electronic device ED that is folded or unfolded. For example, the folding area FA may be bent based on the folding axis FX parallel to the second direction DR2, so that the electronic device ED may be folded. The folding axis FX may be defined as a short axis parallel to the short side of the electronic device ED.

When the electronic device ED is folded, the first non-folding area NFA1 and the second non-folding areas NFA2 face each other, and the electronic device ED may be in-folded to prevent or substantially prevent the display surface DS from being exposed to the outside. However, embodiments of the present disclosure are not limited thereto. For example, the electronic device ED may be out-folded such that the display surface DS is exposed to the outside about the folding axis FX.

Figure 35:
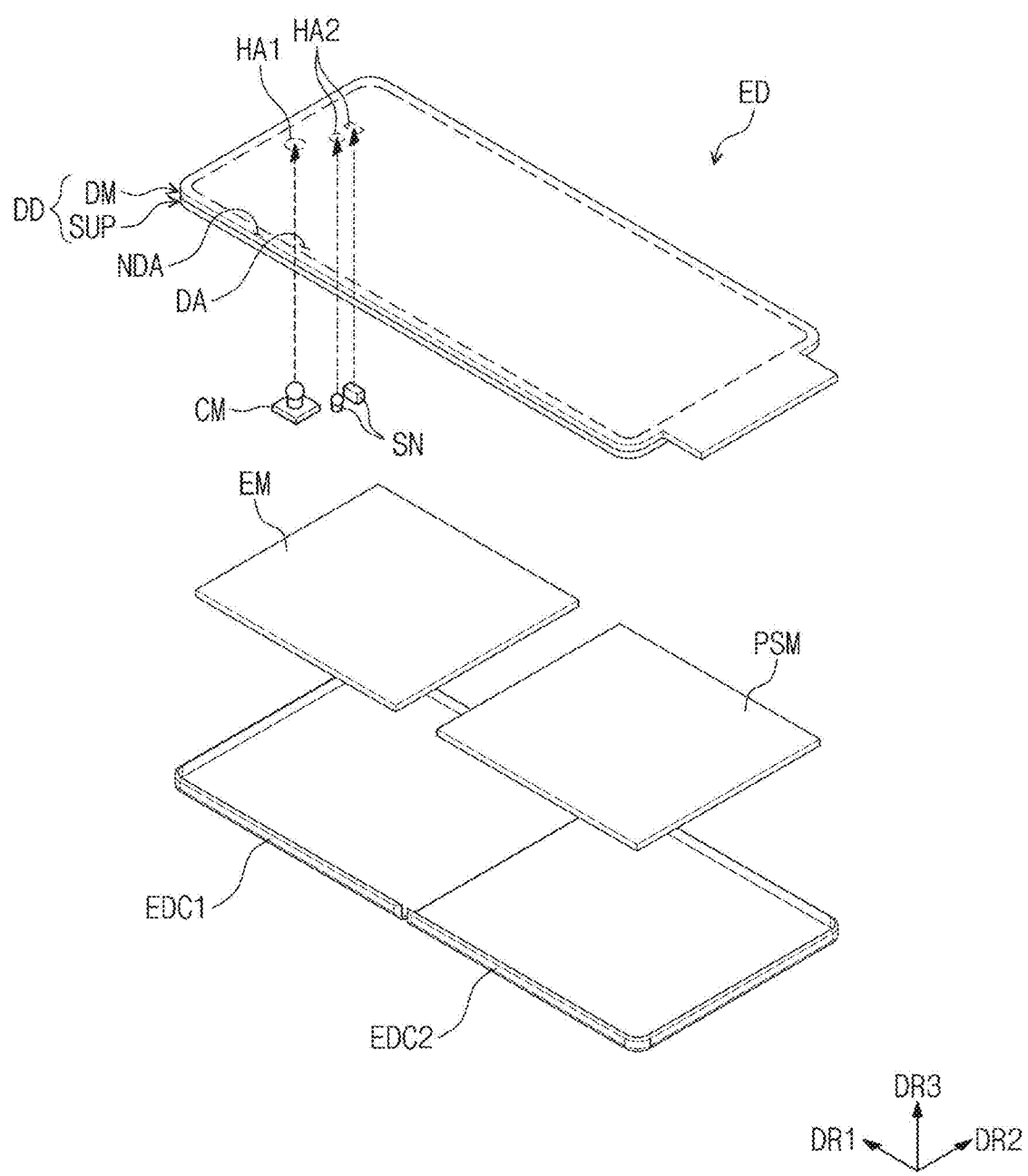
FIG. 35 is an exploded perspective view of the electronic device shown in FIG. 33.

FIG. 35 is an exploded perspective view of the electronic device shown in FIG. 33.

Referring to FIG. 35, the electronic device ED may include a display device DD, a camera CM, sensors SN, an electronic module DM, a power module PSM, and cases EDC1 and EDC2. The display device DD may be a folding display device.

The display device DD may include a display module DM and a support unit SUP. The display device DD may include the display panel DP, the input sensing unit ISP, the antireflection layer RPL, the window WIN, the panel protection film PPF, and the first to third adhesive layers AL1 to AL3 shown in FIG. 2. The display device DD may further include a support SUP disposed under the display module DM to support the display module DM. In one or more embodiments, the electronic device ED may further include mechanical structures for controlling the folding operation of the display device DD.

A camera CM and sensors SN may be disposed under the display device DD. As described above, first and second hole areas HA1 and HA2 may be defined in the display device DD, the camera CM may be disposed in the first hall area HA1, and the sensors SN may be disposed in the second hall areas HA2.

The electronic module DM and the power module PSM may be disposed under the display device DD. In one or more embodiments, the electronic module DM and the power module PSM may be connected to each other through a flexible circuit board. The electronic module DM may control the operation of the display device DD. The power module PSM may supply power to the electronic module DM.

The cases EDC1 and EDC2 may accommodate the display device DD, the electronic module DM, and the power module PSM. The cases EDC1 and EDC2 may be divided into two first and second cases EDC1 and EDC2 to fold the display device DD. The cases EDC1 and EDC2 may protect the display device DD, the electronic module DM, and the power module PSM.

Figure 36:
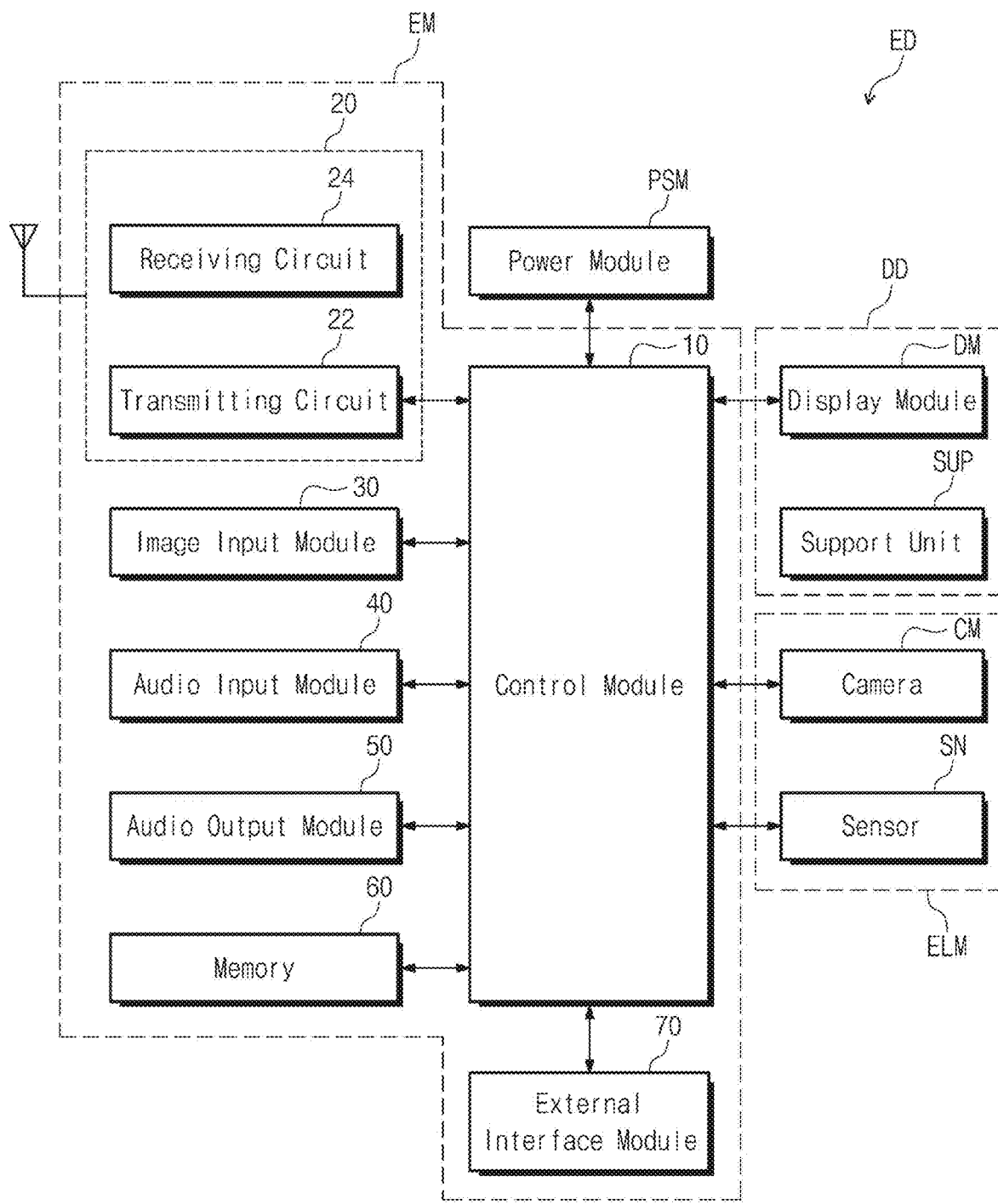
FIG. 36 is a block diagram of the electronic device shown in FIG. 35.

FIG. 36 is a block diagram of the electronic device shown in FIG. 35.

Referring to FIG. 36, the electronic module EM may include a control module 10, a wireless communication module 20, an image input module 30, an audio input module (or sound input module) 40, an audio output module (or sound output module) 50, a memory 60, and an external interface module 70. The modules may be mounted on a circuit board or connected (e.g., electrically connected) through a flexible circuit board. The electronic module EM may be connected (e.g., electrically connected) to the power module PSM.

The control module 10 may control the overall operation of the electronic device ED. For example, the control module 10 may activate or deactivate the display device DD according to a user input. The control module 10 may control the image input module 30, the audio input module 40, the audio output module 50, and the like in accordance with a user input. The control module 10 may include at least one microprocessor.

The wireless communication module 20 may transmit/receive wireless signals to/from other terminals using a Bluetooth or Wi-Fi line. The wireless communication module 20 may transmit/receive voice signals using a general communication line. The wireless communication module 20 may include a transmitting circuit 22 for modulating and transmitting a signal to be transmitted, and a receiving circuit 24 for demodulating a received signal.

The image input module 30 processes the image signal and converts the pressed image signal into image data that may be displayed on the display device DD. The audio input module 40 may receive an external sound signal by a microphone in a recording mode, a voice recognition mode, and the like, and convert the received signal into electrical voice data. The audio output module 50 may convert sound data received from the wireless communication module 20 or sound data stored in the memory 60 and output the converted sound data to the outside.

The external interface module 70 may serve as an interface connected to an external charger, a wired/wireless data port, a card socket (e.g., a memory card, and a SIM/UIM card), or the like. The power module PSM supplies power for the overall operation of the electronic device ED. The power module PSM may include a conventional battery device.

The electro-optical module ELM may be an electronic component that outputs or receives an optical signal. The electro-optical module ELM transmits or receives an optical signal through a partial area of the display device DD. In this embodiment, the electro-optical module ELM may include a camera module CM. The camera module CM may receive natural light to capture an external image. The electro-optical module ELM may include a sensor SN such as a proximity sensor.

According to one or more embodiments of the present disclosure, as a bias voltage is applied to the first electrode of the first transistor, because the movement of the hysteresis curve of the first transistor is suppressed or reduced, a change in luminance according to the movement of the hysteresis curve may be reduced.

In addition, black light blocking patterns are disposed around the third and fourth transistors connected to the gate electrode of the first transistor, and light blocking patterns block the light provided toward the third and fourth transistors, so that leakage currents of the third and fourth transistors that may be generated by light may be reduced. As a result, a change in luminance due to leakage currents of the third and fourth transistors may be reduced.

Although embodiments of the present disclosure have been described, it is understood that the present disclosure should not be limited to these embodiments but various suitable changes and modifications may be made by one of ordinary skilled in the art within the spirit and scope of the present disclosure as hereinafter claimed, and equivalents thereof.

What is claimed is:

1. A display device comprising:
    a light emitting element comprising an anode, a cathode, and a light emitting layer between the anode and the cathode;
    a first transistor connected between the anode and a first power line, the first transistor to be switched by a voltage of a node;
    a second transistor connected between the first transistor and a data line, the second transistor to be switched by a write scan signal;
    a third transistor connected between the node and the anode, the third transistor to be switched by a compensation scan signal;
    a fourth transistor connected between the node and an initialization line, the fourth transistor to be switched by an initialization scan signal;
    an insulating layer on the first to the fourth transistors; and
    a light blocking pattern protruding from the insulating layer, the light blocking pattern being adjacent to the third transistor and the fourth transistor.

2. The display device of claim 1, further comprising a bias transistor connected to a first electrode of the first transistor connected to the first power line, the bias transistor to receive a bias voltage and to be switched by a bias scan signal.

3. The display device of claim 2, wherein the bias voltage is to be applied to the first electrode of the first transistor through the bias transistor before the light emitting element emits light after a threshold voltage of the first transistor is compensated.

4. The display device of claim 1, wherein the first transistor comprises a control electrode connected to the node, a first electrode connected to the first power line, and a second electrode connected to the anode, and
    wherein the second transistor is connected between the first electrode of the first transistor and the data line.

5. The display device of claim 1, wherein the first transistor comprises a control electrode connected to the node, a first electrode connected to the first power line, and a second electrode connected to the anode, and
    wherein the second transistor is connected to the control electrode of the first transistor.

6. The display device of claim 1, wherein a driving frequency for driving the light emitting element and the first to the fourth transistors is set to 20 Hz to 48 Hz.

7. The display device of claim 1, wherein the light blocking pattern comprises a plurality of light blocking patterns arranged to surround the third transistor and the fourth transistor in a plan view.

8. The display device of claim 7, wherein the plurality of light blocking patterns block light provided toward the third transistor and the fourth transistor.

9. The display device of claim 1, further comprising a plurality of gate insulating layers comprising:
    a first gate insulating layer on a source-drain of each of the first to the fourth transistors; and
    a second gate insulating layer on a gate of each of the first to the fourth transistors,
    wherein the insulating layer comprises:
    a first planarization insulating layer on the first to the fourth transistors;
    a second planarization insulating layer on the first planarization insulating layer; and
    a pixel defining film on the second planarization insulating layer, the pixel defining film having a pixel opening in which the light emitting layer is disposed.

10. The display device of claim 9, wherein the pixel defining film has a black color, and
    wherein the light blocking pattern protrudes from the pixel defining film, the light blocking pattern being in openings defined in the first planarization insulating layer and the second planarization insulating layer.

11. The display device of claim 10, wherein the light blocking pattern further protrudes from the pixel defining film, the light blocking pattern being further disposed in openings defined in the gate insulating layers.

12. The display device of claim 11, further comprising:
an interlayer insulating layer on the gate insulating layers;
a first conductive pattern on the interlayer insulating layer; and
a second conductive pattern on the first planarization insulating layer,
wherein the first planarization insulating layer is on the interlayer insulating layer to cover the first conductive pattern, and
wherein the light blocking pattern does not overlap the first conductive pattern, the second conductive pattern, and a source electrode, a drain electrode, and a gate electrode of each of the third transistor and the fourth transistor.

13. The display device of claim 9, wherein the pixel defining film has a black color, and
wherein the light blocking pattern protrudes from the pixel defining film and is in an opening defined in the second planarization insulating layer.

14. The display device of claim 13, further comprising:
an interlayer insulating layer on the gate insulating layers;
a first conductive pattern on the interlayer insulating layer; and
a second conductive pattern on the first planarization insulating layer,
wherein the first planarization insulating layer is on the interlayer insulating layer to cover the first conductive pattern, and
wherein the light blocking pattern does not overlap the second conductive pattern, the light blocking pattern extending in a first direction that is an extension direction of the second conductive pattern.

15. The display device of claim 9, wherein the first planarization insulating layer has a black color, and
wherein the light blocking pattern protrudes from the first planarization insulating layer and is in openings defined in the gate insulating layers.

16. The display device of claim 9, wherein the second planarization insulating layer has a black color, and
wherein the light blocking pattern protrudes from the second planarization insulating layer, the light blocking pattern being in an opening defined in the first planarization insulating layer.

17. The display device of claim 9, wherein the second planarization insulating layer has a black color, and
wherein the light blocking pattern protrudes from the second planarization insulating layer, the light blocking pattern being in openings defined in the first planarization insulating layer and the gate insulating layers.

18. The display device of claim 9, further comprising a spacer on the pixel defining film,
wherein the spacer, the pixel defining film, the first planarization insulating layer, and the second planarization insulating layer have a black color, and
wherein the light blocking pattern protrudes from the first planarization insulating layer, the light blocking pattern being in openings defined in the gate insulating layers.

19. The display device of claim 9, wherein a first portion of the pixel defining film on the third transistor and the fourth transistor has a black color, and
wherein a second portion of the pixel defining film on the first transistor does not have the black color.

20. The display device of claim 1, further comprising:
a first substrate;
a second substrate facing the first substrate;
a sealant between the first substrate and the second substrate; and
a driving unit on the first substrate and configured to generate driving signals to drive the first to the fourth transistors,
wherein the driving unit comprises a plurality of elements at a same layer as the first to the fourth transistors,
wherein the light emitting element, the first to the fourth transistors, and the plurality of elements are between the first substrate and the second substrate and are sealed by the sealant, and
wherein the light blocking pattern comprises a plurality of light blocking patterns adjacent to the plurality of elements in a plan view.

21. A display device comprising:
a light emitting element comprising an anode, a cathode, and a light emitting layer between the anode and the cathode;
a first transistor connected between the anode and a first power line, the first transistor to be switched by a voltage of a node;
a second transistor connected between the first transistor and a data line, the second transistor to be switched by a write scan signal;
a third transistor connected between the node and the anode, the third transistor to be switched by a compensation scan signal;
a fourth transistor connected to the node, the fourth transistor to receive an initial voltage and a voltage and to be switched by an initialization scan signal; and
a plurality of light blocking patterns surrounding the third and fourth transistors in a plan view.

22. The display device of claim 21, further comprising a pixel defining film on the first to the fourth transistors, the pixel defining film having a pixel opening in which the light emitting layer is disposed,
wherein the pixel defining film has a black color, and
wherein the light blocking patterns protrude downward from the pixel defining film.

23. The display device of claim 22, further comprising:
a first planarization insulating layer on the first to the fourth transistors; and
a second planarization insulating layer on the first planarization insulating layer,
wherein the pixel defining film is on the second planarization insulating layer, and
wherein the light blocking patterns are in openings defined in the first planarization insulating layer and the second planarization insulating layer.

24. A display device comprising:
a light emitting element comprising an anode, a cathode, and a light emitting layer between the anode and the cathode;
a first transistor connected between the anode and a first power line, the first transistor to be switched by a voltage of a node;
a second transistor connected between the first transistor and a data line, the second transistor to be switched by a write scan signal;
a third transistor connected between the node and the anode, the third transistor to be switched by a compensation scan signal;
a fourth transistor connected to the node, the fourth transistor to receive an initial voltage and a voltage and to be switched by an initialization scan signal;
an insulating layer on the first to the fourth transistors; and a light blocking pattern protruding downward from the insulating layer, the light blocking pattern being adjacent to the third transistor and the fourth transistor to block light provided toward the third transistor and the fourth transistor.

25. An electronic device comprising:
a display device having a first hole region through which an optical signal is to pass;
an electro-optical module under the display device, overlapping the first hole region, and to receive the optical signal; and
a case accommodating the display device and the electro-optical module,
wherein the display device comprises:
a light emitting element comprising an anode, a cathode, and a light emitting layer between the anode and the cathode;
a first transistor connected between the anode and a first power line and to be switched by a voltage of a node;
a second transistor connected between the first transistor and a data line and to be switched by a write scan signal;
a third transistor connected between the node and the anode and to be switched by a compensation scan signal;
a fourth transistor connected between the node and an initialization line and to be switched by an initialization scan signal;
an insulating layer on the first to the fourth transistors; and
a light blocking pattern protruding from the insulating layer and adjacent to the third transistor and the fourth transistor.

* * * * *